US012176210B2

(12) United States Patent
Yamazaki

(10) Patent No.: US 12,176,210 B2
(45) Date of Patent: Dec. 24, 2024

(54) MANUFACTURING METHOD OF METAL OXIDE AND MANUFACTURING METHOD OF SEMICONDUCTOR DEVICE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 421 days.

(21) Appl. No.: 17/285,568

(22) PCT Filed: Oct. 16, 2019

(86) PCT No.: PCT/IB2019/058802
§ 371 (c)(1),
(2) Date: Apr. 15, 2021

(87) PCT Pub. No.: WO2020/084400
PCT Pub. Date: Apr. 30, 2020

(65) Prior Publication Data
US 2021/0398809 A1    Dec. 23, 2021

(30) Foreign Application Priority Data

Oct. 26, 2018    (JP) ................................. 2018-201774

(51) Int. Cl.
*H01L 21/02*    (2006.01)
*C23C 14/08*    (2006.01)
(Continued)

(52) U.S. Cl.
CPC ...... *H01L 21/02664* (2013.01); *C23C 14/086* (2013.01); *C23C 14/5806* (2013.01);
(Continued)

(58) Field of Classification Search
CPC ......... H01L 21/02664; H01L 21/02565; H01L 21/02631; C23C 14/086; C23C 14/5806; C23C 14/5826
See application file for complete search history.

(56) References Cited

U.S. PATENT DOCUMENTS 9,401,432 B2    7/2016    Kobayashi et al.
9,929,044 B2    3/2018    Tanaka
(Continued)

FOREIGN PATENT DOCUMENTS

CN    108538916 A    9/2018
JP    2015-156480 A    8/2015
(Continued)

OTHER PUBLICATIONS

International Search Report (Application No. PCT/IB2019/058802) Dated Feb. 10, 2020.
(Continued)

*Primary Examiner* — Julia Slutsker
(74) *Attorney, Agent, or Firm* — Eric J. Robinson; Robinson Intellectual Property Law Office, P.C.

(57) ABSTRACT

A semiconductor device with high reliability is provided. A first step of forming a metal oxide containing indium over a substrate and a second step of performing microwave treatment from above the metal oxide are included. The first step is performed by a sputtering method using an oxide target containing indium. The second step is performed using a gas containing oxygen under reduced pressure, and by the second step, a defect in which hydrogen has entered an oxygen vacancy (VoH) in the metal oxide is divided into an oxygen vacancy (Vo) and hydrogen (H).

13 Claims, 27 Drawing Sheets

(51) Int. Cl.
  *C23C 14/58* (2006.01)
  *H01L 27/12* (2006.01)
  *H01L 29/66* (2006.01)
  *H01L 29/786* (2006.01)
  *H10B 12/00* (2023.01)

(52) U.S. Cl.
  CPC .... *C23C 14/5826* (2013.01); *H01L 21/02565* (2013.01); *H01L 21/02631* (2013.01); *H01L 27/1207* (2013.01); *H01L 27/1225* (2013.01); *H01L 27/124* (2013.01); *H01L 27/1255* (2013.01); *H01L 27/127* (2013.01); *H01L 29/66969* (2013.01); *H01L 29/78648* (2013.01); *H01L 29/7869* (2013.01); *H10B 12/00* (2023.02)

(56) References Cited

U.S. PATENT DOCUMENTS

| | | | |
|---|---|---|---|
| 9,947,777 | B2 | 4/2018 | Yamazaki et al. |
| 10,032,918 | B2 | 7/2018 | Yamazaki et al. |
| 10,700,212 | B2 | 6/2020 | Sawai et al. |
| 10,741,679 | B2 | 8/2020 | Yamazaki et al. |
| 10,985,283 | B2 | 4/2021 | Koezuka et al. |
| 2010/0029058 | A1 | 2/2010 | Shimomura et al. |
| 2011/0263082 | A1 | 10/2011 | Yamazaki |
| 2012/0194756 | A1 | 8/2012 | Hayakawa et al. |
| 2013/0062600 | A1* | 3/2013 | Koezuka ............ H01L 21/0262 257/E21.409 |
| 2013/0193432 | A1* | 8/2013 | Yamazaki ......... H01L 29/66969 257/43 |
| 2013/0200375 | A1 | 8/2013 | Yamazaki |
| 2013/0267068 | A1 | 10/2013 | Hanaoka et al. |
| 2013/0270563 | A1 | 10/2013 | Yamazaki |
| 2014/0001466 | A1 | 1/2014 | Sasaki et al. |
| 2014/0027765 | A1 | 1/2014 | Toyotaka |
| 2014/0106503 | A1 | 4/2014 | Hirakata et al. |
| 2014/0154837 | A1 | 6/2014 | Yamazaki |
| 2014/0175436 | A1 | 6/2014 | Yamazaki |
| 2014/0206133 | A1 | 7/2014 | Koezuka et al. |
| 2014/0209896 | A1 | 7/2014 | Yamazaki |
| 2014/0246667 | A1 | 9/2014 | Koyama et al. |
| 2014/0253533 | A1 | 9/2014 | Miyake |
| 2014/0333864 | A1 | 11/2014 | Miyake et al. |
| 2014/0339545 | A1 | 11/2014 | Yamazaki |
| 2015/0255612 | A1 | 9/2015 | Yamazaki et al. |
| 2015/0348998 | A1 | 12/2015 | Koezuka et al. |
| 2016/0079430 | A1 | 3/2016 | Yamazaki |
| 2016/0086792 | A1 | 3/2016 | Shimomura et al. |
| 2016/0087085 | A1 | 3/2016 | Yamazaki et al. |
| 2016/0163870 | A1 | 6/2016 | Ito et al. |
| 2016/0190330 | A1* | 6/2016 | Yamazaki ......... H01L 29/41733 257/43 |
| 2016/0284823 | A1 | 9/2016 | Yamazaki |
| 2016/0329436 | A1 | 11/2016 | Kobayashi et al. |
| 2017/0025544 | A1 | 1/2017 | Yamazaki et al. |
| 2017/0104090 | A1 | 4/2017 | Koezuka et al. |
| 2017/0222056 | A1* | 8/2017 | Sawai ............... H01L 27/1203 |
| 2017/0271516 | A1 | 9/2017 | Onuki et al. |
| 2017/0309732 | A1 | 10/2017 | Yamazaki et al. |
| 2017/0309752 | A1 | 10/2017 | Yamazaki et al. |
| 2018/0166392 | A1 | 6/2018 | Yamazaki et al. |
| 2018/0180960 | A1 | 6/2018 | Kubota et al. |
| 2018/0182870 | A1 | 6/2018 | Hosaka et al. |
| 2018/0254352 | A1 | 9/2018 | Koezuka et al. |
| 2020/0052100 | A1 | 2/2020 | Koezuka et al. |
| 2021/0090879 | A1 | 3/2021 | Yamazaki et al. |
| 2021/0090961 | A1 | 3/2021 | Tanemura et al. |
| 2021/0328074 | A1 | 10/2021 | Kobayashi et al. |

FOREIGN PATENT DOCUMENTS

| | | |
|---|---|---|
| JP | 2015-164185 A | 9/2015 |
| JP | 2017-139459 A | 8/2017 |
| JP | 2017-199900 A | 11/2017 |
| JP | 2017-199901 A | 11/2017 |
| JP | 2018-148211 A | 9/2018 |
| KR | 2018-0101148 A | 9/2018 |
| TW | 201838179 | 10/2018 |
| WO | WO-2020/070580 | 4/2020 |
| WO | WO-2020/075022 | 4/2020 |

OTHER PUBLICATIONS

Written Opinion (Application No. PCT/IB2019/058802) Dated Feb. 10, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

1471

1472

1473

1474

1475

1476

1477

1478

FIG. 25A
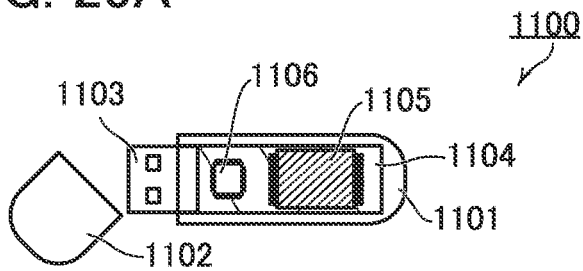
FIG. 25B  FIG. 25C
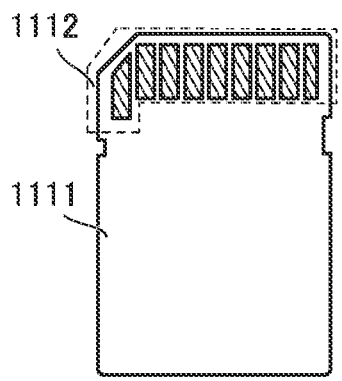 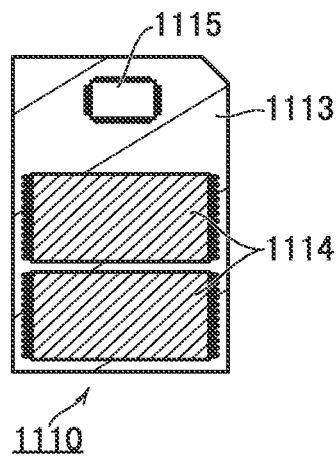
FIG. 25D  FIG. 25E
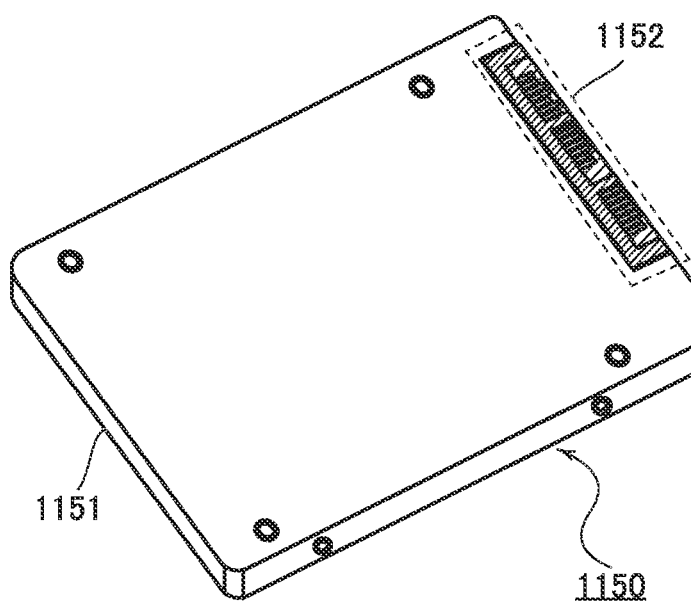 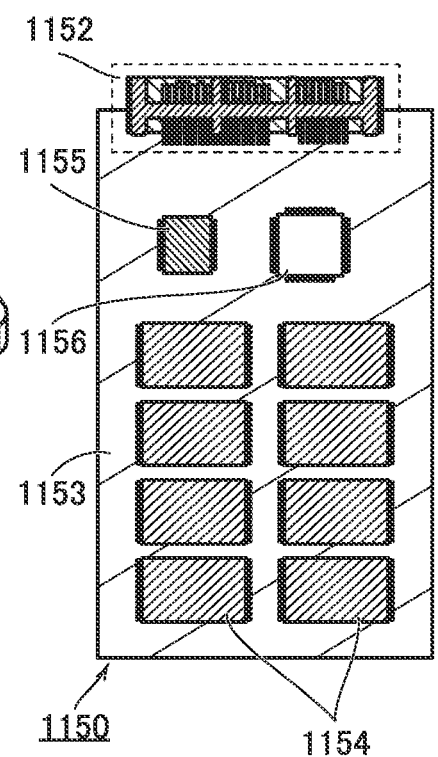

US 12,176,210 B2

MANUFACTURING METHOD OF METAL OXIDE AND MANUFACTURING METHOD OF SEMICONDUCTOR DEVICE

TECHNICAL FIELD

One embodiment of the present invention relates to a metal oxide, a transistor, and an electronic device. One embodiment of the present invention relates to a manufacturing method of a metal oxide and manufacturing method of a semiconductor device. Another embodiment of the present invention relates to a semiconductor wafer and a module.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCES

Non-Patent Documents

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a semiconductor device with high reliability. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a manufacturing method of a metal oxide, which includes a first step of forming a metal oxide containing indium over a substrate and a second step of performing microwave treatment from above the metal oxide. The second step is performed using a gas containing oxygen under reduced pressure, and by the second step, a defect in which hydrogen has entered an oxygen vacancy (VoH) in the metal oxide is divided into an oxygen vacancy (Vo) and hydrogen (H).

Another embodiment of the present invention is a manufacturing method of a metal oxide, which includes a first step of forming a metal oxide containing indium over a substrate, a second step of performing microwave treatment from above the metal oxide, and a third step of performing heat treatment on the metal oxide. The second step is performed using a gas containing oxygen under reduced pressure. The third step is performed under reduced pressure. By the second step, a defect in which hydrogen has entered an oxygen vacancy (VoH) in the metal oxide is divided into an oxygen vacancy (Vo) and hydrogen (H). By the third step, oxygen vacancies (Vo) in the metal oxide are reduced.

Another embodiment of the present invention is a manufacturing method of a metal oxide, which includes a first step of forming a metal oxide containing indium over a substrate, a second step of forming a first conductor and a second conductor over the metal oxide, a third step of performing microwave treatment from above the metal oxide, and a fourth step of performing heat treatment on the metal oxide. The third step is performed using a gas containing oxygen under reduced pressure. The fourth step is performed under reduced pressure. By the third step, a defect in which hydrogen has entered an oxygen vacancy (VoH) in the metal oxide is divided into an oxygen vacancy (Vo) and hydrogen (H). By the fourth step, oxygen vacancies (Vo) in the metal oxide are reduced, and hydrogen (H) in the metal oxide is diffused to the first conductor and the second conductor.

Another embodiment of the present invention is a manufacturing method of a metal oxide, which includes a first step of forming a metal oxide containing indium over a substrate, a second step of forming a first conductor and a second conductor over the metal oxide, a third step of depositing an insulating film over the metal oxide, a fourth step of performing microwave treatment from above the insulating film, and a fifth step of performing heat treatment on one or both of the metal oxide and the insulating film. The fourth step is performed using a gas containing oxygen under reduced pressure. The fifth step is performed under reduced pressure. By the fourth step, a defect in which hydrogen has entered an oxygen vacancy (VoH) in the metal oxide is divided into an oxygen vacancy (Vo) and hydrogen (H). By the fifth step, oxygen vacancies (Vo) in the metal oxide are reduced, and hydrogen (H) in the metal oxide is diffused to the first conductor and the second conductor.

In the above manufacturing method, the temperature of the heat treatment is preferably higher than or equal to 300° C. and lower than or equal to 500° C.

In the above manufacturing method, the pressure of the microwave treatment is preferably higher than or equal to 133 Pa.

In the above manufacturing method, the first step is preferably performed by a sputtering method using an oxide target containing indium.

Effect of the Invention

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

Note that the description of the effects does not preclude the existence of other effects. One embodiment of the present invention does not have to have all these effects. Note that effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 25A to FIG. 25E are schematic diagrams of memory devices of one embodiment of the present invention.

MODE FOR CARRYING OUT THE INVENTION

Figure 1A:
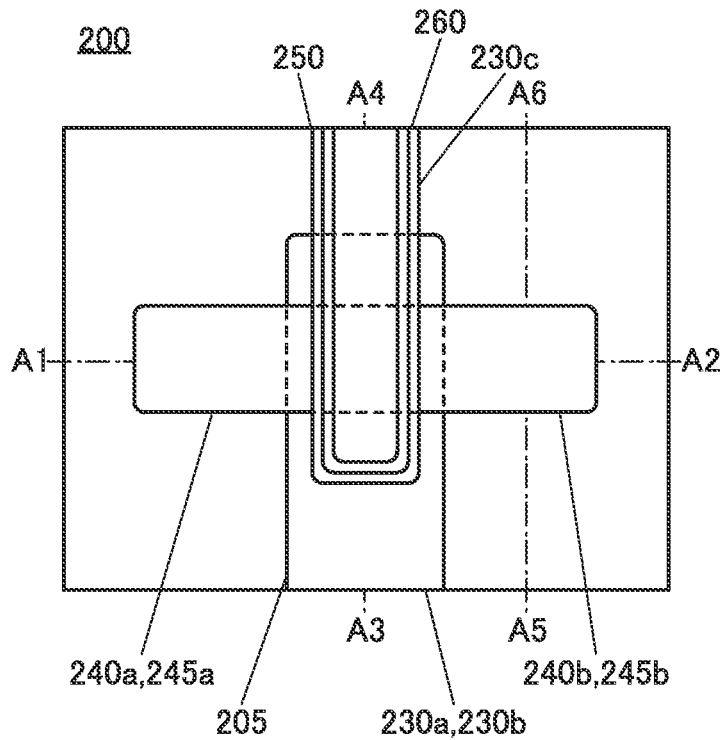
FIG. 1A is a top view of a semiconductor device of one embodiment of the present invention.

Hereinafter, embodiments are described with reference to the drawings. However, the embodiments can be implemented with many different modes, and it is readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, they are not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience in describing a positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an effective channel width) is sometimes different from a channel width shown in a top view of a transistor (hereinafter also referred to as an apparent channel width). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. Note that water also serves as an impurity in some cases. Furthermore, for example, entry of an impurity may cause an oxygen vacancy (referred to as Vo in some cases) in an oxide semiconductor.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. In addition, the term "substantially parallel" indicates that the angle formed between two straight lines is greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. In addition, the term "substantially perpendicular" indicates that the angle formed between two straight lines is greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, normally off means drain current per micrometer of channel width flowing through a transistor being $1\times10^{-20}$ A or less at room temperature, $1\times10^{-18}$ A or less at 85° C., or $1\times10^{-16}$ A or less at 125° C. when a potential is not applied to a gate or a ground potential is applied to the gate.

Embodiment 1

Figure 1B:
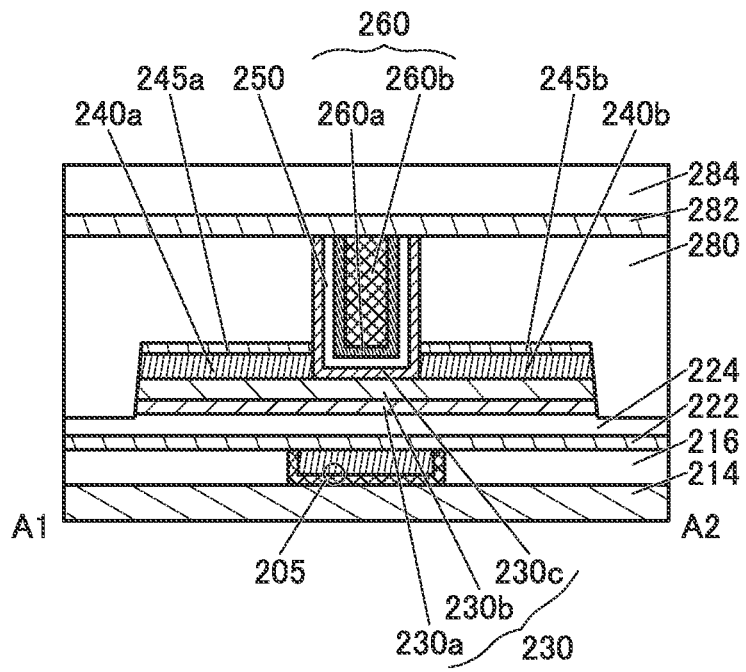
FIG. 1B to FIG. 1D are cross-sectional views of a semiconductor device of one embodiment of the present invention.
Figure 1C:
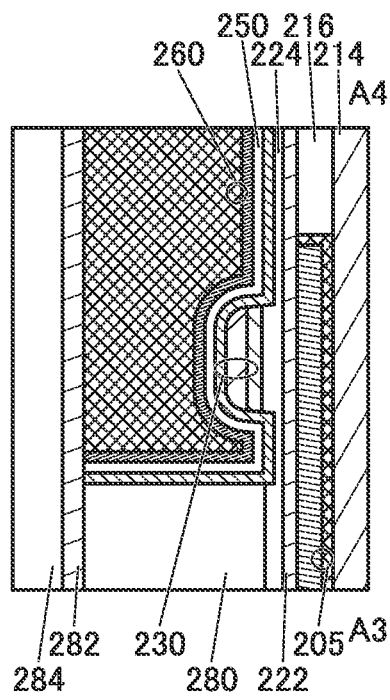
Figure 1D:
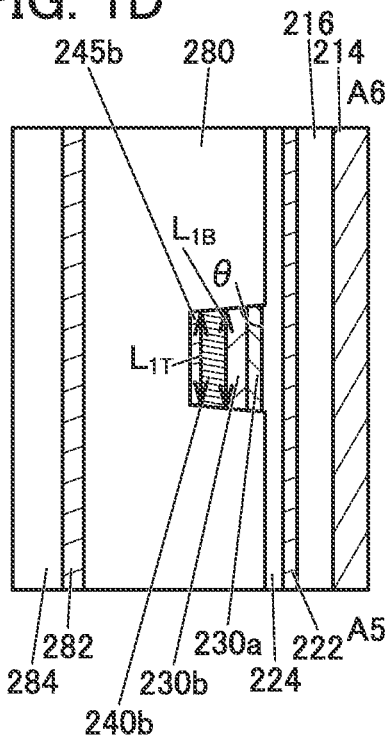

An example of a semiconductor device including a transistor of one embodiment of the present invention is described in this embodiment.
<Structure Example of Semiconductor Device>
FIG. 1A to FIG. 1D are a top view and cross-sectional views of a semiconductor device including a transistor 200 of one embodiment of the present invention. FIG. 1A is a top view of the semiconductor device. FIG. 1B, FIG. 1C, and FIG. 1D are cross-sectional views of the semiconductor device. Here, FIG. 1B is a cross-sectional view of a portion indicated by the dashed-dotted line A1-A2 in FIG. 1A, and is a cross-sectional view in the channel length direction of the transistor 200. FIG. 1C is a cross-sectional view of a portion indicated by the dashed-dotted line A3-A4 in FIG. 1A, and is a cross-sectional view in the channel width direction of the transistor 200. FIG. 1D is a cross-sectional view of a portion indicated by the dashed-dotted line A5-A6 in FIG. 1A, and is also a cross-sectional view in the channel width direction of the transistor 200. Note that for clarity of the drawing, some components are not illustrated in the top view of FIG. 1A.

The semiconductor device of one embodiment of the present invention includes the transistor 200, and an insulator 214, an insulator 216, an insulator 280, an insulator 282, and an insulator 284 that function as interlayer films.
[Transistor 200]

As illustrated in FIG. 1A to FIG. 1D, the transistor 200 includes the conductor 205 that is positioned over a substrate (not illustrated) and is placed to be embedded in the insulator 216; the insulator 222 positioned over the insulator 216 and the conductor 205; the insulator 224 positioned over the insulator 222; the oxide 230 (the oxide 230a, the oxide 230b, an oxide 230c) positioned over the insulator 224; the insulator 250 positioned over the oxide 230; the conductor 260 (the conductor 260a and the conductor 260b) positioned over the insulator 250; a conductor 240a and a conductor 240b in contact with part of a top surface of the oxide 230b; an insulator 245a over the conductor 240a; and an insulator 245b over the conductor 240b.

In the transistor 200, a metal oxide functioning as a semiconductor (hereinafter also referred to as an oxide semiconductor) is preferably used for the oxide 230 (the oxide 230a, the oxide 230b, and the oxide 230c), which includes a region where a channel is formed (hereinafter also referred to as a channel formation region).

The metal oxide functioning as a semiconductor preferably has a band gap of 2 eV or more, preferably 2.5 eV or more. With the use of a metal oxide having such a wide bandgap, the off-state current of the transistor can be reduced.

For the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide or an In—Zn oxide may be used for the oxide 230.

The transistor 200 in which the metal oxide is used in its channel formation region has an extremely low leakage current in a non-conduction state; thus, a semiconductor device with low power consumption can be provided. Moreover, the metal oxide can be deposited by a sputtering method or the like, and thus can be used for the transistor 200 included in a highly integrated semiconductor device.

In contrast, a transistor using a metal oxide is likely to have normally-on characteristics (characteristics in that a channel exists without voltage application to a gate electrode and current flows in a transistor) owing to an impurity and an oxygen vacancy in the metal oxide that affect the electrical characteristics. In the case where the transistor is driven in the state where excess oxygen exceeding the proper amount is included in the metal oxide, the valence of the excess oxygen atoms is changed and the electrical characteristics of the transistor are changed, so that reliability is decreased in some cases.

Note that a metal oxide having a low carrier concentration is preferably used for a channel formation region of an OS transistor of one embodiment of the present invention. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Note that in this specification and the like, the case where the carrier concentration of the metal oxide in the channel formation region is lower than or equal to $1 \times 10^{16}$ cm' is defined as a substantially highly purified intrinsic state. The details of the carrier concentration of the metal oxide are described later.

Examples of impurities in the metal oxide include hydrogen, nitrogen, alkali metal, alkaline earth metal, iron, nickel, and silicon. In particular, hydrogen contained in the metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form VoH in some cases. In some cases, a defect in which hydrogen has entered an oxygen vacancy (VoH) functions as a donor and generates an electron serving as a carrier. In other cases, bonding of some hydrogen to oxygen bonded to a metal atom generates electrons serving as carriers. Thus, a transistor using a metal oxide containing a large amount of hydrogen is likely to have normally-on characteristics. Moreover, hydrogen in the metal oxide is easily transferred by a stress such as heat or an electric field; thus, a large amount of hydrogen in a metal oxide might reduce the reliability of the transistor.

A defect in which hydrogen has entered an oxygen vacancy (VoH) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

The carrier concentration of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^3$, yet further preferably lower than $1 \times 10^{13}$ cm$^3$, and yet still further preferably lower than $1 \times 10^{12}$ cm$^3$. Note that the lower limit of the carrier concentration of the metal oxide in the channel formation region is not particularly limited and can be, for example, $1 \times 10^{-9}$ cm$^{-3}$.

In one embodiment of the present invention, VoH in the oxide 230 is preferably reduced as much as possible so that the oxide 230 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is reduced enough. When a metal oxide with a sufficiently low concentration of impurities such as VoH is used for a channel formation region of a transistor, the transistor can have stable electrical characteristics.

Thus, microwave treatment is preferably performed on the oxide 230 in an atmosphere containing oxygen under reduced pressure. In particular, microwave treatment is preferably performed on the channel formation region in the oxide 230 in an atmosphere containing oxygen under reduced pressure. By performing the microwave treatment, an electric field by a microwave can be applied to the oxide 230 to divide VoH in the oxide 230 into Vo and hydrogen. Some hydrogen divided at this time is bonded to oxygen and is removed as H$_2$O from the oxide 230 in some cases. Some hydrogen is gettered by the conductor 240a and the conductor 240b in some cases. By performing the microwave treatment in such a manner, the hydrogen concentration in the oxide 230 can be lowered. Furthermore, oxygen is supplied to Vo that can exist after VoH is divided into Vo and hydrogen in the oxide 230, so that Vo can be repaired or filled.

For the microwave treatment, for example, an apparatus having a power supply that generates high-density plasma or an apparatus having a power supply that applies RF (Radio Frequency) to the substrate side is suitably used. For example, the use of a gas containing oxygen and high-density plasma enables high-density oxygen radicals to be produced, and RF application to the substrate side allows the oxygen radicals generated by the high-density plasma to be efficiently introduced into the oxide 230 or an insulator near the oxide 230.

After the microwave treatment, heat treatment may be performed with the reduced pressure being maintained. Such treatment enables hydrogen in the oxide 230 to be removed efficiently. The repetition of the heat treatment enables hydrogen in the oxide 230 to be removed more efficiently. Note that the temperature of the heat treatment is preferably higher than or equal to 300° C. and lower than or equal to 500° C. Note that it is possible to repeat the step of performing heat treatment with the reduced pressure being maintained after the microwave treatment.

Particularly when an oxide containing indium is used as the oxide 230, the microwave treatment is preferably performed on the oxide 230. For example, in the case where an In-M-Zn oxide is used as the oxide 230, oxygen in the oxide 230 is mainly bonded to one or more of In, an element M, and Zn. A bond between indium and oxygen tends to be weaker than a bond between the element M or zinc and oxygen. Thus, oxygen bonded to indium is presumed to easily form a vacancy. In other words, an oxygen vacancy is presumed to be easily formed near indium.

Furthermore, since VoH is formed by entry of hydrogen into an oxygen vacancy, VoH is easily formed near indium.

Furthermore, indium is also a metal element that increases the conductivity of the oxide 230. Thus, as the atomic proportion of indium contained in the oxide 230 becomes higher, the on-state current of the transistor 200 tends to be larger. In contrast, as the atomic proportion of indium contained in the oxide 230 becomes higher, VoH is presumed to be formed more easily. Thus, in the case where an oxide containing indium is used as the oxide 230, the microwave treatment can be performed on the oxide 230 to reduce VoH in the oxide 230. Accordingly, the transistor 200 can have a large on-state current and stable electrical characteristics.

Moreover, hydrogen might be diffused into the metal oxide through a step after deposition of the metal oxide. For example, when the insulator 250 functioning as a gate insulator is deposited in contact with the oxide 230, a deposition gas containing hydrogen is used in some cases. It is highly probable that hydrogen contained in the deposition gas is diffused into the oxide 230.

For example, in the atmosphere in depositing an insulator to be the insulator 250 or in the deposited insulator 250, impurities such as hydrogen, nitrogen, and carbon are present. In particular, it is difficult to remove an impurity bonded to a silicon atom by heat treatment because a bond between the impurity atom and the silicon atom needs to be cut.

Thus, after the insulator 250 is deposited over the oxide 230, the microwave treatment is preferably performed in an atmosphere containing oxygen under reduced pressure. By performing the microwave treatment, an electric field by a microwave can be applied to the insulator 250 and the oxide 230 to divide hydrogen bonded to a silicon atom from the silicon atom, so that VoH in the oxide 230 can be divided into Vo and hydrogen. Some hydrogen divided at this time is bonded to oxygen and is removed as $H_2O$ from the insulator 250 and the oxide 230 in some cases. Some hydrogen is gettered by the conductor 240a and the conductor 240b in some cases. By performing the microwave treatment in such a manner, the hydrogen concentration in each of the insulator 250 and the oxide 230 can be lowered. Furthermore, oxygen is supplied to Vo that can exist after VoH is divided into Vo and hydrogen in the oxide 230, so that Vo can be repaired or filled.

After the microwave treatment, heat treatment may be performed with the reduced pressure being maintained. Such treatment enables hydrogen in the insulator 250 and the oxide 230 to be removed efficiently. Alternatively, it is possible to repeat the step of performing heat treatment with the reduced pressure being maintained after the microwave treatment. For example, it is possible to repeat the following step twice to ten times: the microwave treatment is performed for longer than or equal to 10 seconds and shorter than or equal to 300 seconds, preferably longer than or equal to 30 seconds and shorter than or equal to 60 seconds; and then, the heat treatment is performed for longer than or equal to 30 seconds and shorter than or equal to 3000 seconds, preferably 300 seconds or around 300 seconds with the reduced pressure being maintained. The repetition of the heat treatment enables hydrogen in the insulator 250 and the oxide 230 to be removed more efficiently. Note that the temperature of the heat treatment is preferably higher than or equal to 300° C. and lower than or equal to 500° C.

Performing the microwave treatment improves the film quality of the insulator 250, thereby inhibiting diffusion of hydrogen, water, impurities, and the like. Accordingly, hydrogen, water, or impurities can be inhibited from diffusing into the oxide 230 through the insulator 250 in the following step such as formation of a conductive film to be the conductor 260 or the following treatment such as heat treatment.

In solid silicon oxide, for example, bond energy between a hydrogen atom and a silicon atom is 3.3 eV, bond energy between a carbon atom and a silicon atom is 3.4 eV, and bond energy between a nitrogen atom and a silicon atom is 3.5 eV. Thus, in order to remove a hydrogen atom bonded to a silicon atom, radicals or ions having an energy of at least greater than or equal to 3.3 eV are made to collide with a bond portion between the hydrogen atom and the silicon atom to cut the bond between the hydrogen atom and the silicon atom.

Note that the same applies to other impurities such as nitrogen and carbon; radicals or ions having energy at least greater than or equal to bond energy are made to collide with a bond portion between an impurity atom and a silicon atom to cut the bond between the impurity atom and the silicon atom.

Here, examples of radicals and ions generated by microwave-excited plasma include $O(^3P)$, which is an oxygen atom radical in the ground state, $O(^1D)$, which is an oxygen atom radical in the first excited state, and $O_2+$, which is a monovalent cation of an oxygen molecule. The energy of $O(^3P)$ is 2.42 eV, and the energy of $O(^1D)$ is 4.6 eV. Furthermore, the energy of $O^2+$ having charges is not uniquely determined because it is accelerated by the potential distribution in plasma and a bias; however, at least only the internal energy is higher than the energy of $O(^1D)$.

That is, the radicals and the ions such as $O(^1D)$ and $O_2+$ cut the bond between a silicon atom and each of a hydrogen atom, a nitrogen atom, and a carbon atom in the insulator 250 to remove a hydrogen atom, a nitrogen atom, and a carbon atom bonded to the silicon atom. Furthermore, the impurities such as hydrogen, nitrogen, and carbon can also be reduced by thermal energy and the like applied to a substrate in performing the microwave-excited plasma treatment.

On the other hand, $O(^3P)$ has low reactivity, and thus does not react in the insulator 250 and is diffused deeply in the film. Alternatively, $O(^3P)$ reaches the oxide 230 through the insulator 250, and is diffused into the oxide 230. When $O(^3P)$ diffused into the oxide 230 comes close to the oxygen vacancy hydrogen enters, hydrogen in the oxygen vacancy is released from the oxygen vacancy and $O(^3P)$ enters the oxygen vacancy instead; thus, the oxygen vacancy is filled. Accordingly, an electron serving as a carrier can be inhibited from being generated in the oxide 230.

The proportion of $O(^3P)$ in the total radicals and ion species increases when the microwave treatment is performed under a high pressure condition. The proportion of $O(^3P)$ is preferably high for compensation of the oxygen vacancies in the oxide 230. Thus, the pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

As described above, VoH functioning as a donor in the metal oxide can be reduced, so that the carrier concentration of the metal oxide functioning as the channel formation region can be lowered. A transistor using such a metal oxide for a channel formation region can have normally-off characteristics, and allows a semiconductor device to have favorable electrical characteristics and reliability.

Moreover, when the metal oxide is used for the channel formation region of the transistor, ΔVsh measured in a +GBT (Gate Bias Temperature) stress test can be small. Accordingly, the reliability of the transistor can be improved. Note that a model of the behavior of ΔVsh is described later.

According to the above, a semiconductor device with high reliability can be provided. Alternatively, a semiconductor device having favorable electrical characteristics can be provided. Alternatively, a semiconductor device that can be miniaturized or highly integrated can be provided. Alternatively, a semiconductor device with low power consumption can be provided.

<Behavior of ΔVsh in +GBT Stress Test>

An off-state current of an OS transistor and the behavior of ΔVsh in a +GBT stress test are described below. In the description, a metal oxide used for a channel formation region is an In—Ga—Zn oxide.

Note that in the following description, a shift voltage (Vsh) is defined by Vg at which in a drain current (Id)-gate voltage (Vg) curve of a transistor, the tangent at a point where the slope of the curve is the steepest intersects the straight line of Id=1 pA. Moreover, a change amount of the shift voltage is denoted by ΔVsh.

In the +GBT stress test for the OS transistor, ΔVsh shifts in a negative direction over time in some cases. In addition, ΔVsh sometimes shows the behavior of shifting to not one direction (e.g., a negative direction) but both a negative direction and a positive direction. Note that in this specification and the like, the behavior is sometimes referred to as a fluctuating behavior in a +GBT stress test.

Figure 2A:
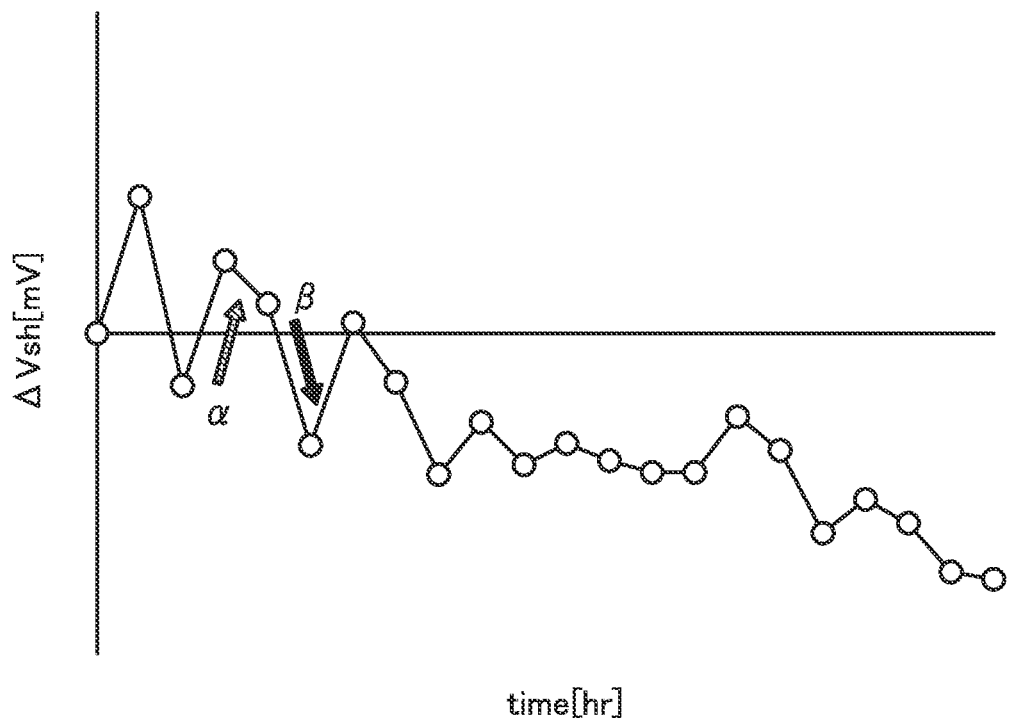
FIG. 2A is a diagram illustrating the behavior of ΔVsh in a +GBT test.

Here, FIG. 2A shows a schematic diagram illustrating the behavior of ΔVsh in the +GBT test. In FIG. 2A, the vertical axis represents ΔVsh [mV] and the horizontal axis represents time [hr].

As illustrated in FIG. 2A, in the +GBT stress test for the OS transistor, ΔVsh shifts with both a drift in a positive direction (an arrow α in FIG. 2A) and a drift in a negative direction (an arrow β in FIG. 2A). Note that as illustrated in FIG. 2A, ΔVsh shifts in the negative direction in perspective with the drifts denoted by the arrow α and the arrow β.

The fluctuating behavior in the +GBT stress test is presumed to occur due to an oxygen vacancy (Vo), hydrogen (H), and a defect in which an oxygen vacancy and hydrogen are bonded (VoH) in the channel formation region of the metal oxide. That is, by reducing Vo, H, and VoH in the channel formation region of the metal oxide, the fluctuating behavior in the +GBT test can also be reduced.

<Basic Model>

Here, the fluctuating behavior of ΔVth in the +GBT stress test can be interpreted by using a basic model shown below.

First, a current that flows from a source to a drain in an OS transistor (drain current) is described with reference to FIG. 2B. Note that the OS transistor includes a gate electrode, a gate insulating layer, a metal oxide layer including a channel formation region, a source region, and a drain region.

Figure 2B:
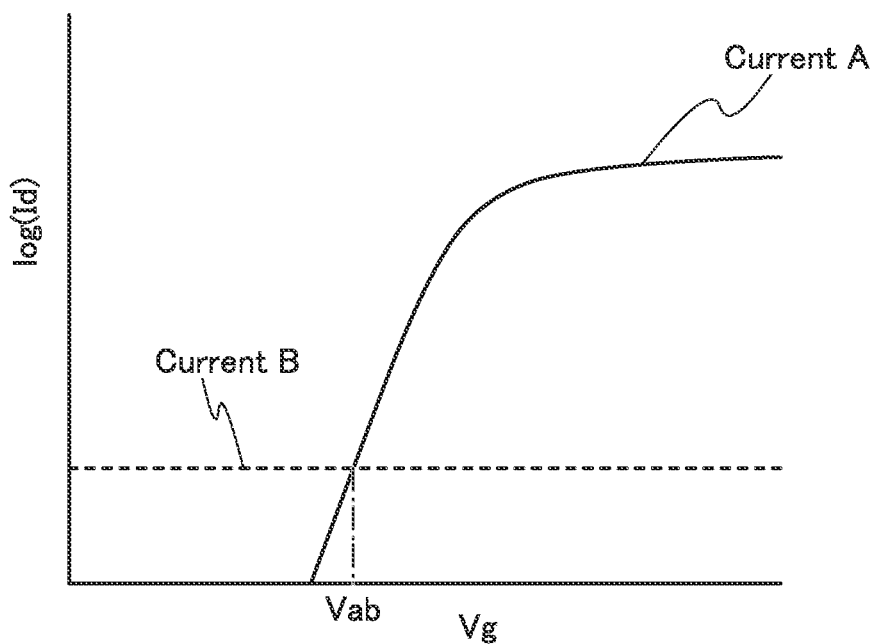
FIG. 2B is a diagram illustrating a drain current of a transistor.

FIG. 2B is a schematic diagram of the Id-Vg characteristics of the OS transistor. In FIG. 2B, the horizontal axis represents a change in voltage applied to the gate electrode (Vg) [V] and the vertical axis represents a change in drain current (Id) [A]. Note that FIG. 2B is a semi-log graph with a logarithmic vertical axis (log).

Here, the OS transistor has two kinds of drain currents. One current is a current relating to an on-state current, and the other current is a current relating to an off-state current.

A current A denoted by a solid line in FIG. 2B is a current relating to an on-state current. A current B denoted by a dotted line in FIG. 2B is a current relating to an off-state current. A voltage Vab shown in FIG. 2B is the value of a gate voltage at which the value of the current A is equal to the value of the current B.

The drain current of the OS transistor is observed as the sum of the current A and the current B shown in FIG. 2B. In the case where the gate voltage Vg is lower than the voltage Vab, the ratio of the current B to the drain current is high; and in the case where the gate voltage Vg is higher than the voltage Vab, the ratio of the current A to the drain current is high.

In the metal oxide, carriers (electrons) relating on the on-state current are presumed to be conducted mainly due to an s orbital of a heavy metal (e.g., In in an In—Ga—Zn oxide). In other words, the on-state current is presumed to flow mainly by electric conduction caused by InO. Furthermore, a depletion layer spreads over the entire metal oxide, which enables sufficient electric conduction.

Furthermore, carriers relating on the off-state current are presumed to be electrons caused by VoH. Note that VoH functions as a donor and releases an electron that is a carrier.

Note that in silicon, carriers are generated by doping phosphorus (P) or boron B. The carriers relate to a current flowing between the source region and the drain region. That is, in silicon, the on-state current and the off-state current are presumed to be determined by one kind of carrier.

Next, carrier conduction through VoH in an OS transistor is described with reference to FIG. 3A, FIG. 3B, and FIG. 3C.

Figure 3A:
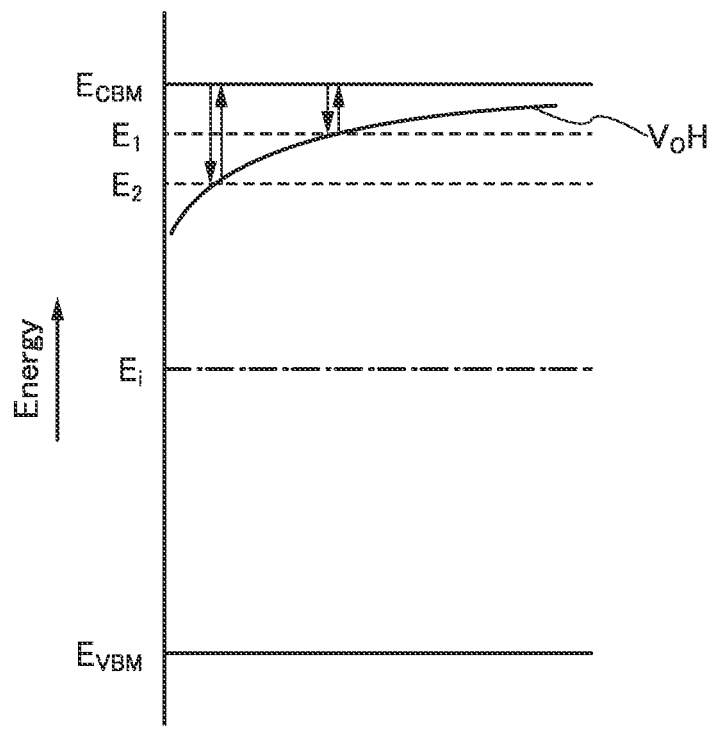
FIG. 3A is a diagram illustrating an energy diagram of a metal oxide.
Figure 3B:
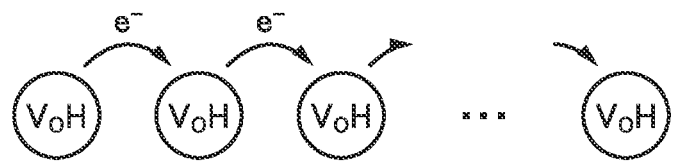
FIG. 3B and FIG. 3C are diagrams illustrating the conduction of electrons.
Figure 3C:
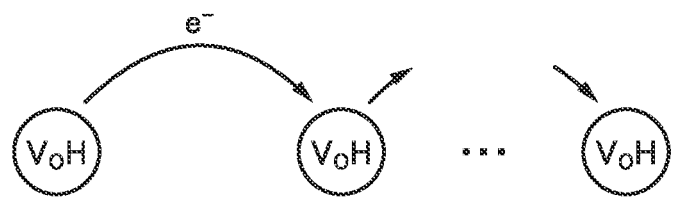

FIG. 3A is a schematic diagram of an energy diagram of a metal oxide. In FIG. 3A, the vertical axis represents energy. The lateral direction represents the density of VoH. $E_{CBM}$ shown in FIG. 3A is energy of the conduction band minimum, $E_{VBM}$ is energy of the valence band maximum, and E is energy of a median of an energy gap (also referred to as a mid gap). Moreover, $E_1$ and $E_2$ are energy, and the value of $E_2$ is closer to E than the value of $E_1$ is. Furthermore, and the value of $E_1$ is closer to $E_{CBM}$ than the value of $E_2$ is.

Since VoH functions as a donor, a level due to VoH is presumed to be positioned near the conduction band minimum. Thus, as shown in FIG. 3A, the density distribution of VoH is presumed to be positioned near the conduction band minimum. Note that the carriers relating on the off-state current are sometimes trapped or released by the level or a trap center due to VoH. The level or the trap center due to VoH is presumed to exist discretely.

Here, suppose that when the Fermi level becomes close to the mid gap (E), VoH disappears, whereby VoH is reduced. For example, as shown in FIG. 3A, suppose that the density of VoH is higher as the level is closer to the conduction band minimum, and the density of VoH is lower as the level is closer to the mid gap ($E_1$).

As described above, in an In—Ga—Zn oxide, VoH is easily formed near indium. That is, VoH is easily formed in InO.

That is, since carriers are electrically conducted owing to InO, carriers due to VoH are presumed to conduct through VoH, which makes the off-state current flow. Thus, by reducing VoH, conduction of carriers due to VoH is inhibited, which enables the off-state current to be decreased. Furthermore, carriers relating on the off current can be decreased. When the off-state current is decreased, the carriers can be close to what is called naturally existing carriers. By reducing VoH in the metal oxide, the carrier concentration of the metal oxide can be close to intrinsic carrier concentration (e.g., $1 \times 10^{-9}$ cm$^{-3}$ in the case of the metal oxide having a band gap of 3.3 eV).

In the case where the energy of the Fermi level is close to $E_1$, in other words, in the case where the Fermi level is close to the conduction band, a larger amount of VoH exists or the density of VoH is high, as compared to the case where the energy of the Fermi level is close to $E_2$. Then, as shown in FIG. 3B, the frequency of conduction of carriers e$^-$ relating on the off-state current through VoH increases, so that the off-state current becomes large.

In contrast, in the case where the energy of the Fermi level is close to $E_2$, in other words, in the case where the Fermi level is close to the mid gap ($E_i$), the amount of VoH is small or the density of VoH is low, as compared to the case where the energy of the Fermi level is close to $E_1$. Then, the interval between VoH becomes long as shown in FIG. 3C; thus, the frequency of conduction of carriers e$^-$ relating on the off-state current through VoH is decreased, so that the off-state current becomes small.

That is, the off-state current becomes large when the density of VoH is high, and the off-state current becomes small when the density of VoH is low. In other words, the off-state current becomes large when VoH is generated, and the off-state current becomes small when VoH disappears.

The OS transistor has characteristics in that the off-state current hardly increases even at high temperatures and the ratio of the on-state current to the off-state current is high even at high temperatures. For example, even at a high temperature of higher than or equal to 125° C. to lower than or equal to 150° C., the OS transistor can perform good switching. In the case where the off-state current at high temperatures is mainly due to the carrier conduction through VoH, by reducing VoH, the off-state current at high temperatures can be further decreased.

The fluctuating behavior of ΔVsh is sometimes caused by a current relating on the on-state current and is sometimes caused by a current relating on the off-state current. In particular, the fluctuating behavior of ΔVsh due to the current relating on the on-state current easily occurs when a large amount of VoH exists. As shown in FIG. 3A, carriers relating on the on-state current are trapped by the level due to VoH or the trapped carriers are released to the conduction band. In the case where the energy of the Fermi level is close to $E_1$, the density of VoH is high and the density of the level due to VoH is high, as compared to the case where the energy of the Fermi level is close to $E_2$. Thus, the frequency in which the carriers relating on the on-state current are trapped by the level due to VoH or the trapped carriers are released to the conduction band becomes high. Thus, the on-state current easily shifts; thus, the fluctuating behavior of ΔVsh easily occurs.

<Application Model>

Next, application models in which the basic model is applied to the +GBT stress test for the OS transistor are described with reference to FIG. 4A and FIG. 4B.

Note that in the +GBT stress test for the OS transistor, a positive potential is applied to the gate electrode. In the case where a positive potential is applied to the gate electrode, an electric field generated from the gate electrode is applied to the channel formation region of the metal oxide.

Figure 4A:
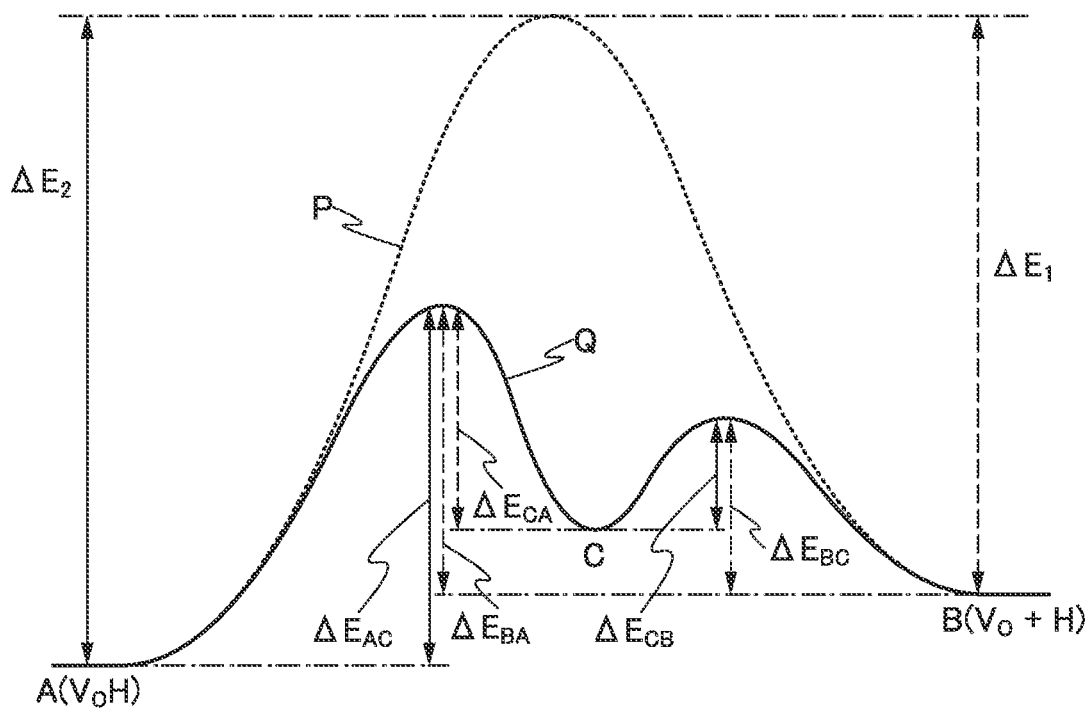
FIG. 4A and FIG. 4B are schematic diagrams of a transition of energy relating to a reaction of VoH and Vo and H.
Figure 4B:
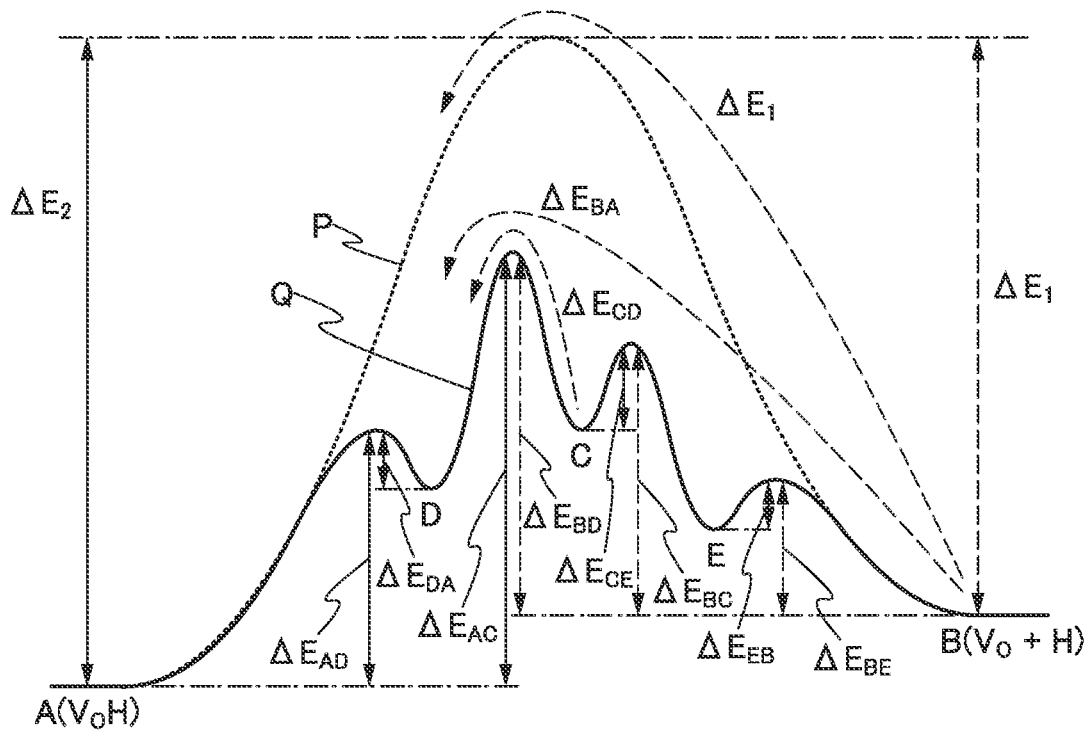

FIG. 4A and FIG. 4B are schematic diagrams of transition of energy relating to a reaction of VoH and Vo and H which are divided. First, the application model applied to the +GBT stress test for the OS transistor is described in detail with reference to FIG. 4A.

In FIG. 4A and FIG. 4B, the vertical axis represents energy. Moreover, a state A in FIG. 4A and FIG. 4B is a state where Vo and H exist as VoH, and a state B in FIG. 4A and FIG. 4B is a state where Vo and H are separated (denoted by Vo+H). Note that energy ΔE needed for a change (reaction) from a state 1 to a state 2 is a gap between the energy of the state 1 and energy positioned highest during the reaction. That is, as the energy ΔE that is needed for the reaction becomes higher, the reaction hardly occurs.

As shown in FIG. 4A, VoH is presumed to exist more stably and have lower energy than Vo and H which are separated. VoH is newly generated little by little by the electric field applied to the metal oxide, so that ΔVsh shifts in the negative direction over time in some cases. That is, Vo and H exist more stably as VoH than Vo and H which are separated.

Transition of energy relating to the reaction in the case where an electric field is not applied to the metal oxide is shown by a dotted line P in FIG. 4A. On the dotted line P shown in FIG. 4A, $\Delta E_2$ is energy needed for a change from the state A to the state B (division of VoH into Vo and H). Furthermore, $\Delta E_1$ is energy needed for a change from the state B to the state A (VoH formation by bonding of Vo and H).

In the case where an electric field is not applied to the metal oxide, energy needed for the reaction between VoH and Vo and H which are separated ($\Delta E_1$ and $\Delta E_2$) is relatively large. Thus, the frequency of the reaction of dividing VoH into Vo and H is lower at lower temperatures and higher at higher temperatures. For example, by performing heat treatment at 400° C. for four hours, the reaction of dividing VoH into Vo and H progresses, and in addition, by performing oxygen adding treatment, oxygen vacancies are repaired and hydrogen is reacted to oxygen to be removed as H$_2$O so that VoH is inhibited from being formed again; accordingly, VoH can be reduced.

Next, transition of energy relating to the reaction in the case where an electric field is applied to the metal oxide is shown by a solid line Q in FIG. 4A.

When an electric field is applied to the metal oxide, the alignment of VoH is sometimes changed or the VoH is sometimes rearranged. Accordingly, transition of energy relating to the reaction between VoH and Vo and H which are separated is changed. For example, in the reaction between VoH and Vo and H which are separated, one or a plurality of metastable states exist. That is, in each of the reaction in which VoH is divided into Vo and H and the reaction in which Vo is bonded to H to form VoH, a plurality of kinds of energy ΔE needed for the reactions exists.

FIG. 4A shows the transition of energy in the case where one metastable state (a state C) exists during the reaction between VoH and Vo and H which are separated. Here, the state C is a metastable state relating to Vo and H, and functions as a donor in some cases and does not function as a donor in other cases.

On the solid line Q shown in FIG. 4A, $\Delta E_{AC}$ is energy needed for a change from the state A (VoH) to the state C, $\Delta E_{CB}$ is energy needed for a change from the state C to the state B (separated Vo and H). Moreover, $\Delta E_{BC}$ is energy needed for a change from the state B (separated Vo and H) to the state C, $\Delta E_{CA}$ is energy needed for a change from the state C to the state A (VoH), and $\Delta E_{BA}$ is energy needed for a change from the state B (separated Vo and H) to the state A (VoH).

Note that FIG. 4A shows an example in which $\Delta E_{CA}$ is greater than $\Delta E_{BC}$; however, the present invention is not limited to this. $\Delta E_{CA}$ is sometimes smaller than $\Delta E_{BC}$ or $\Delta E_{CA}$ is sometimes equal to $\Delta E_{BC}$. Note that the case where $\Delta E_{CA}$ is greater than $\Delta E_{BC}$ is described below.

As shown in FIG. 4A, $\Delta E_{AC}$ and $\Delta E_{CB}$ are each smaller than $\Delta E_2$. Thus, when an electric field is applied to the metal oxide, the reaction of dividing VoH in the metal oxide into Vo and H easily progresses. Note that even when the electric field applied to the metal oxide is weak, the reaction of dividing VoH in the metal oxide into Vo and H can progress.

Furthermore, as shown in FIG. 4A, $\Delta E_{BC}$ is smaller than $\Delta E_1$; thus, a change from the state B (separated Vo and H) to the state C easily occurs. Moreover, $\Delta E_{CA}$ is greater than $\Delta E_{BC}$; thus, the frequency of a change from the state C to the state A (VoH) is low. Thus, when an electric field is applied to the metal oxide, Vo and H in the metal oxide are easily changed to the state C. In the case where the state C functions as a donor or contributes to the conduction of carriers relating to the off-state current, when the number of the states C increases, $\Delta$Vsh shifts in the negative direction. Furthermore, $\Delta E_{CB}$ is also small; thus, a return from the state C to the state B (separated Vo and H) easily occurs. When the return from the state C to the state B (separated Vo and H) occurs, the number of the states C decreases. Note that the decrease in number of the states C affects the shift of $\Delta$Vsh in the positive direction but does not affect the shift of $\Delta$Vsh in the negative direction. That is, a reaction between the state C and the state B (separated Vo and H) occurs, so that energy becomes unstable and the fluctuating behavior of $\Delta$Vsh occurs.

As illustrated in FIG. 4A, $\Delta E_{BA}$ is smaller than $\Delta E_1$. Furthermore, $\Delta E_{BC}$ is smaller than $\Delta E_{BA}$. Thus, when an electric field is applied to the metal oxide, the state B (separated Vo and H) in the metal oxide is easily changed to the state A (VoH). The number of VoH increases, so that $\Delta$Vsh shifts in the negative direction. Furthermore, $\Delta E_{AC}$ is smaller than $\Delta E_2$, and $\Delta E_{CB}$ is smaller than $\Delta E_{AC}$. Thus, when an electric field is applied to the metal oxide, VoH in the metal oxide easily returns to the state B (separated Vo and H). When VoH returns to separated Vo and H, the number of VoH is decreased. Note that the decrease in number of VoH increases the probability that $\Delta$Vsh shifts in the positive direction. That is, a reaction between VoH and Vo and H which are cut occurs, so that energy becomes unstable and the fluctuating behavior of $\Delta$Vsh occurs.

As described above, it can be understood that the fluctuating behavior of $\Delta$Vsh in the +GBT stress test is caused by VoH.

As described above, when an electric field is applied to the metal oxide, one or a plurality of metastable states exist in the reaction between VoH and Vo and H which are separated. Note that FIG. 4A shows a schematic diagram of the energy transition in the case where one metastable state exists, whereas FIG. 4B shows a schematic diagram of the energy transition in the case where a plurality of metastable states exist. A dotted line P in FIG. 4B, as in FIG. 4A, denotes transition of energy relating to the reaction in the case where an electric field is not applied to the metal oxide. A solid line Q in FIG. 4B denotes transition of energy relating to the reaction between VoH and Vo and H which are separated in the case where three metastable states (the state C, a state D, and a state E) exist. As in the case where one metastable state exists, the reaction between VoH and Vo and H which are separated easily occurs; thus, the fluctuating behavior of $\Delta$Vsh in the +GBT stress test occurs.

Note that on the dotted line P shown in FIG. 4B, $\Delta E_2$ is energy needed for a change from the state A (VoH) to the state B (separated Vo and H) and $\Delta E_1$ is energy needed for a change from the state B (separated Vo and H) to the state A (VoH).

Moreover, on the solid line Q shown in FIG. 4B, $\Delta E_{AD}$ is energy needed for a change from the state A (VoH) to the state D, $\Delta E_{AC}$ is energy needed for a change from the state A (VoH) to the state C, $\Delta E_{CE}$ is energy needed for a change from the state C to the state E, and $\Delta E_{EB}$ is energy needed for a change from the state E to the state B (separated Vo and H). Moreover, $\Delta E_{BE}$ is energy needed for a change from the state B (separated Vo and H) to the state E, $\Delta E_{BC}$ is energy needed for a change from the state B (separated Vo and H) to the state C, $\Delta E_{BD}$ is energy needed for a change from the state B (separated Vo and H) to the state D, and $\Delta E_{DA}$ is energy needed for a change from the state D to the state A (VoH). Furthermore, $\Delta E_{BA}$ is energy needed for a change from the state B (separated Vo and H) to the state A (VoH), and $\Delta E_{CD}$ is energy needed for a change from the state C to the state D.

Although the schematic diagrams of transition of energy relating to the reaction between VoH and Vo and H which are separated with or without application of an electric field to the metal oxide are shown in FIG. 4A and FIG. 4B, the transition of energy relating on the reaction can change by the difference in crystallinity of the metal oxide. For example, in some cases, the dotted line P shown in FIG. 4A and FIG. 4B can show transition of energy relating on the reaction in a single crystal metal oxide, and the solid line Q shown in FIG. 4A and FIG. 4B can show transition of energy relating on the reaction in a metal oxide having a CAAC structure or an nc structure. That is, a reaction of dividing VoH into Vo and H easily progresses more in the metal oxide having a CAAC structure or an nc structure than in the single crystal metal oxide in some cases. Note that the transition of energy relating on the reaction in the metal oxide having an nc structure is more complex than the solid line Q shown in FIG. 4A and FIG. 4B in some cases.

As described above, the generation and disappearance of VoH in the metal oxide are presumed to be repeated. In other words, the fluctuating behavior in the +GBT stress test is presumed to occur when VoH drifts depending on the electric field or the generation and disappearance of VoH are repeated.

Note that the generation and disappearance of VoH in the metal oxide can be one of various instability factors, in addition to the above-described fluctuating behavior of $\Delta$Vsh. For example, a phenomenon in which the off-state current changes every time when the measurement is performed on the OS transistor is also presumed to be caused by the generation and disappearance of VoH in the metal oxide.

Meanwhile, in the OS transistor, carriers relating to a short channel effect are different from carriers derived from VoH, so that an effect in which the short channel effect hardly occurs can be expected. Note that as one of the short channel effects, an increase in S value of the OS transistor can be given. The S value relates to the on-state current, and carriers relating to the on-state current are different from carriers derived from VoH. Thus, even when generation and disappearance of VoH are repeated, the generation and disappearance of VoH do not affect or hardly affects the short channel effect. That is, the OS transistor is presumed to have a device structure in which the short channel effect hardly occurs.

Note that the above-described disappearance of VoH can be rephrased as division into Vo and H. The division into Vo and H can occur by application of an electric field to the metal oxide in microwave treatment or heat treatment such as dehydration treatment or dehydrogenation treatment in the manufacturing process of the OS transistor. Thus, it can be understood that the microwave treatment or the heat treatment is an important step in the manufacturing process of the OS transistor. Furthermore, as heat treatment, in addition to the above-described heat treatment, oxygen adding treatment is also important. The oxygen adding treatment is treatment for repairing Vo formed in the metal oxide with oxygen by performing heat treatment in an oxygen atmosphere or by performing heat treatment with an excess oxygen-containing insulating film being in contact with the metal oxide, in the manufacturing process of the OS transistor.

Moreover, the above-described disappearance of VoH and repair of Vo with oxygen can be expressed by Formula (1) and Formula (2) below. Formula (1) shows the disappearance of VoH, that is, the state where VoH is divided into Vo and H, and Formula (2) shows the state where Vo is repaired with oxygen.

$$\text{VoH} \rightarrow \text{Vo} + \text{H} \tag{1}$$

$$\text{Vo} + \text{O} \rightarrow \text{null} \tag{2}$$

<Existing Probability of VoH in Metal Oxide>

Next, the existing probability of VoH in the metal oxide is described below.

In the OS transistor, a conductor functioning as a source electrode or a drain electrode is in contact with the metal oxide, so that oxygen in the metal oxide is diffused into the conductor and thus, the conductor is oxidized in some cases. It is highly probable that oxidation of the conductor lowers the conductivity of the conductor. Note that diffusion of oxygen in the metal oxide into the conductor can be rephrased as absorption of oxygen in the metal oxide by the conductor.

Moreover, by the diffusion of oxygen in the metal oxide into the source electrode and the drain electrode, a layer is sometimes formed between the source electrode and the metal oxide and between the drain electrode and the metal oxide. The layer contains more oxygen than the source electrode or the drain electrode does; thus, the layer is presumed to have an insulating property. The three-layer structure of the source electrode or the drain electrode, the layer, and the metal oxide can be the three-layer structure with a metal, an insulator, and a semiconductor, which can be regarded as a metal-insulator-semiconductor (MIS) structure or a diode junction structure having an MIS structure as its main part.

In the MIS structure, a band is bent in accordance with a potential barrier OB formed between the source electrode or the drain electrode and the layer, so that VoH is presumed to gather at the interface between the layer and the metal oxide. That is, the existing probability of VoH at the interface between the layer and the metal oxide is presumed to be high. When VoH gathers at the interface, energy becomes stable. Furthermore, when VoH gathers at the interface, a low-resistance region is presumed to be formed in the metal oxide near the interface.

Note that hydrogen derived from VoH gathering at the interface is diffused into the source electrode or the drain electrode in some cases. In particular, by using a nitride containing tantalum for the source electrode and the drain electrode, hydrogen derived from VoH gathering at the interface is easily diffused into the source electrode or the drain electrode, and the diffused hydrogen is bonded to nitrogen contained in the source electrode or the drain electrode in some cases. That is, hydrogen derived from VoH gathering at the interface is sometimes absorbed by the source electrode or the drain electrode.

For example, when heat treatment is performed at 400° C. for four hours, an oxygen-deficient region is formed in the metal oxide near the interface. At this time, VoH in the metal oxide easily moves in a region having a low electric field in the MIS structure, and a low-resistance region is formed in the metal oxide near the interface.

<Detailed Structure of Semiconductor Device>

The detailed structure of the semiconductor device including the transistor 200 of one embodiment of the present invention is described below.

The insulator 214 preferably functions as an insulating barrier film that inhibits diffusion of impurities such as water and hydrogen from the substrate side into the transistor 200. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom. Alternatively, it is preferable to use an insulating material having a function of inhibiting diffusion of oxygen (e.g., at least one of an oxygen atom, an oxygen molecule, and the like).

Note that in this specification, a function of inhibiting diffusion of impurities or oxygen means a function of inhibiting diffusion of any one or all of the impurities and the oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

For example, aluminum oxide, silicon nitride, or the like is preferably used for the insulator 214. Accordingly, impurities such as water and hydrogen can be inhibited from being diffused into the transistor 200 side from the substrate side through the insulator 214. Alternatively, oxygen contained in the insulator 224 and the like can be inhibited from being diffused to the substrate side through the insulator 214. Note that the insulator 214 may have a stacked-layer structure of two or more layers. In such cases, without limitation to a stacked-layer structure formed of the same material, a stacked-layer structure formed of different materials may be employed. For example, a stack of aluminum oxide and silicon nitride may be employed.

Furthermore, the insulator 214 is preferably formed of silicon nitride by a sputtering method, for example. In this manner, the hydrogen concentration in the insulator 214 can be reduced, and impurities such as water and hydrogen can be further inhibited from being diffused into the transistor 200 side from the substrate side through the insulator 214.

The permittivity of the insulator 216 functioning as an interlayer film is preferably lower than the permittivity of the insulator 214. When a material with a low dielectric constant is used as an interlayer film, the parasitic capacitance generated between wirings can be reduced. For the insulator 216, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 216 preferably has low hydrogen concentration and includes an excess oxygen region or oxygen released by heating (hereinafter also referred to as excess oxygen). For example, silicon oxide deposited by a sputtering method is preferably used for the insulator 216. Accordingly, entry of hydrogen into the oxide 230 can be inhibited. By supplying oxygen to the oxide 230, the number of oxygen vacancies in the oxide 230 can be reduced. Thus, a transistor that has stable electrical characteristics with a small variation in electrical characteristics and improved reliability can be provided.

Note that the insulator 216 may have a stacked-layer structure. For example, in the insulator 216, an insulator similar to the insulator 214 may be provided at least in a portion in contact with a side surface of the conductor 205. With such a structure, oxidization of the conductor 205 due to oxygen contained in the insulator 216 can be inhibited. Alternatively, a reduction in the amount of oxygen contained in the insulator 216 due to the conductor 205 can be inhibited.

The conductor 205 sometimes functions as a second gate (also referred to as bottom gate) electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

The conductor 205 is provided to overlap with the oxide 230 and the conductor 260. Furthermore, the conductor 205 is preferably provided to be embedded in the insulator 214 or the insulator 216.

Note that as shown in FIG. 1B, the conductor 205 is preferably provided larger than the channel formation region in the oxide 230. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. Since the above-described structure is included, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of the first gate and the second gate is referred to as a surrounded channel (S-channel) structure.

In this specification and the like, the S-channel structure refers to a transistor structure in which a channel formation region is electrically surrounded by the electric fields of a pair of gate electrodes. Furthermore, in this specification and the like, the S-channel structure has a feature in that the side surface and the vicinity of the oxide 230 in contact with the conductor 240a and the conductor 240b functioning as a source electrode and a drain electrode are of I-type like the channel formation region. The side surface and the vicinity of the oxide 230 in contact with the conductor 240a and the conductor 240b are in contact with the insulator 280 and thus can be of I-type like the channel formation region. Note that in this specification and the like, "I-type" can be equated with "highly purified intrinsic" described above. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

FIG. 1C is a cross-sectional view of a region where the oxide 230 and the conductor 260 overlap with each other. Furthermore, FIG. 1D is a cross-sectional view of a region where the oxide 230 and the conductor 260 do not overlap with each other. When a top end of the oxide 230 has a curvature as illustrated in FIG. 1C, the electric field(s) of one or both of the conductor 260 functioning as the first gate electrode and the conductor 205 functioning as the second gate electrode can be favorably applied to the oxide 230. In contrast, it is preferable that a top end of the oxide 230 not have a curvature as illustrated in FIG. 1D, in which case the adhesion between the oxide 230 and the conductor 240b can be improved and the coverage with the insulator 280 can be improved.

Furthermore, as shown in FIG. 1C, the conductor 205 extends to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the first conductor of the conductor 205 and the second conductor of the conductor 205 are stacked is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom is preferably used. Alternatively, it is preferable to use a conductive material having a function of inhibiting diffusion of oxygen (e.g., at least one of oxygen atoms, oxygen molecules, and the like).

When a conductive material having a function of inhibiting diffusion of oxygen is used for the first conductor of the conductor 205, a reduction in the conductivity of the second conductor of the conductor 205 due to oxidation can be inhibited. As a conductive material having a function of inhibiting oxygen diffusion, tantalum, tantalum nitride, ruthenium, or ruthenium oxide is preferably used, for example. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. In particular, it is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is kept.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating, in other words, an insulating material including an excess-oxygen region is preferably used. An oxide film that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. For example, in the oxide 230, dehydrogenation can be performed when a reaction in which a bond of VoH is cut occurs, i.e., a reaction of "VoH→Vo+H" occurs. Some hydrogen H generated at this time is bonded to oxygen to be $H_2O$, and removed from the oxide 230 or an insulator near the oxide 230 in some cases. Furthermore, some hydrogen is diffused in or trapped (also referred to as gettering) by the conductor 240$a$ and the conductor 240$b$ in some cases. For the microwave treatment, the conditions for the above-described heat treatment can be used.

In a manufacturing process of the transistor 200, the heat treatment is preferably performed with the surface of the oxide 230 exposed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an atmosphere containing oxygen. This provides oxygen to the oxide 230, and reduces oxygen vacancies (Vo). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 230 can promote a reaction in which oxygen vacancies in the oxide 230 are filled with supplied oxygen, i.e., a reaction of Vo+O→null. Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

The insulator 224 preferably has a low hydrogen concentration and includes an excess-oxygen region or excess oxygen, and may be formed using a material similar to that for the insulator 216, for example.

Note that the insulator 222 and the insulator 224 may each have a stacked-layer structure of two or more layers. In such cases, without limitation to a stacked-layer structure formed of the same material, a stacked-layer structure formed of different materials may be employed.

For example, the oxide 230 preferably includes the oxide 230a positioned over the insulator 224, the oxide 230b positioned over the oxide 230a, and the oxide 230c that is positioned over the oxide 230b and is at least partly in contact with the top surface of the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Although a structure in which the oxide 230 has a three-layer stacked structure of the oxide 230a, the oxide 230b, and the oxide 230c in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxide 230a, the oxide 230b, and the oxide 230c may have a stacked-layer structure.

In the transistor using the metal oxide, oxygen in the metal oxide is gradually absorbed by the conductor 240a and the conductor 240b included in the transistor, whereby oxygen vacancies are sometimes generated, which is one of changes over time. In addition, when the conductor 240a and the conductor 240b are oxidized, the contact resistance between the transistor 200 and a wiring is sometimes increased.

Thus, an insulator containing oxygen is used as the insulator 280 functioning as an interlayer film that is provided in contact with the oxide 230. It is particularly preferable to use, for the insulator 280, an oxide that contains more oxygen than oxygen in the stoichiometric composition. That is, in the insulator 280, a region in which oxygen in excess of that in the stoichiometric composition exists (hereinafter also referred to as an excess-oxygen region) is preferably formed.

Furthermore, the insulator 245a and the insulator 245b each functioning as a barrier layer are preferably provided over the conductor 240a and the conductor 240b. The insulator 245a and the insulator 245b are preferably in contact with a top surface of the conductor 240a and a top surface of the conductor 240b, respectively, as illustrated in FIG. 1B. The structure enables less absorption of excess oxygen contained in the insulator 280 by the conductor 240a and the conductor 240b. Furthermore, by inhibiting oxidation of the conductor 240a and the conductor 240b, an increase in the contact resistance between the transistor 200 and the wiring can be inhibited. Consequently, the transistor 200 can have favorable electrical characteristics and reliability.

Thus, the insulator 245a and the insulator 245b preferably have a function of inhibiting oxygen diffusion. For example, the insulator 245a and the insulator 245b preferably have a function of inhibiting oxygen diffusion more than the insulator 280.

An insulator containing an oxide of one or both of aluminum and hafnium is preferably deposited as the insulator 245a and the insulator 245b, for example. An insulator containing aluminum nitride may be used for the insulator 245a and the insulator 245b, for example.

Here, as illustrated in FIG. 1D, at least a side surface of the oxide 230b, a side surface of the conductor 240a, and a side surface of the conductor 240b are substantially perpendicular to a plane where the insulator 224 is in contact with the oxide 230a. Specifically, an angle θ shown in FIG. 1D is preferably greater than or equal to 60 degrees and less than or equal to 95 degrees, further preferably greater than or equal to 88 degrees and less than or equal to 92 degrees.

A side surface of the oxide 230a is not necessarily angled against the insulator 224. For example, part of the side surface of the oxide 230a may have a depressed portion (also referred to as an undercut shape). In a processing for making the side surface of the oxide 230b, the side surface of the conductor 240a, and the side surface of the conductor 240b substantially perpendicular to the plane where the insulator 224 is in contact with the oxide 230a, the undercut shape is made in some cases. With the undercut shape, a contact area of the insulator 280 that is in contact with the oxide 230a can be increased in some cases; thus, oxygen can be favorably supplied from the insulator 280 to the oxide 230b.

Note that FIG. 1D is a cross-sectional view of the transistor in the channel width direction in a region where the oxide 230a and the oxide 230b overlap with the conductor functioning as one of the source electrode and the drain electrode (here, the conductor 240b).

As illustrated in FIG. 1D, when the length of a bottom surface of the conductor 240b is denoted by $L_{IB}$ and the length of the top surface of the conductor 240b is denoted by $L_{IT}$, the ratio of the length of the top surface of the conductor 240b to the length of the bottom surface of the conductor 240b ($L_{IT}/L_{IB}$) is preferably higher than or equal to 0.7 and lower than or equal to 1.3. For example, in the case where the length of the bottom surface of the conductor 240b (TAB) is 60 nm, the length of the top surface of the conductor 240b ($L_{IT}$) is greater than or equal to 42 nm and less than or equal to 78 nm. When the length of the top surface of the conductor 240b ($L_{IT}$) relative to the length of the bottom surface of the conductor 240b (TAB) is made in the above range, contact resistance to a wiring to be formed can be reduced.

Note that in the case where only the above contact resistance is considered, the length of the top surface of the conductor 240b ($L_{IT}$) can exceed the range; however, when the length of the top surface of the conductor 240b ($L_{IT}$) exceeds the range, the coverage (also referred to as step coverage) with the insulator 280 is impaired. Thus, the ratio of the length of the top surface of the conductor 240b to the length of the bottom surface of the conductor 240b ($L_{IT}/L_{IB}$) is preferably greater than or equal to 0.7 and less than or equal to 1.0, further preferably greater than or equal to 0.8 and less than or equal to 0.95.

Note that the range depends on the length of the channel width of the transistor or the thickness of the conductor 240a or the conductor 240b; however, in one embodiment of the present invention, there is no particular limitation on the length of the channel width of the transistor or the thickness of the conductor 240a or the conductor 240b. Note that the length of the channel width of the transistor is preferably greater than or equal to 5 nm and less than or equal to 100 nm, further preferably greater than or equal to 10 nm and less than or equal to 75 nm. The thickness of each of the conductor 240a and the conductor 240b is preferably greater than or equal to 5 nm and less than or equal to 100 nm, further preferably greater than or equal to 10 nm and less than or equal to 50 nm. In the case of the transistor of one embodiment of the present invention, the channel width of the transistor in the above range and the thickness of the conductor 240a and the conductor 240b in the above range can bring about significant effects. Furthermore, although there is no particular limitation on the length of the channel length of the transistor either, the range can be substantially equal to the above range of the channel width.

Moreover, although a cross-sectional view of a region where the oxide 230 overlaps with the conductor functioning as the other of the source electrode and the drain electrode (here, the conductor 240a) is not shown explicitly, the cross section is similar to that shown in FIG. 1D.

Note that the oxide 230 preferably has a stacked-layer structure using oxides with different chemical compositions. Specifically, the atomic ratio of the element M to metal elements of main components in the metal oxide used for the oxide 230a is preferably greater than the atomic ratio of the element M to metal elements of main components in the metal oxide used for the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

In addition, a CAAC-OS is preferably used for the oxide 230c; the c-axis of a crystal included in the oxide 230c is preferably aligned in a direction substantially perpendicular to the formation surface or the top surface of the oxide 230c. The CAAC-OS has a property of making oxygen move easily in the direction perpendicular to the c-axis. Thus, oxygen contained in the oxide 230c can be efficiently supplied to the oxide 230b.

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. At this time, the oxide 230b serves as a main carrier path.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element as a main component in addition to oxygen, a mixed layer with a low density of defect states can be formed. For example, an In—Ga—Zn oxide, a Ga—Zn oxide, gallium oxide, or the like may be used for the oxide 230a and the oxide 230c in the case where the oxide 230b is an In—Ga—Zn oxide.

Specifically, as the oxide 230a, a metal oxide with In:Ga:Zn=1:3:4 [atomic ratio] or 1:1:0.5 [atomic ratio] is used. For the oxide 230b, a metal oxide with In:Ga:Zn=1:1:1 [atomic ratio] or In:Ga:Zn=4:2:3 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics.

The oxide 230c may have a stacked-layer structure of two or more layers. For example, the oxide 230c may include a first oxide and a second oxide provided over the first oxide.

The first oxide of the oxide 230c preferably contains at least one of the metal elements contained in the metal oxide used for the oxide 230b, further preferably contains all of these metal elements. For example, it is preferable that an In—Ga—Zn oxide be used for the first oxide of the oxide 230c, and an In—Ga—Zn oxide, a Ga—Zn oxide, or gallium oxide be used for the second oxide of the oxide 230c. Accordingly, the density of defect states at the interface between the oxide 230b and the first oxide of the oxide 230c can be decreased. The second oxide of the oxide 230c is preferably a metal oxide that inhibits diffusion or passage of oxygen, compared to the first oxide of the oxide 230c. Providing the second oxide of the oxide 230c between the insulator 250 and the first oxide of the oxide 230c can inhibit diffusion of oxygen contained in the insulator 280 into the insulator 250. Therefore, the oxygen is more likely to be supplied to the oxide 230b through the first oxide of the oxide 230c.

The conduction band minimum of each of the oxide 230a and the second oxide of the oxide 230c is preferably closer to the vacuum level than the conduction band minimum of the oxide 230b and the first oxide of the oxide 230c. In other words, the electron affinity of each of the oxide 230a and the second oxide of the oxide 230c is preferably smaller than the electron affinity of each of the oxide 230b and the first oxide of the oxide 230c. In that case, it is preferable that the second oxide of the oxide 230c be formed using a metal oxide that can be used for the oxide 230a, and the first oxide of the oxide 230c be formed using a metal oxide that can be used for the oxide 230b. At this time, not only the oxide 230b but also the first oxide of the oxide 230c serves as a main carrier path in some cases.

Specifically, a metal oxide with In:Ga:Zn=4:2:3 [atomic ratio] is used for the first oxide of the oxide 230c, and a metal oxide with In:Ga:Zn=1:3:4 [atomic ratio], Ga:Zn=2:1 [atomic ratio], or Ga:Zn=2:5 [atomic ratio] or a gallium oxide is used for the second oxide of the oxide 230c. Accordingly, the density of defect states at the interface between the first oxide of the oxide 230c and the second oxide of the oxide 230c can be decreased.

When the atomic ratio of In to the metal element of the main component in the metal oxide used for the second oxide of the oxide 230c is smaller than the atomic ratio of In to the metal element of the main component in the metal oxide used for the first oxide of the oxide 230c, the diffusion of In into the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

For the conductor 240a and the conductor 240b, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator from which oxygen is released by heating is provided as the insulator 250 in contact with at least part of the oxide 230c, oxygen can be efficiently supplied to the channel formation region of the oxide 230b and oxygen defects in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide may have a function of part of the first gate electrode. For example, a metal oxide that can be used for the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 preferably includes the conductor 260a and the conductor 260b positioned over the conductor 260a. For example, the conductor 260a is preferably positioned to cover a bottom surface and a side surface of the conductor 260b.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of oxygen atoms, oxygen molecules, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, tantalum, tantalum nitride, ruthenium, or ruthenium oxide is preferably used, for example.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

Although the conductor 260 has a two-layer structure of the conductor 260a and the conductor 260b in FIG. 1B and FIG. 1C, the conductor 260 may have a single-layer structure or a stacked-layer structure of three or more layers.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 240a and the conductor 240b without alignment.

Moreover, as shown in FIG. 1B, a top surface of the conductor 260 is substantially aligned with a top surface of the insulator 250 and the top surface of the oxide 230c.

As shown in FIG. 1C, in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved. When the bottom surface of the insulator 222 is a reference and the difference between the level of the bottom surface of the conductor 260 in a region where the conductor 260, the oxide 230a, and the oxide 230b do not overlap with each other and the level of the bottom surface of the oxide 230b is T1, T1 is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230, the conductor 240a, and the conductor 240b. Furthermore, the insulator 280 is provided in contact with at least the side surface of the oxide 230. In addition, the top surface of the insulator 280 may be planarized.

The insulator 280 functioning as the interlayer film preferably has a low permittivity. When a material with a low dielectric constant is used as an interlayer film, the parasitic capacitance generated between wirings can be reduced. The insulator 280 is preferably formed using a material similar to that used for the insulator 216, for example. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. Note that the insulator 280 may have a stacked-layer structure of two or more layers.

Like the insulator 214 and the like, the insulator 282 preferably functions as an insulating barrier film that inhibits diffusion of impurities such as water and hydrogen into the insulator 280 from above. In addition, like the insulator 214 and the like, the insulator 282 preferably has a low hydrogen concentration and has a function of inhibiting diffusion of hydrogen.

As illustrated in FIG. 1B, the insulator 282 is preferably in contact with the top surfaces of the conductor 260, the insulator 250, and the oxide 230c. This can inhibit entry of impurities such as hydrogen contained in the insulator 284 and the like into the insulator 250. Thus, adverse effects on the electrical characteristics of the transistor and the reliability of the transistor can be inhibited.

The insulator 284 functioning as an interlayer film is preferably provided over the insulator 282. Like the insulator 216 or the like, the insulator 284 preferably has a low permittivity. As in the insulator 224 and the like, the concentration of impurities such as water and hydrogen in the insulator 284 is preferably reduced.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the above conductor. It is preferable that an insulator having the above resistivity be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

<Constituent Materials for Semiconductor Device>

Constituent materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low dielectric constant is used for the insulator functioning as an interlayer film, the parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In addition, when a transistor using a metal oxide is surrounded by an insulator (the insulator 214, the insulator 222, the insulator 245a, the insulator 245b, the insulator 282, or the like) having a function of inhibiting the passage of oxygen and impurities such as hydrogen, the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that maintain the conductivity even when absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

<<Metal oxide>>

The oxide 230 is preferably formed using a metal oxide functioning as a semiconductor (an oxide semiconductor). A metal oxide that can be used as the oxide 230 according to the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide is described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to be released and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using energy dispersive X-ray spectroscopy (EDX) is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

<Manufacturing Method of Semiconductor Device>

Next, a manufacturing method of a semiconductor device including the transistor 200 of one embodiment of the present invention, which is illustrated in FIG. 1A to FIG. 1D, is described with reference to FIG. 5A to FIG. 13D.

FIG. 5A, FIG. 6A, FIG. 7A, FIG. 8A, FIG. 9A, FIG. 10A, FIG. 11A, FIG. 12A, and FIG. 13A are top views. FIG. 5B, FIG. 6B, FIG. 7B, FIG. 8B, FIG. 9B, FIG. 10B, FIG. 11B, FIG. 12B, and FIG. 13B, which are cross-sectional views in the channel length direction of the transistor 200, are cross-sectional views of portions indicated by the dashed-dotted line A1-A2 in FIG. 5A, FIG. 6A, FIG. 7A, FIG. 8A, FIG. 9A, FIG. 10A, FIG. 11A, FIG. 12A, and FIG. 13A, respectively. FIG. 5C, FIG. 6C, FIG. 7C, FIG. 8C, FIG. 9C, FIG.

Figure 11A:
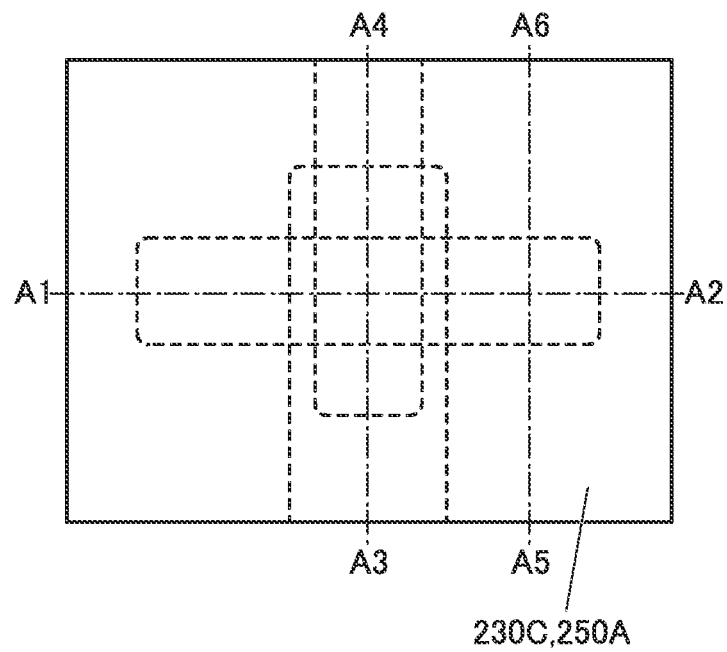
FIG. 11A is a top view illustrating a manufacturing method of a semiconductor device of one embodiment of the present invention.
Figure 11C:
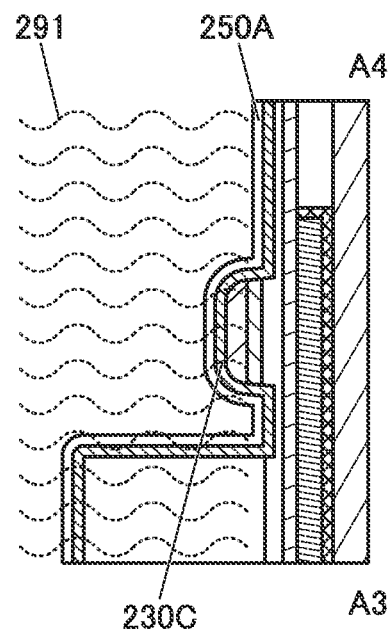
FIG. 11B to FIG. 11D are cross-sectional views illustrating a manufacturing method of a semiconductor device of one embodiment of the present invention.
Figure 11D:
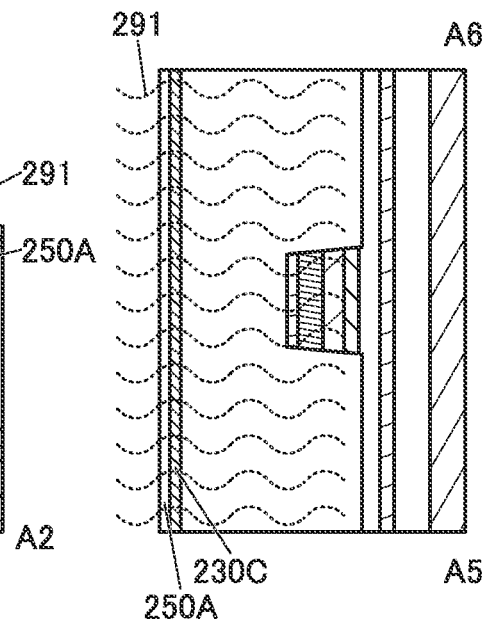
Figure 12A:
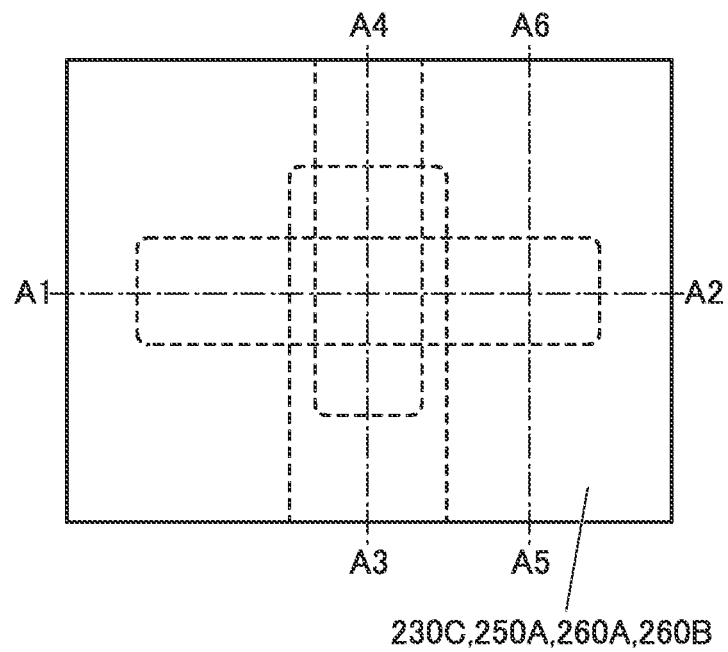
FIG. 12A is a top view illustrating a manufacturing method of a semiconductor device of one embodiment of the present invention.
Figure 12C:
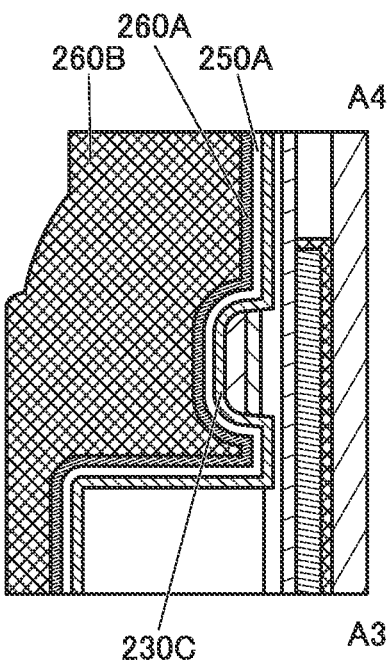
FIG. 12B to FIG. 12D are cross-sectional views illustrating a manufacturing method of a semiconductor device of one embodiment of the present invention.
Figure 12B:
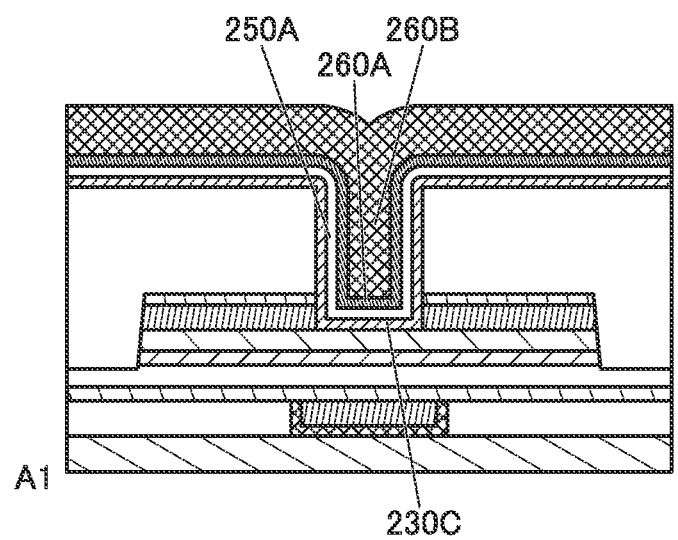
Figure 12D:
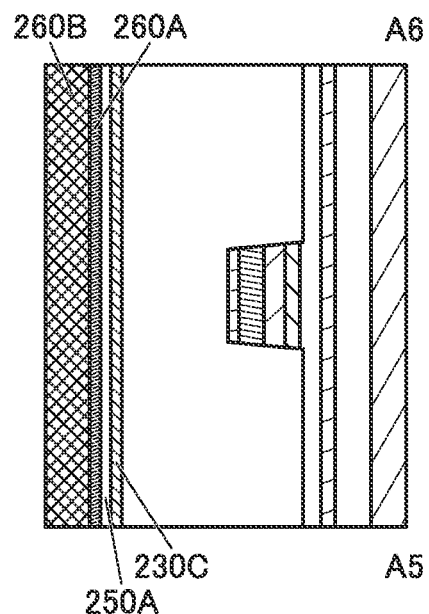
Figure 13A:
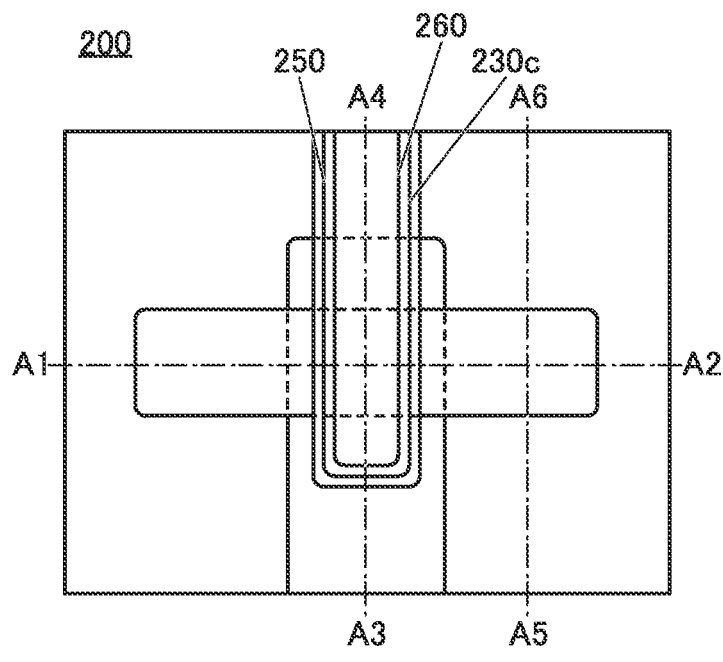
FIG. 13A is a top view illustrating a manufacturing method of a semiconductor device of one embodiment of the present invention.
Figure 13C:
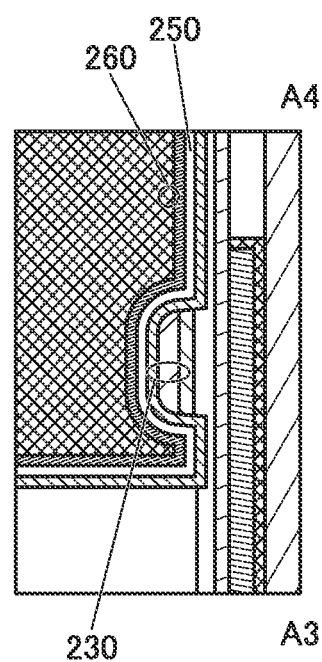
FIG. 13B to FIG. 13D are cross-sectional views illustrating a manufacturing method of a semiconductor device of one embodiment of the present invention.

10C, FIG. 11C, FIG. 12C, and FIG. 13C, which are cross-sectional views in the channel width direction of the transistor 200, are cross-sectional views of portions indicated by the dashed-dotted line A3-A4 in FIG. 5A, FIG. 6A, FIG. 7A, FIG. 8A, FIG. 9A, FIG. 10A, FIG. 11A, FIG. 12A, and FIG. 13A, respectively. FIG. 5D, FIG. 6D, FIG. 7D, FIG. 8D, FIG. 9D, FIG. 10D, FIG. 11D, FIG. 12D, and FIG. 13D, which are cross-sectional views in the channel width direction of the transistor 200, are cross-sectional views of portions indicated by the dashed-dotted line A5-A6 in FIG. 5A, FIG. 6A, FIG. 7A, FIG. 8A, FIG. 9A, FIG. 10A, FIG. 11A, FIG. 12A, and FIG. 13A, respectively. Note that for clarity of the drawing, some components are not illustrated in the top views of FIG. 5A, FIG. 6A, FIG. 7A, FIG. 8A, FIG. 9A, FIG. 10A, FIG. 11A, FIG. 12A, and FIG. 13A.

First, a substrate (not shown) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method does not use plasma and thus causes no plasma damage to an object. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (Plasma Enhanced ALD) method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles released from a target or the like are deposited, a CVD method and an ALD method are deposition methods in which a film is formed by reaction at a surface of an object to be processed. Thus, the CVD method and the ALD method are deposition methods that are less likely to be influenced by the shape of the object to be processed and thus enable good step coverage. In particular, the ALD method enables good step coverage and high thickness uniformity and thus is suitable for covering a surface of an opening portion with a high aspect ratio, for example. Note that the ALD method has a relatively low deposition rate, and thus is preferably used the in combination with another deposition method with a high deposition rate, such as the CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 214, silicon nitride is deposited by a sputtering method. In addition, the insulator 214 may have a multilayer structure.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxynitride is deposited by a CVD method.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the first conductor of the conductor 205 is deposited. The conductive film preferably includes a conductor that has a function of inhibiting transmission of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, as the conductive film to be the first conductor of the conductor 205, a tantalum nitride film or a film in which titanium nitride is stacked over tantalum nitride is formed by a sputtering method. With the use of such a metal nitride for the first conductor of the conductor 205, even when a metal that easily diffuses, such as copper, is used for the second conductor of the conductor 205 described later, the metal can be prevented from diffusing outward through the first conductor of the conductor 205.

Next, a conductive film to be the second conductor of the conductor 205 is deposited over the conductive film to be the first conductor of the conductor 205. The conductive film can be deposited by a plating method, a sputtering method, a CVD method, an MBE method, a PLD method, an ALD method, or the like. In this embodiment, a tungsten film is deposited for the conductive film.

Next, CMP (Chemical Mechanical Polishing) treatment is performed to partly remove the conductive film to be the first conductor of the conductor 205 and the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 5A to FIG. 5C).

Note that after the conductor 205 is formed, part of the second conductor of the conductor 205 may be removed, a groove may be formed in the second conductor of the conductor 205, a conductive film may be deposited over the conductor 205 and the insulator 216 so as to fill the groove, and CMP treatment may be performed. By the CMP treatment, part of the conductive film is removed to expose the insulator 216. Note that part of the second conductor of the conductor 205 is preferably removed by a dry etching method or the like.

Through the above steps, the conductor 205 including the conductive film, which has a flat top surface, can be formed. The improvement in planarity of the top surfaces of the insulator 216 and the conductor 205 can improve crystallinity of the oxide 230a, the oxide 230b, and the oxide 230c. Note that the conductive film is preferably formed using a material similar to that for the first conductor of the conductor 205 or the second conductor of the conductor 205.

Here, a method for forming the conductor 205 which is different from the above is described below.

A conductive film to be the conductor 205 is deposited over the insulator 214. The conductive film can be deposited by a sputtering method, a CVD method, an MBE method, a PLD method, an ALD method, or the like. In addition, the conductive film can be a multilayer film. For example, a tungsten film is deposited as the conductive film.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removing the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect subsequent steps or can be utilized in the subsequent steps.

Next, an insulating film to be the insulator 216 is formed over the insulator 214 and the conductor 205. The insulating film is formed to be in contact with the top surface and side surface of the conductor 205. The insulating film can be deposited by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3.

Next, CMP treatment is performed on the insulating film to be the insulator 216, so that part of the insulating film is removed and a surface of the conductor 205 is exposed. Thus, the conductor 205 and the insulator 216 whose top surfaces are flat can be formed. The above is the different formation method of the conductor 205.

Next, the insulator 222 is deposited over the insulator 216 and the conductor 205. The insulator 222 can be deposited by a sputtering method, a CVD method, an MBE method, a PLD method, an ALD method, or the like. In this embodiment, hafnium oxide or aluminum oxide is deposited as the insulator 222 by an ALD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxynitride is deposited by a CVD method.

Here, plasma treatment containing oxygen may be performed under reduced pressure so that an excess-oxygen region can be formed in the insulator 224. For the plasma treatment with oxygen, an apparatus including a power source for generating high-density plasma using a microwave is preferably used, for example. Alternatively, a power source may be provided to apply RF to the substrate side. The use of high-density plasma enables high-density oxygen radicals to be produced, and RF application to the substrate side allows the oxygen radicals generated by the high-density plasma to be efficiently introduced into the insulator 224. Alternatively, after plasma treatment with an inert gas is performed using this apparatus, plasma treatment with oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration of the coverage with an oxide deposited later and a decrease in the yield of the semiconductor device in some cases. The deposition of aluminum oxide over the insulator 224 by a sputtering method is preferred because oxygen can be added to the insulator 224.

Figure 5A:
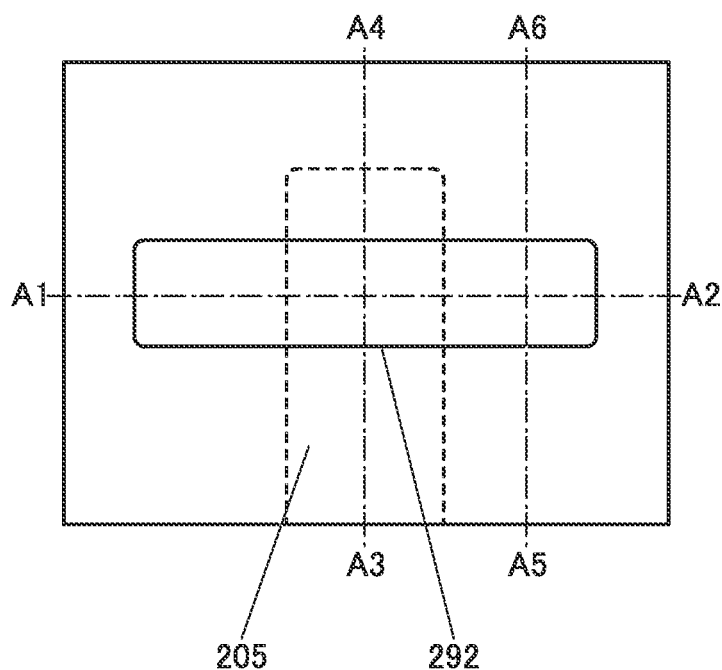
FIG. 5A is a top view illustrating a manufacturing method of a semiconductor device of one embodiment of the present invention.
Figure 5C:
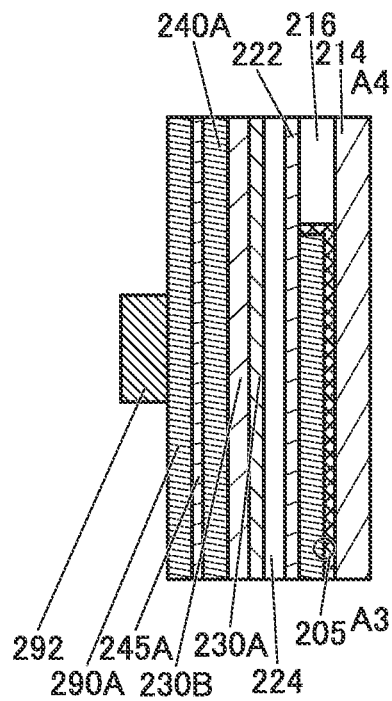
FIG. 5B to FIG. 5D are cross-sectional views illustrating a manufacturing method of a semiconductor device of one embodiment of the present invention.
Figure 5B:
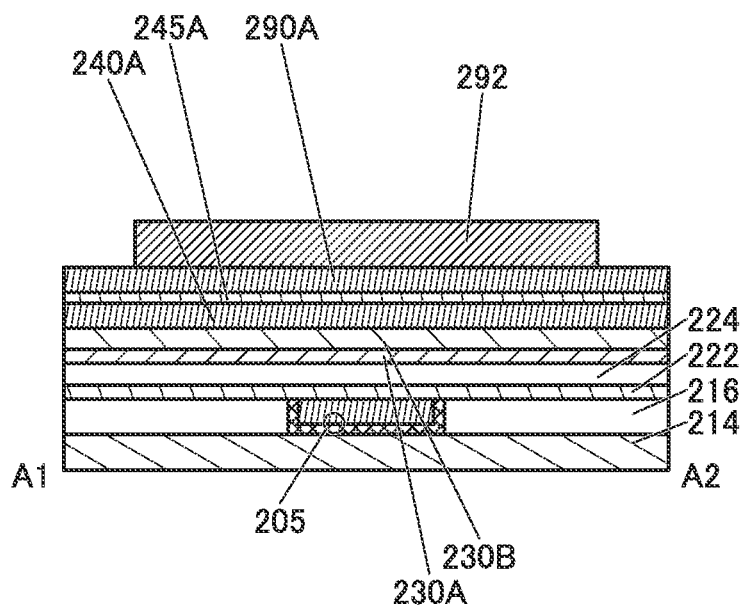
Figure 5D:
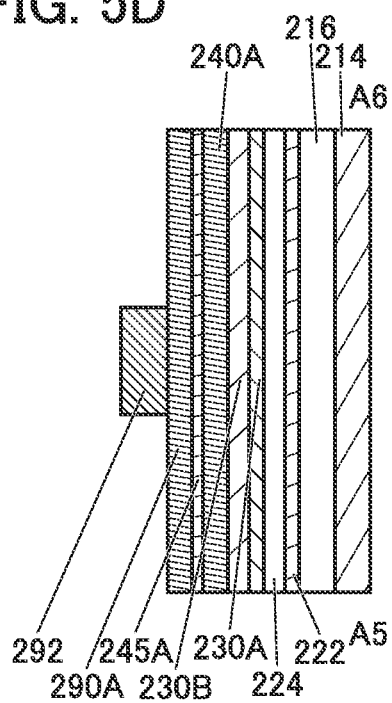
Figure 6A:
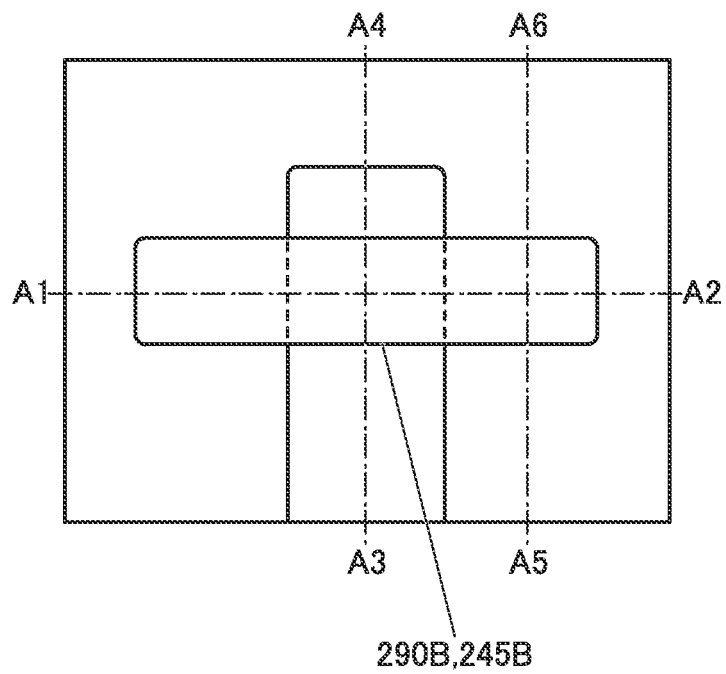
FIG. 6A is a top view illustrating a manufacturing method of a semiconductor device of one embodiment of the present invention.
Figure 6C:
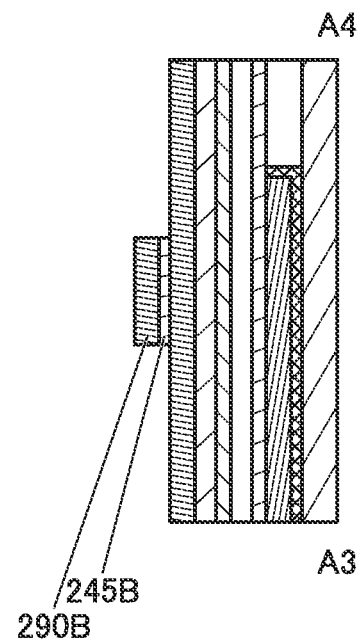
FIG. 6B to FIG. 6D are cross-sectional views illustrating a manufacturing method of a semiconductor device of one embodiment of the present invention.
Figure 6B:
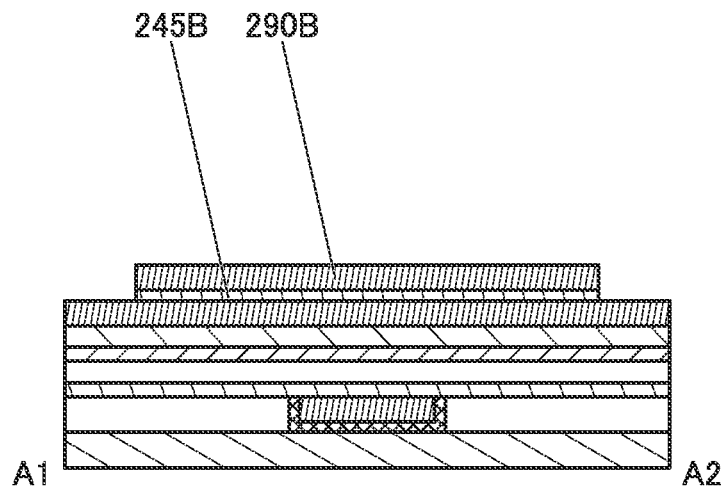
Figure 6D:
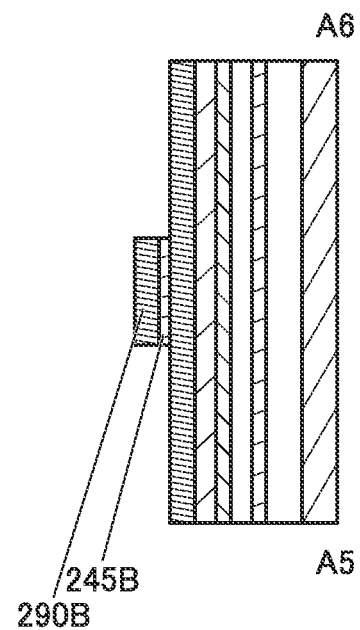
Figure 7A:
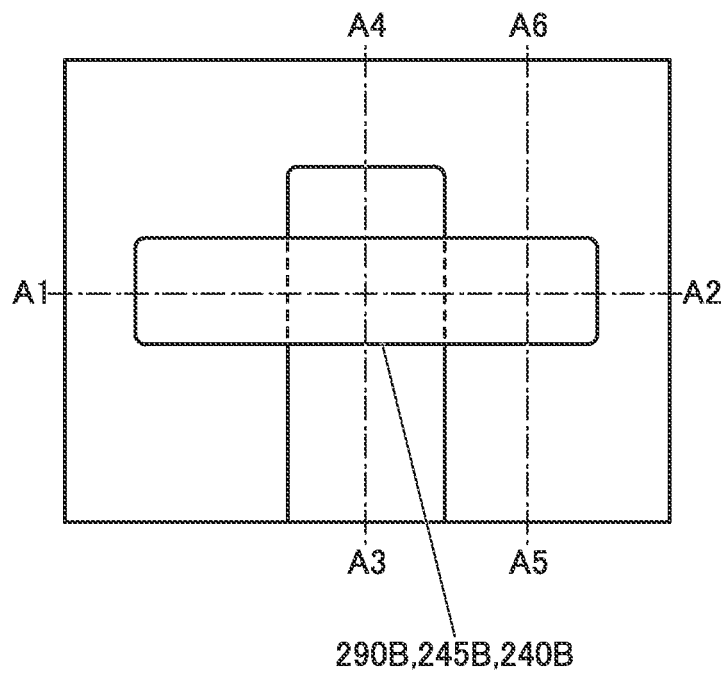
FIG. 7A is a top view illustrating a manufacturing method of a semiconductor device of one embodiment of the present invention.
Figure 7C:
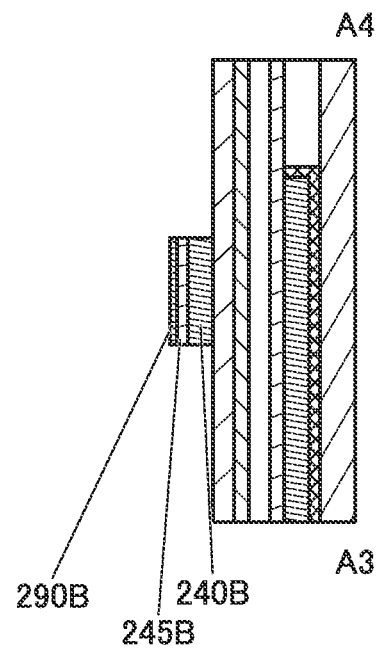
FIG. 7B to FIG. 7D are cross-sectional views illustrating a manufacturing method of a semiconductor device of one embodiment of the present invention.
Figure 7B:
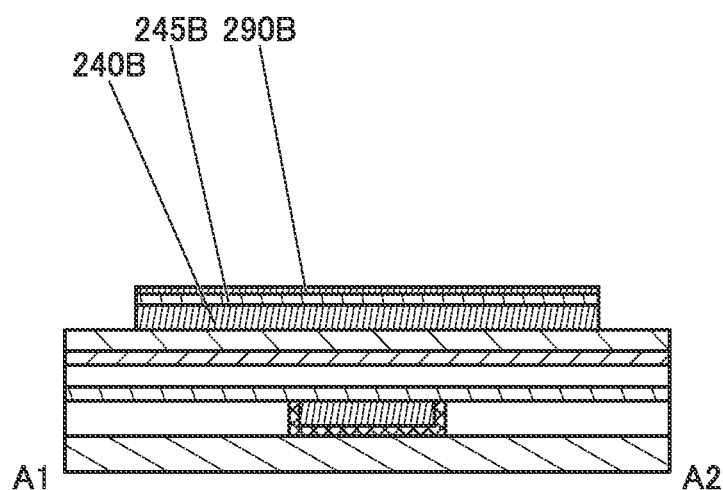
Figure 7D:
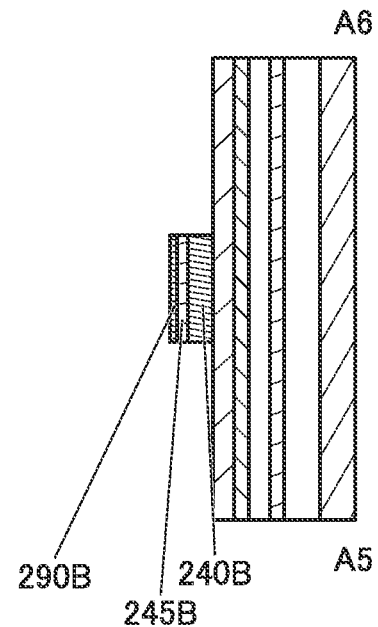

Next, an oxide film 230A and an oxide film 230B are deposited in this order over the insulator 224 (see FIG. 5B to FIG. 5D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor in which an oxygen-deficient oxide semiconductor is used for its channel formation region can have relatively high field-effect mobility. Furthermore, when the deposition is performed while the substrate is heated, the crystallinity of the oxide film can be improved.

In this embodiment, the oxide film 230A is deposited by a sputtering method using an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is formed to have characteristics required for the oxide 230 by selecting the deposition condition and the atomic ratio as appropriate.

Note that the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, the conductive film 240A is deposited over the oxide film 230B. The conductive film 240A can be deposited by a sputtering method, a CVD method, an MBE method, a PLD method, an ALD method, or the like (see FIG. 5B to FIG. 5D). Note that heat treatment may be performed before the deposition of the conductive film 240A. This heat treatment may be performed under reduced pressure, and the conductive film 240A may be successively deposited without exposure to the air. The treatment can remove moisture and hydrogen adsorbed onto the surface of the oxide film 230B and the like, and further can reduce the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

Next, an insulating film 245A functioning as a barrier layer is formed (see FIG. 5B to FIG. 5D).

As the insulating film 245A, an aluminum oxide film is formed by an ALD method, for example. With the use of an ALD method, a dense film with a smaller number of defects such as cracks and pinholes or with a uniform thickness can be formed.

Next, a film 290A to be a hard mask is formed over the insulating film 245A (see FIG. 5B to FIG. 5D). As the film 290A to be a hard mask, a tungsten film or a tantalum nitride film is preferably formed by a sputtering method, for example.

Next, a resist mask 292 is formed over the film 290A to be a hard mask by a photolithography method (see FIG. 5A to FIG. 5D). Part of the film 290A to be a hard mask and part of the insulating film 245A are selectively removed using the resist mask 292 to form a hard mask 290B and an insulating layer 245B (see FIG. 6A to FIG. 6D).

Next, part of the conductive film 240A is selectively removed using the hard mask 290B and the insulating layer 245B to form an island-shaped conductive layer 240B (see FIG. 7A to FIG. 7D). Note that part or all of the hard mask 290B may be removed at this time.

Subsequently, part of the oxide film 230A and part of the oxide film 230B are selectively removed using the island-shaped conductive layer 240B, the insulating layer 245B, and the hard mask 290B as masks. In this step, part of the insulator 224 is concurrently removed in some cases. After that, the hard mask 290B is removed, so that a stacked-layer structure of the island-shaped oxide 230a, the island-shaped oxide 230b, the island-shaped conductive layer 240B, and the island-shaped insulating layer 245B is formed (see FIG. 8A to FIG. 8D).

Here, it is preferable that the side surfaces of the oxide 230b and the conductive layer 240B be substantially perpendicular to a top surface of the insulator 224. Specifically, the angle θ shown in FIG. 1D is preferably greater than or equal to 60 degrees and less than or equal to 95 degrees, further preferably greater than or equal to 88 degrees and less than or equal to 92 degrees. When the side surfaces of the oxide 230b and the conductive layer 240B are substantially perpendicular to the top surface of the insulator 224, a plurality of transistors 200 can be provided in a smaller area and at a higher density. With the conductive layer 240B having the above shape, a contact area to a wiring layer to be formed can be increased. Thus, an increase in contact resistance between the conductive layer 240B and the wiring layer can be inhibited.

Furthermore, the processing of the conductive film 240A using the hard mask 290B in this step can inhibit formation of etching that is unnecessary for the shape of the conductor 240a and the conductor 240b (also referred to as CD loss).

For example, in the case where a resist mask is used, the mask is side-etched in etching to expose the surface of an end portion of an object to be processed, and the corner is sometimes rounded. In the case where the defect is large in the conductor 240a and the conductor 240b, the volume of each of the conductor 240a and the conductor 240b is sometimes decreased compared to the designed value, so that the on-state current becomes small in some cases.

Thus, when a material that has high selectivity of the etching rate to the hard mask is used as the object to be processed, the shape of the hard mask is maintained in etching and thus the defect in shape of the object to be processed can be inhibited. Specifically, the following material is preferably used as the mask: in the case where the etching rate of the material used for the hard mask is 1, the etching rate of the object to be processed is greater than or equal to 5, preferably greater than or equal to 10.

Next, an insulating film to be the insulator 280 is deposited over the stacked-layer structure of the island-shaped oxide 230a, the island-shaped oxide 230b, the island-shaped conductive layer 240B, and the island-shaped insulating layer 245B. The insulating film can be deposited by a sputtering method, a CVD method, an MBE method, a PLD method, an ALD method, or the like. In this embodiment, as the insulating film, a silicon oxide film is formed by a CVD method or a sputtering method. The heat treatment may be performed before the insulating film is deposited. The heat treatment may be performed under reduced pressure, and the insulating films may be successively formed without exposure to the air. The treatment can remove moisture and hydrogen adsorbed onto the surface of the insulator 224 and the like, and further can reduce the moisture concentration and the hydrogen concentration of the oxide 230a, the oxide 230b, and the insulator 224. The conditions for the above-described heat treatment can be used.

The insulating film to be the insulator 280 may have a multilayer structure. The insulating film to be the insulator 280 may have a structure in which a silicon oxide film is deposited by a sputtering method and another silicon oxide film is deposited the silicon oxide film by a CVD method, for example.

Figure 8A:
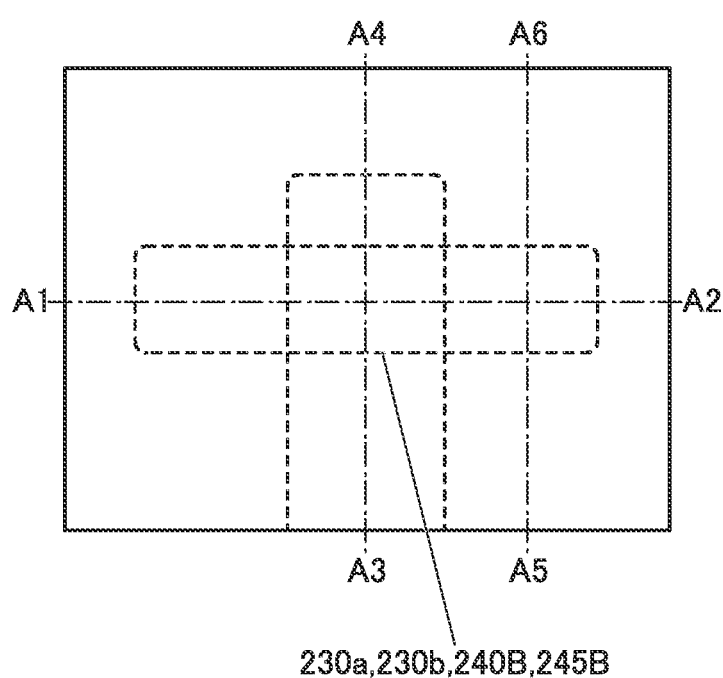
FIG. 8A is a top view illustrating a manufacturing method of a semiconductor device of one embodiment of the present invention.
Figure 8C:
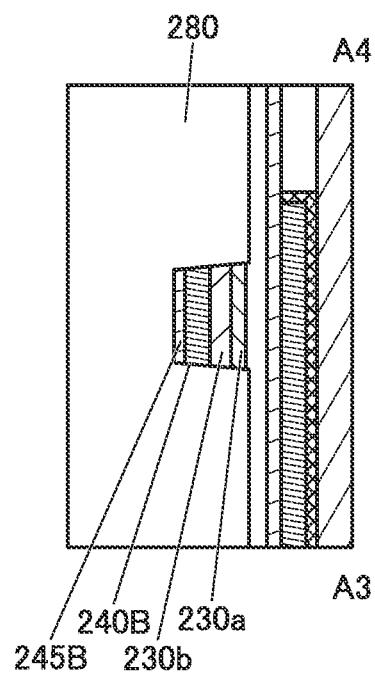
FIG. 8B to FIG. 8D are cross-sectional views illustrating a manufacturing method of a semiconductor device of one embodiment of the present invention.
Figure 8B:
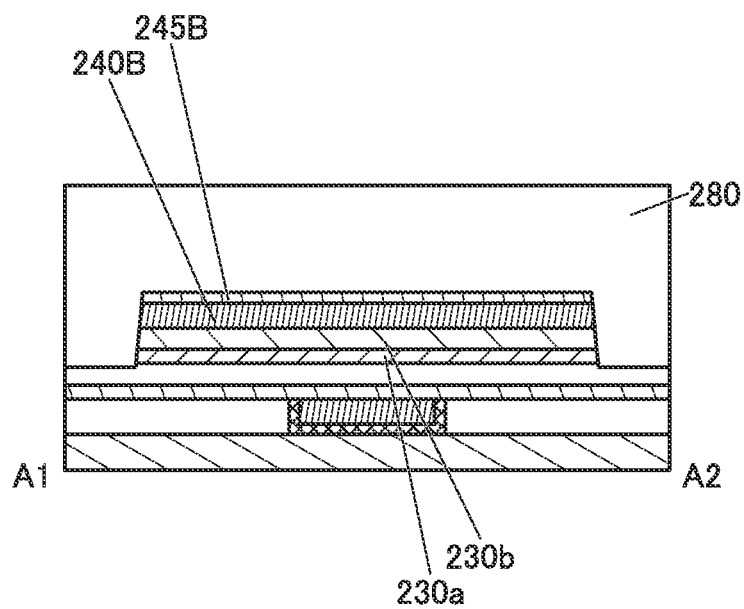
Figure 8D:
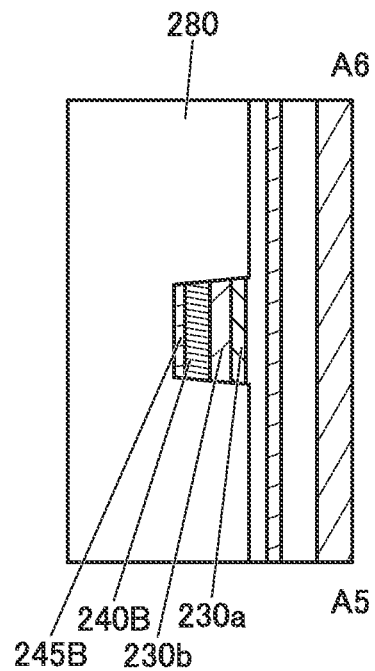
Figure 9A:
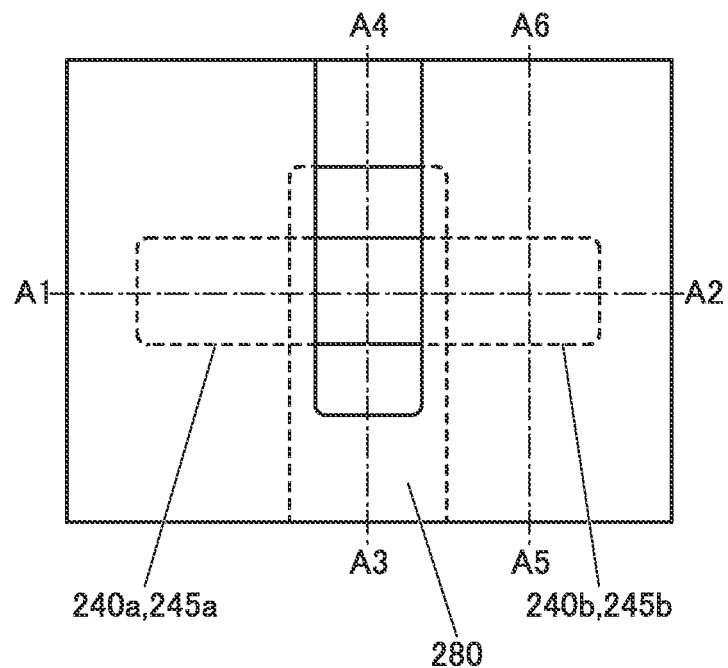
FIG. 9A is a top view illustrating a manufacturing method of a semiconductor device of one embodiment of the present invention.
Figure 9C:
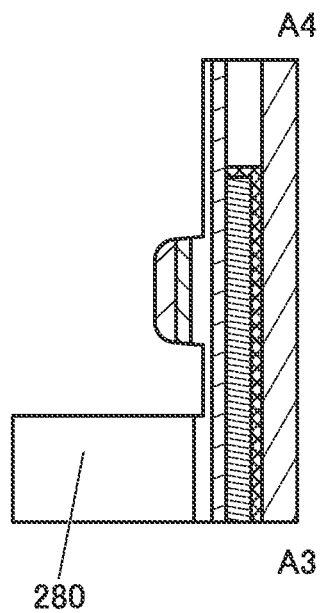
FIG. 9B to FIG. 9D are cross-sectional views illustrating a manufacturing method of a semiconductor device of one embodiment of the present invention.
Figure 9B:
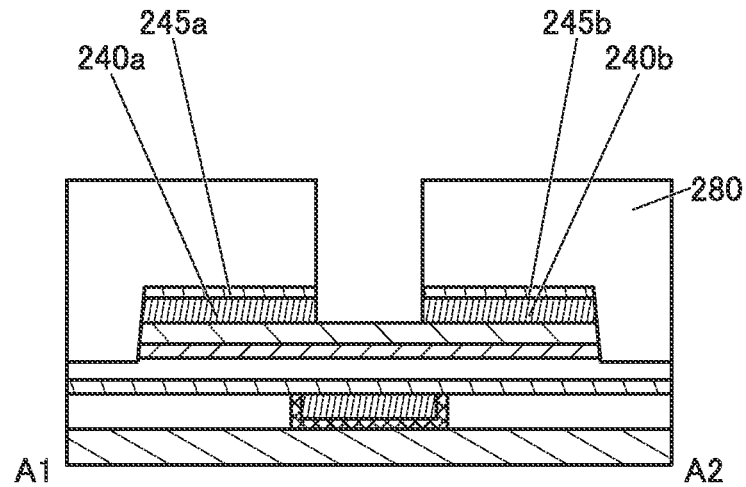
Figure 9D:
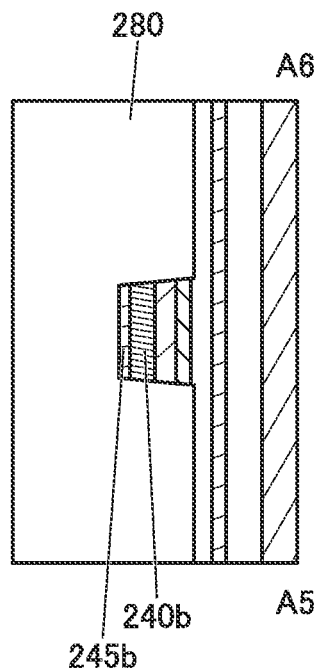
Figure 10A:
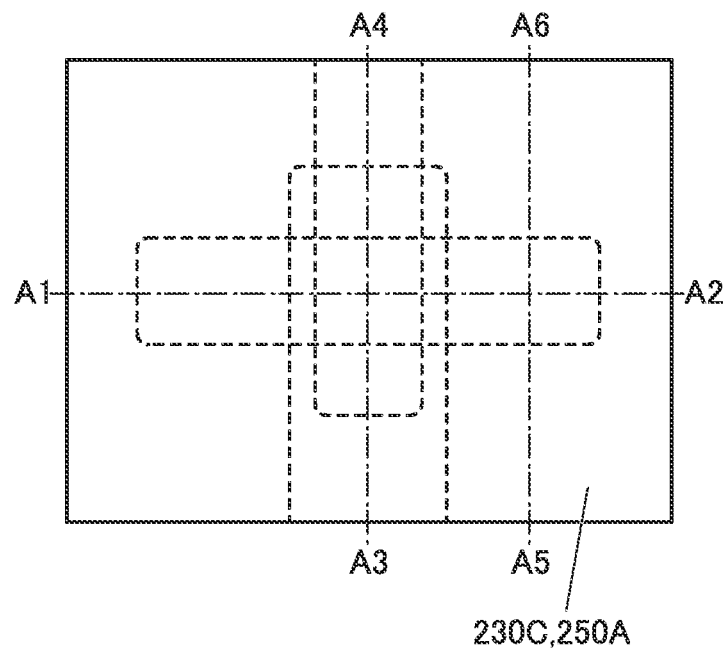
FIG. 10A is a top view illustrating a manufacturing method of a semiconductor device of one embodiment of the present invention.
Figure 10C:
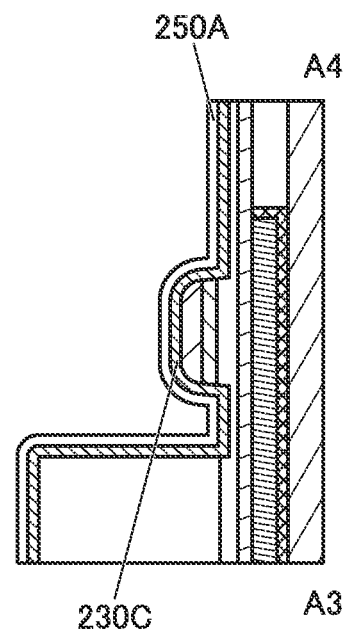
FIG. 10B to FIG. 10D are cross-sectional views illustrating a manufacturing method of a semiconductor device of one embodiment of the present invention.
Figure 10B:
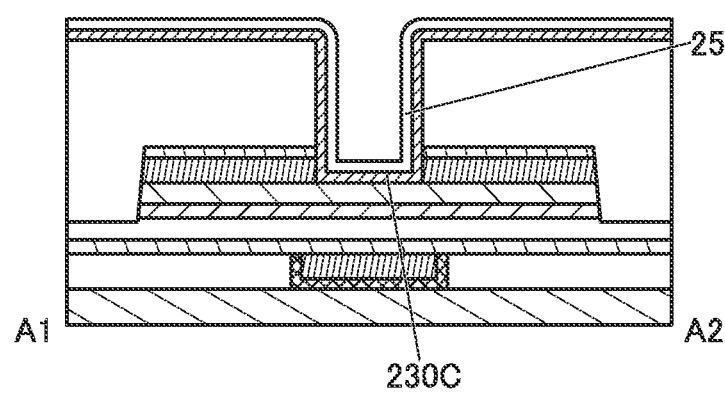
Figure 10D:
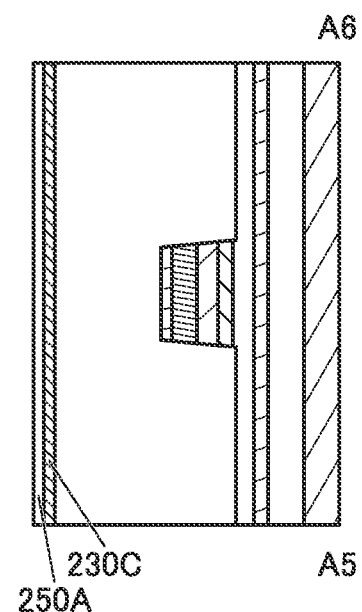

Next, the insulating film to be the insulator 280 is subjected to CMP treatment, so that the insulator 280 having a flat top surface is formed (see FIG. 8B to FIG. 8D).

Then, part of the insulator 280, part of the insulating layer 245B, and part of the conductive layer 240B are processed to form an opening reaching the oxide 230b. The opening is preferably formed to overlap with the conductor 205. The conductor 240a, the conductor 240b, the insulator 245a, and the insulator 245b are formed by forming the opening. At this time, the thickness of the oxide 230b in a region overlapping with the opening may be reduced (see FIG. 9A to FIG. 9C).

Part of the insulator 280, part of the insulating layer 245B, and part of the conductive layer 240B may be processed under different conditions. For example, part of the insulator 280 may be processed by a dry etching method, part of the insulating layer 245B may be processed by a wet etching method, and part of the conductive layer 240B may be processed by a dry etching method.

Here, it is preferable to remove impurities that are attached onto the surfaces of the oxide 230a, the oxide 230b, and the like or diffused into the oxide 230a, the oxide 230b, and the like. The impurities result from components contained in the insulator 280, the insulating layer 245B, and the conductive layer 240B; components contained in a member used in an apparatus used to form the opening; and components contained in a gas or a liquid used for etching, for instance. Examples of the impurities include aluminum, silicon, tantalum, fluorine, and chlorine.

In order to remove the above impurities and the like, cleaning treatment may be performed. Examples of the cleaning method include wet cleaning using a cleaning solution and the like, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Next, heat treatment may be performed. The heat treatment is preferably performed in an oxygen-containing atmosphere. Furthermore, the heat treatment may be performed under reduced pressure, and an oxide film 230C may be successively deposited without exposure to the air (see FIG. 10A to FIG. 10D). The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be deposited by a sputtering method, a CVD method, an MBE method, a PLD method, an ALD method, or the like. The oxide film 230C is deposited by a method similar to that for the oxide film 230A or the oxide film 230B in accordance with characteristics required for the oxide 230c. In this embodiment, the oxide film 230C is deposited by a sputtering method using an In—Ga—Zn oxide target with In:Ga:Zn=1:3:4 [atomic ratio] or In:Ga:Zn=4:2:4.1 [atomic ratio]. Alternatively, the oxide film 230C is formed by a sputtering method in the following manner: a film is deposited using an In—Ga—Zn oxide target with In:Ga:Zn=4:2:4.1 [atomic ratio], and another film is deposited thereover using an In—Ga—Zn oxide target with In:Ga:Zn=1:3:4 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is preferably higher than or equal to 70%, further preferably higher than or equal to 80%, still further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration in the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like (see FIG. 10A to FIG. 10D). In this embodiment, for the insulating film 250A, a silicon oxynitride film is deposited by a CVD method. Note that the deposition temperature at the time of the deposition of the insulating film 250A is preferably higher than or equal to 350° C. to lower than 450° C., particularly preferably approximately 400° C. When the insulating film 250A is deposited at 400° C., an insulating film having few impurities can be deposited.

Figure 11B:
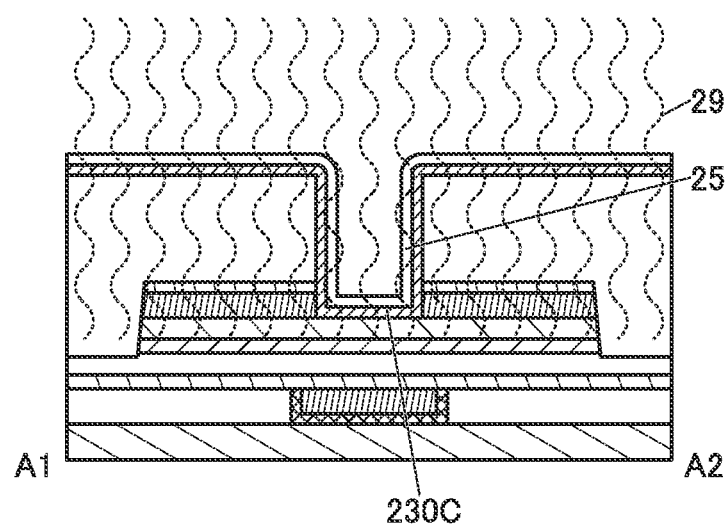

Here, after the deposition of the insulating film 250A, microwave treatment may be performed in an atmosphere containing oxygen under reduced pressure (see FIG. 11B to FIG. 11D). By performing the microwave treatment, an electric field by a microwave 291 is applied to the insulating film 250A, the oxide 230a, the oxide 230b, and the oxide film 230C, so that VoH in the oxide 230a, the oxide 230b, and the oxide film 230C can be divided into Vo and hydrogen. Some hydrogen divided at this time is bonded to oxygen and is removed as $H_2O$ from the insulating film 250A, the oxide 230a, the oxide 230b, and the oxide film 230C in some cases. Some hydrogen is gettered by the conductor 240a and the conductor 240b in some cases. Performing the microwave treatment in such a manner can reduce the hydrogen concentration in the insulating film 250A, the oxide 230a, the oxide 230b, and the oxide film 230C. Furthermore, oxygen is supplied to Vo that can exist after VoH in the oxide 230a, the oxide 230b, and the oxide film 230C is divided into Vo and hydrogen, so that Vo can be repaired or filled.

After the microwave treatment, heat treatment may be performed with the reduced pressure being maintained. Such treatment enables hydrogen in the insulating film 250A, the oxide 230a, the oxide 230b, and the oxide film 230C to be removed efficiently. Some hydrogen may be gettered by the conductor 240a and the conductor 240b. It is possible to repeat the step of performing heat treatment with the reduced pressure being maintained after the microwave treatment. The repetition of the heat treatment enables hydrogen in the insulating film 250A, the oxide 230a, the oxide 230b, and the oxide film 230C to be removed more efficiently. Note that the temperature of the heat treatment is preferably higher than or equal to 300° C. and lower than or equal to 500° C.

Furthermore, microwave-excited plasma treatment improves the film quality of the insulating film 250A, whereby diffusion of hydrogen, water, an impurity, or the like can be inhibited. Accordingly, hydrogen, water, or an impurity can be inhibited from being diffused into the oxide 230 through the insulator 250 in the following step such as deposition of a conductive film to be the conductor 260 or the following treatment such as heat treatment. Note that the structure of a microwave treatment apparatus is described later.

Next, a conductive film 260A and a conductive film 260B are deposited in this order. The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method (see FIG. 12A to 12D).

Figure 13B:
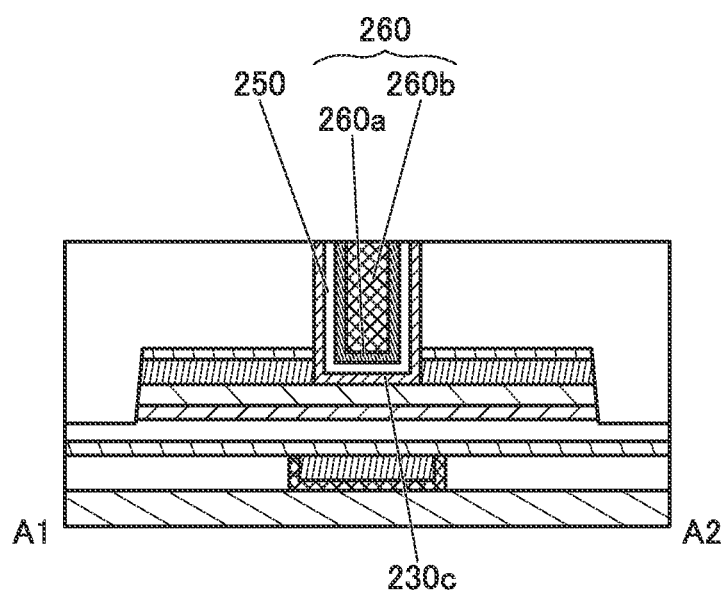
Figure 13D:
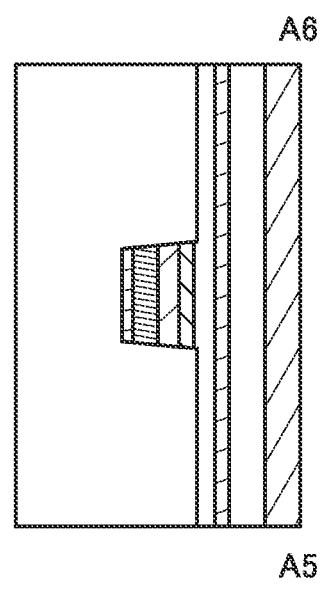

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 13A to FIG. 13C). Accordingly, the oxide 230c is positioned to cover the inner wall (the side wall and bottom surface) of the opening reaching the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration of the insulator 250 and the insulator 280.

Next, the insulator 282 is deposited over the oxide 230c, the insulator 250, the conductor 260, and the insulator 280. The insulator 282 can be deposited by a sputtering method, a CVD method, an MBE method, a PLD method, an ALD method, or the like. An aluminum oxide film or a silicon nitride film is preferably deposited as the insulator 282 by a sputtering method, for example. When an aluminum oxide film or a silicon nitride film is deposited by a sputtering method, diffusion of hydrogen contained in the insulator 284 into the oxide 230 can be inhibited. Forming the insulator 282 to be in contact with the conductor 260 is preferable, in which case oxidation of the conductor 260 can be inhibited.

When aluminum oxide is formed for the insulator 282 by a sputtering method, oxygen can be supplied to the insulator 280. Oxygen supplied to the insulator 280 is sometimes supplied to the channel formation region included in the oxide 230b through the oxide 230c. Furthermore, when oxygen is supplied to the insulator 280, oxygen that is contained in the insulator 280 before the formation of the insulator 282 may be supplied to the channel formation region included in the oxide 230b through the oxide 230c.

In addition, the insulator 282 may have a multilayer structure. For example, a structure may be employed in which an aluminum oxide film is deposited by a sputtering method and silicon nitride is deposited over the aluminum oxide film by a sputtering method.

Next, heat treatment may be performed. For the heat treatment, the conditions for the above-described heat treatment can be used. The heat treatment can reduce the moisture concentration and the hydrogen concentration of the insulator 280. Moreover, oxygen contained in the insulator 282 can be injected into the insulator 280.

Before the insulator 282 is deposited, the following steps may be performed: first, an aluminum oxide film is deposited over the insulator 280 and the like by a sputtering method, heat treatment is performed under the above heat treatment conditions, and then the aluminum oxide film is removed by CMP treatment. Through these steps, a larger number of excess-oxygen regions can be formed in the insulator 280. Note that in these steps, part of the insulator 280, part of the conductor 260, part of the insulator 250, and part of the oxide 230c are removed in some cases.

An insulator may be provided between the insulator 280 and the insulator 282. As the insulator, silicon oxide deposited by a sputtering method can be used, for example. Providing the insulator can form an excess-oxygen region in the insulator 280.

Next, the insulator 284 may be deposited over the insulator 282. The insulator 284 can be deposited by a sputtering method, a CVD method, an MBE method, a PLD method, an ALD method, or the like (see FIG. 1B to FIG. 1D).

Through the above process, the semiconductor device including the transistor 200 illustrated in FIG. 1A to FIG. 1D can be manufactured.

After the transistor 200 is formed, an opening may be formed to surround the transistor 200 and an insulator having a high barrier property against hydrogen or water may be formed to cover the opening. Surrounding the transistor 200 by the insulator having a high barrier property can prevent entry of moisture and hydrogen from the outside. Alternatively, a plurality of transistors 200 may be collectively surrounded by the insulator having a high barrier property against hydrogen or water. When an opening is formed to surround the transistor 200, for example, the formation of an opening reaching the insulator 214 or the insulator 222 and the formation of the insulator having a high barrier property in contact with the insulator 214 or the insulator 222 are suitable because these formation steps can also serve as some of the manufacturing steps of the transistor 200. The insulator having a high barrier property against hydrogen or water is formed using a material similar to that for the insulator 222, for example.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

<Modification Example of Semiconductor Device>

Examples of semiconductor devices including the transistor 200 of one embodiment of the present invention are described below with reference to FIG. 14A to FIG. 15D.

Figure 14A:
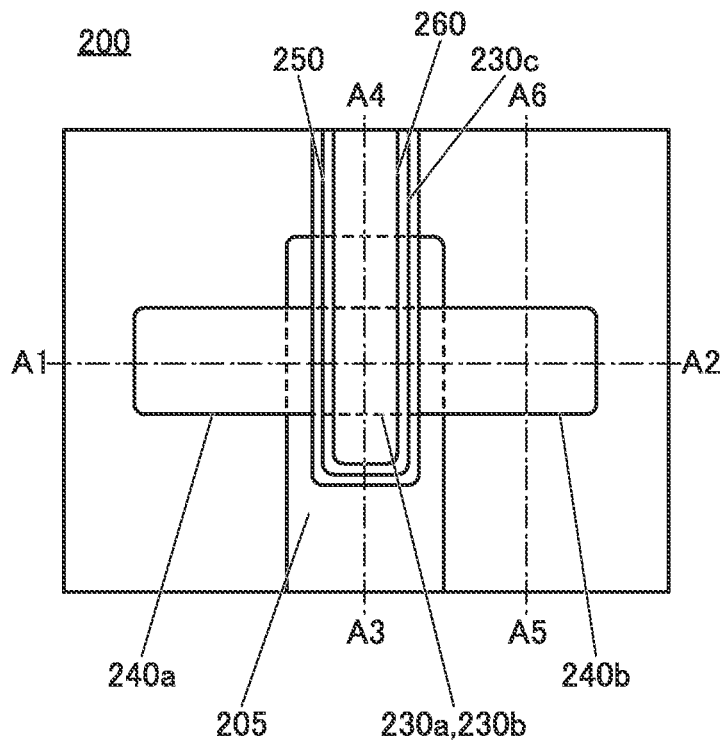
FIG. 14A is a top view illustrating a manufacturing method of a semiconductor device of one embodiment of the present invention.
Figure 14C:
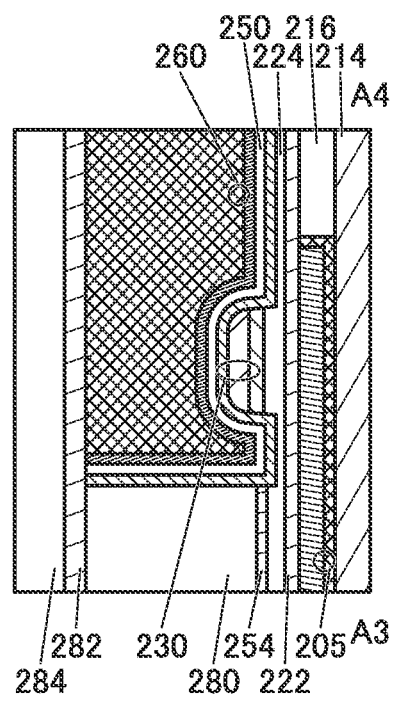
FIG. 14B to FIG. 14D are cross-sectional views illustrating a manufacturing method of a semiconductor device of one embodiment of the present invention.
Figure 14B:
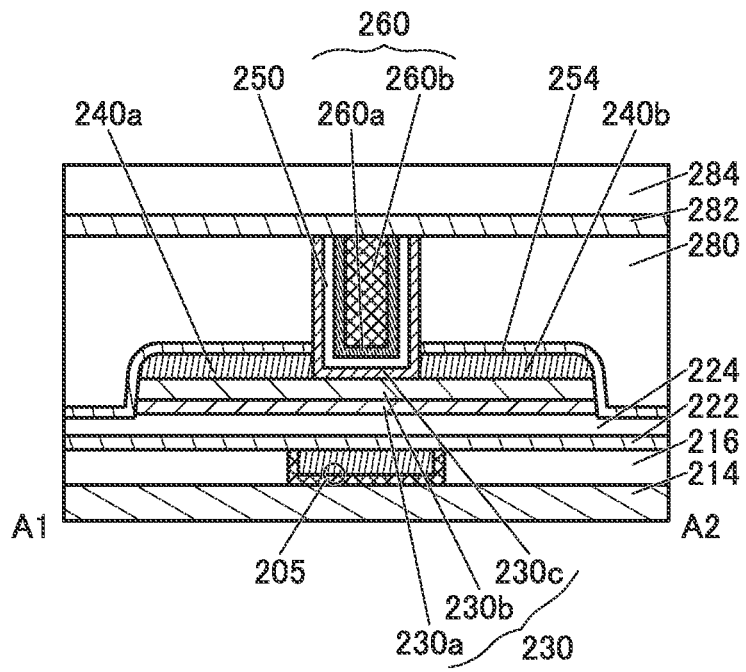
Figure 14D:
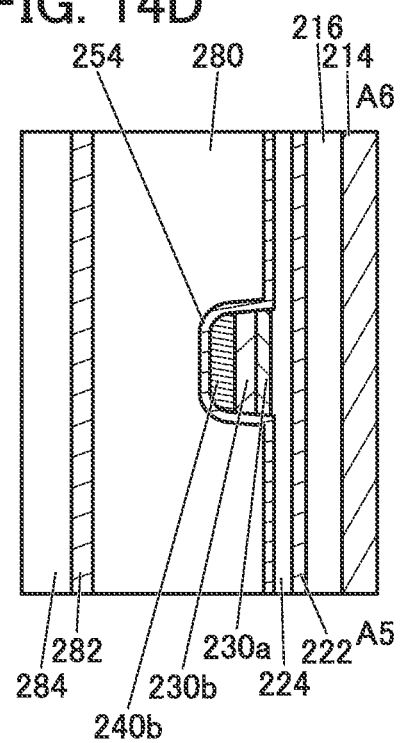
Figure 15A:
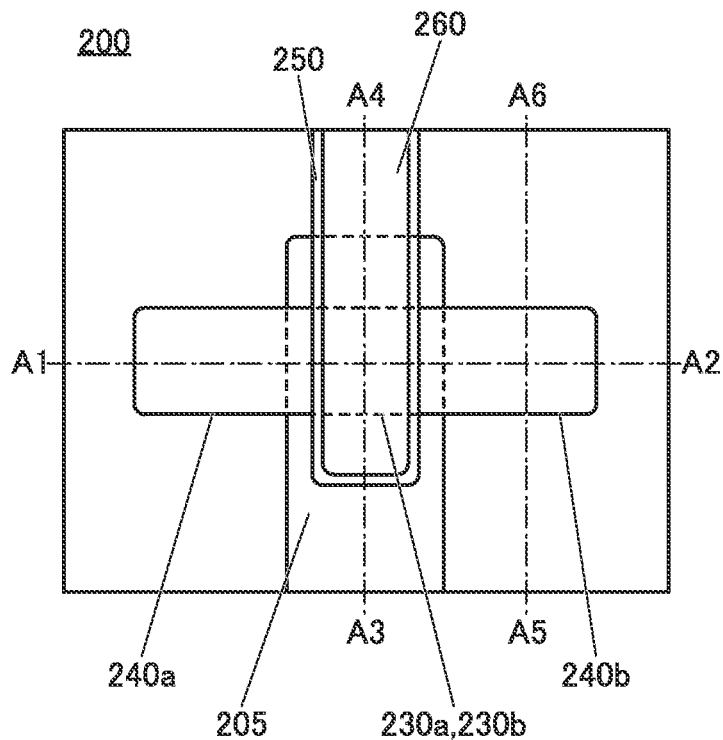
FIG. 15A is a top view illustrating a manufacturing method of a semiconductor device of one embodiment of the present invention.
Figure 15C:
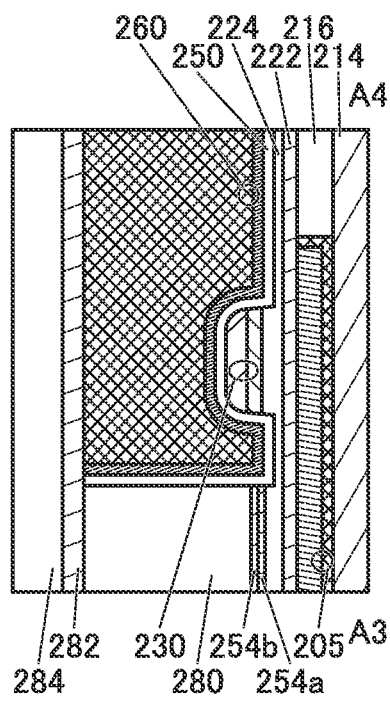
FIG. 15B to FIG. 15D are cross-sectional views illustrating a manufacturing method of a semiconductor device of one embodiment of the present invention.
Figure 15B:
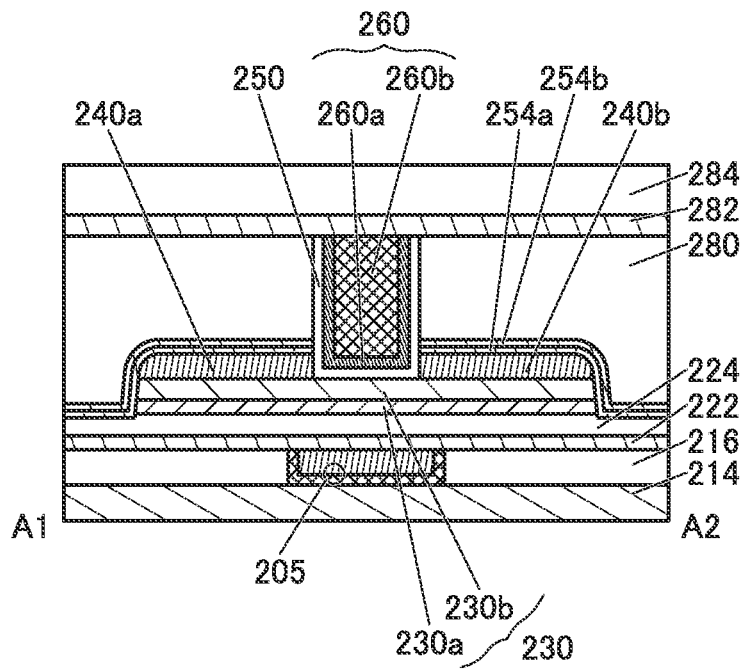
Figure 15D:
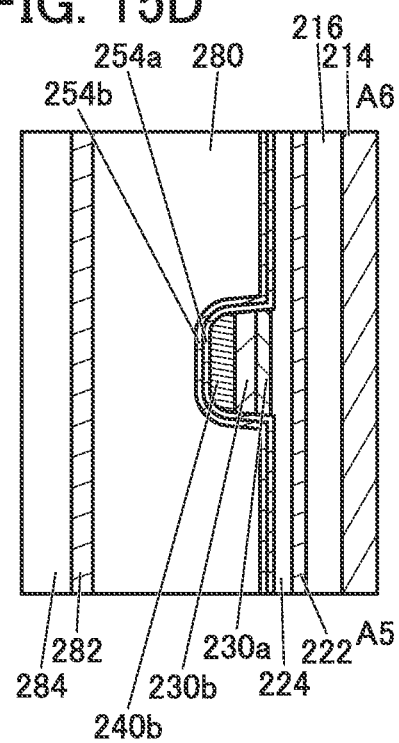

Here, FIG. 14A and FIG. 15A are top views. FIG. 14B and FIG. 15B are cross-sectional views of portions indicated by the dashed-dotted line A1-A2 in FIG. 14A and FIG. 15A, respectively. FIG. 14C and FIG. 15C are cross-sectional views of portions indicated by the dashed-dotted line A3-A4 in FIG. 14A and FIG. 15A, respectively. FIG. 14D and FIG. 15D are cross-sectional views of portions indicated by the dashed-dotted line A5-A6 in FIG. 14A and FIG. 15A, respectively. Note that for clarity of the drawing, some components are not illustrated in the top views of FIG. 14A and FIG. 15A.

Note that in the semiconductor devices illustrated in FIG. 14A to FIG. 15D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

[Modification Example 1 of Semiconductor Device]

The semiconductor device illustrated in FIG. 14A to FIG. 14D differs from the semiconductor device illustrated in FIG. 1A to FIG. 1D in that the insulator 245a and the insulator 245b are not provided, the insulator 254 is provided in contact with the top surface and the side surface of the conductor 240a, the top surface and the side surface of the conductor 240b, the side surface of the oxide 230b, the side surface of the oxide 230a, and the top surface of the insulator 224.

The insulator 254 preferably has a function of inhibiting diffusion of one or both of hydrogen and oxygen. For example, the insulator 254 preferably has a function of further inhibiting diffusion of one or both of hydrogen and oxygen as compared to the insulator 224 and the insulator 280. Thus, diffusion of hydrogen contained in the insulator 280 into the oxide 230a and the oxide 230b can be inhibited. Furthermore, by surrounding the insulator 224, the oxide 230, and the like with the insulator 254, diffusion of impurities such as water and hydrogen into the insulator 224 and the oxide 230 from the outside can be inhibited. Consequently, the transistor 200 can have favorable electrical characteristics and reliability.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region into the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited by an ALD method. An ALD method is a deposition method providing good coverage, and thus can prevent formation of disconnection or the like due to unevenness of the insulator 254.

An insulator containing aluminum nitride may be used for the insulator 254, for example. Accordingly, a film having an excellent insulating property and high thermal conductivity can be obtained, and thus dissipation of heat generated in driving the transistor 200 can be increased. Alternatively, silicon nitride, silicon nitride oxide, or the like can be used.

Alternatively, an oxide containing gallium may be used for the insulator 254, for example. An oxide containing gallium is preferable because it sometimes has a function of inhibiting diffusion of one or both of hydrogen and oxygen. Note that gallium oxide, gallium zinc oxide, indium gallium zinc oxide, or the like can be used as an oxide containing gallium. Note that when indium gallium zinc oxide is used for the insulator 254, the atomic ratio of gallium to indium is preferably large. When the atomic ratio is increased, the insulating property of the oxide can be high.

[Modification Example 2 of Semiconductor Device]

The semiconductor device illustrated in FIG. 15A to FIG. 15D differs from the semiconductor device illustrated in FIG. 14A to FIG. 14D in that the oxide 230c is not provided and the insulator 254 has a stacked-layer structure of the insulator 254a and the insulator 254b.

When the insulator 254 has a stacked-layer structure of two layers, the insulator 254a and the insulator 254b can be formed by any of the above methods; the insulator 254a and the insulator 254b may be formed by the same method or different methods. For example, the insulator 254a may be deposited by a sputtering method in an oxygen-containing atmosphere and then the insulator 254b may be deposited by an ALD method. An ALD method is a deposition method providing good coverage, and thus can prevent formation of disconnection or the like due to unevenness of the first layer.

Furthermore, the above-described materials can be used for the insulator 254a and the insulator 254b, and the same material or different materials may be used for the insulator 254a and the insulator 254b. For example, a stacked-layer structure of silicon oxide, silicon oxynitride, silicon nitride oxide, or silicon nitride and an insulator having a function of inhibiting passage of oxygen and impurities such as hydrogen may be employed. As the insulator having a function of inhibiting passage of oxygen and impurities such as hydrogen, an insulator containing an oxide of one or both of aluminum and hafnium can be used, for example.

According to the above, a semiconductor device with high reliability can be provided. Alternatively, a semiconductor device having favorable electrical characteristics can be provided. Alternatively, a semiconductor device that can be miniaturized or highly integrated can be provided. Alternatively, a semiconductor device with low power consumption can be provided.

<Microwave Treatment Apparatus>

A microwave treatment apparatus of one embodiment of the present invention is described below.

Figure 17:
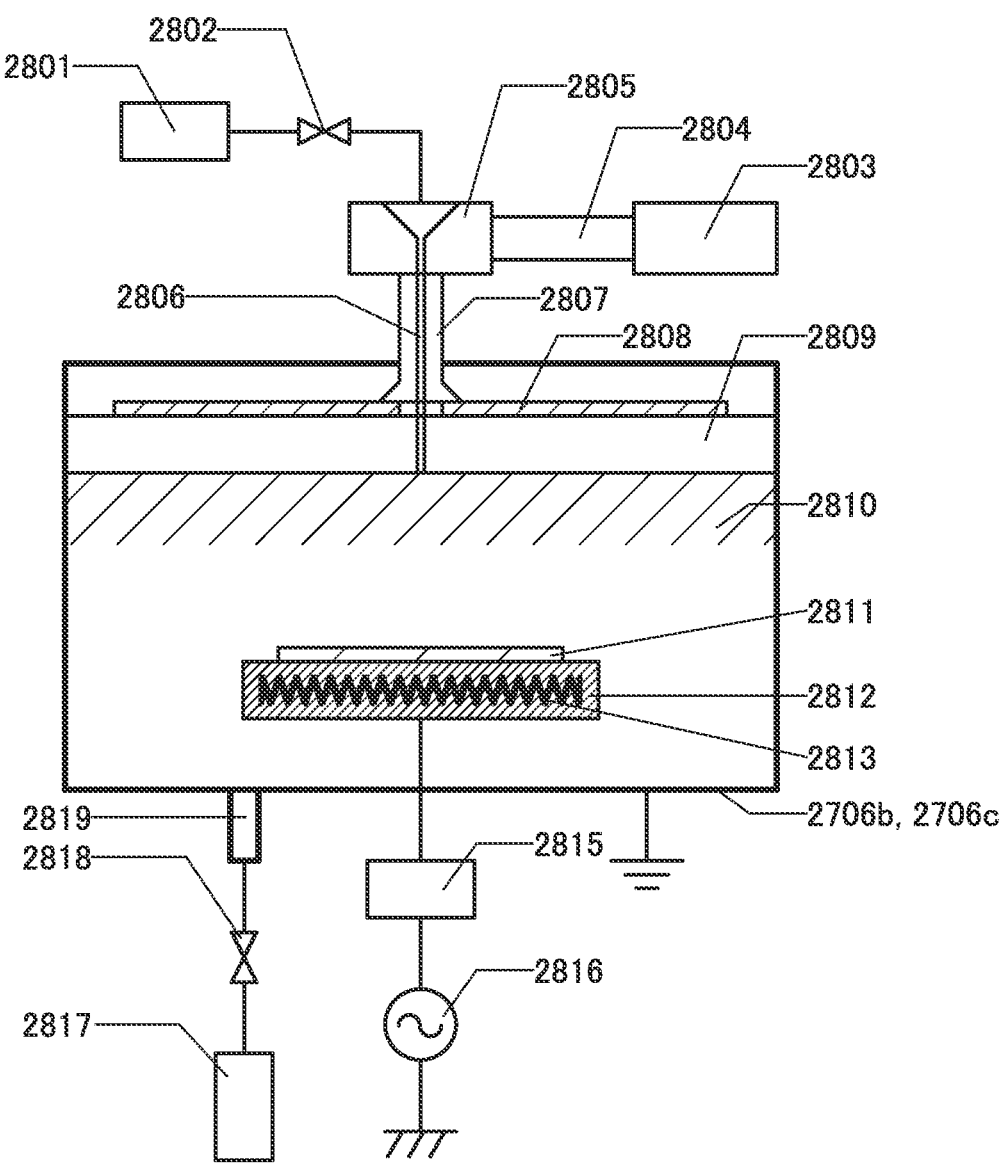
FIG. 17 is a cross-sectional view illustrating a microwave treatment apparatus of one embodiment of the present invention.
Figure 18:
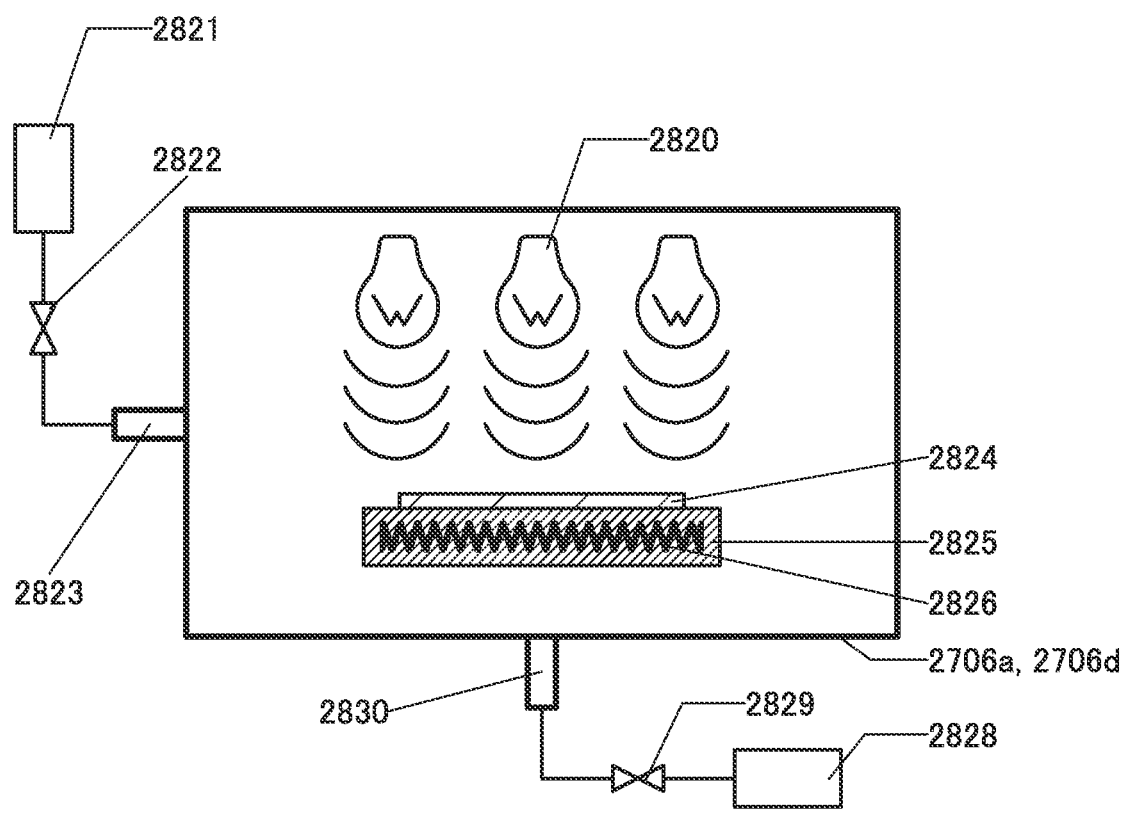
FIG. 18 is a cross-sectional view illustrating a microwave treatment apparatus of one embodiment of the present invention.

First, a structure of a manufacturing apparatus that allows entry of few impurities in manufacturing a semiconductor device or the like is described with reference to FIG. 16 to FIG. 18.

Figure 16:
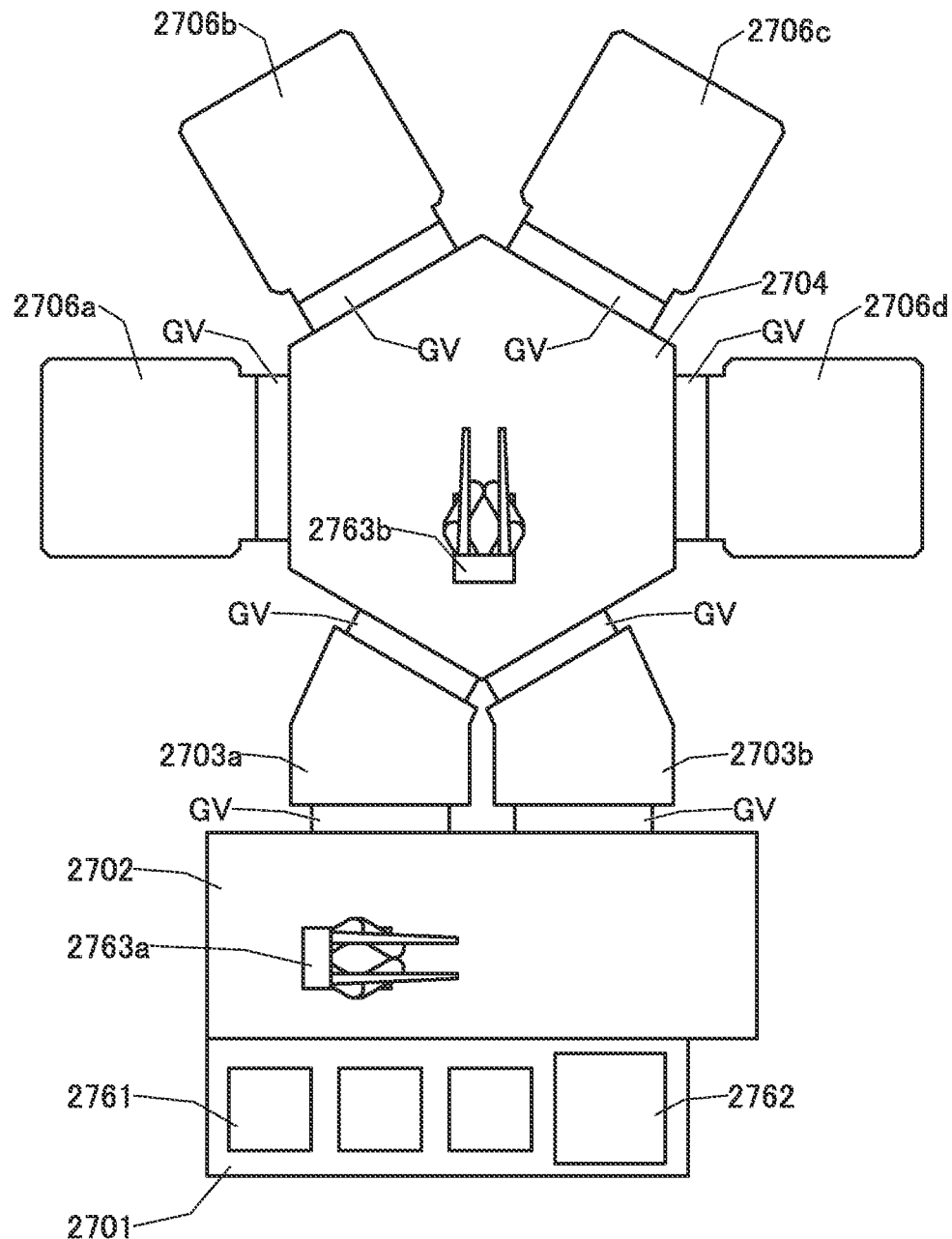
FIG. 16 is a top view illustrating a microwave treatment apparatus of one embodiment of the present invention.

FIG. 16 schematically shows a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703a where a substrate is carried in and the pressure inside the chamber is switched from atmospheric pressure to reduced pressure or from reduced pressure to atmospheric pressure; an unload lock chamber 2703b where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1 \times 10^{-4}$ Pa, preferably lower than or equal to $3 \times 10^{-5}$ Pa, further preferably lower than or equal to $1 \times 10^{-5}$ Pa. Furthermore, the partial pressure of a gas molecule (atom) having a mass-to-charge ratio (m/z) of 18 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 28 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 44 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3\times10^{-6}$ Pa·m$^3$/s, preferably less than or equal to $1\times10^{-6}$ Pa·m$^3$/s. Furthermore, for example, the leakage rate of a gas molecule (atom) having m/z of 18 is less than or equal to $1\times10^{-7}$ Pa·m$^3$/s, preferably less than or equal to $3\times10^{-8}$ Pa·m$^3$/s. Furthermore, for example, the leakage rate of a gas molecule (atom) having m/z of 28 is less than or equal to $1\times10^{-5}$ Pa·m$^3$/s, preferably less than or equal to $1\times10^{-6}$ Pa·m$^3$/s. Furthermore, for example, the leakage rate of a gas molecule (atom) having m/z of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, chromium oxide, or the like is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described material may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and the amount of impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Next, the chamber 2706b and the chamber 2706c are described with reference to a schematic cross-sectional view shown in FIG. 17.

The chamber 2706b and the chamber 2706c are chambers that can perform microwave treatment on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate

2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function as an electrostatic chuck or a mechanical chuck for holding the substrate 2811. Furthermore, the substrate holder 2812 has a function as an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, a gas such as an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating a microwave of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals or nitrogen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like is used, for example. The application of a bias to the substrate side allows ions in the high-density plasma 2810 to efficiently reach a deep portion of an opening portion of the film or the like over the substrate 2811.

For example, in the chamber 2706b, oxygen radical treatment using the high-density plasma 2810 can be performed by introducing oxygen from the gas supply source 2801, and in the chamber 2706c, nitrogen radical treatment using the high-density plasma 2810 can be performed by introducing nitrogen from the gas supply source 2801.

Next, the chamber 2706a and the chamber 2706d are described with reference to a schematic cross-sectional view shown in FIG. 18.

The chamber 2706a and the chamber 2706d are chambers that can irradiate an object with an electromagnetic wave, for example. Note that the chamber 2706a is different from the chamber 2706d only in the kind of the electromagnetic wave. The other structures have many common portions and thus are collectively described below.

The chamber 2706a and the chamber 2706d each include one or a plurality of lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706a and the chamber 2706d, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light is used, for example. For example, a light source having a function of emitting an electromagnetic wave which has a peak in a wavelength of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

With the use of the above-described manufacturing apparatus, the quality of a film or the like can be modified while the entry of impurities into an object is inhibited.

The structure, method, and the like described above in this embodiment can be used in an appropriate combination with structures, methods, and the like described in the other embodiments.

Embodiment 2

In this embodiment, one embodiment of a semiconductor device (memory device) is described with reference to FIG. 19 to FIG. 21.

[Memory Device 1]

Figure 19:
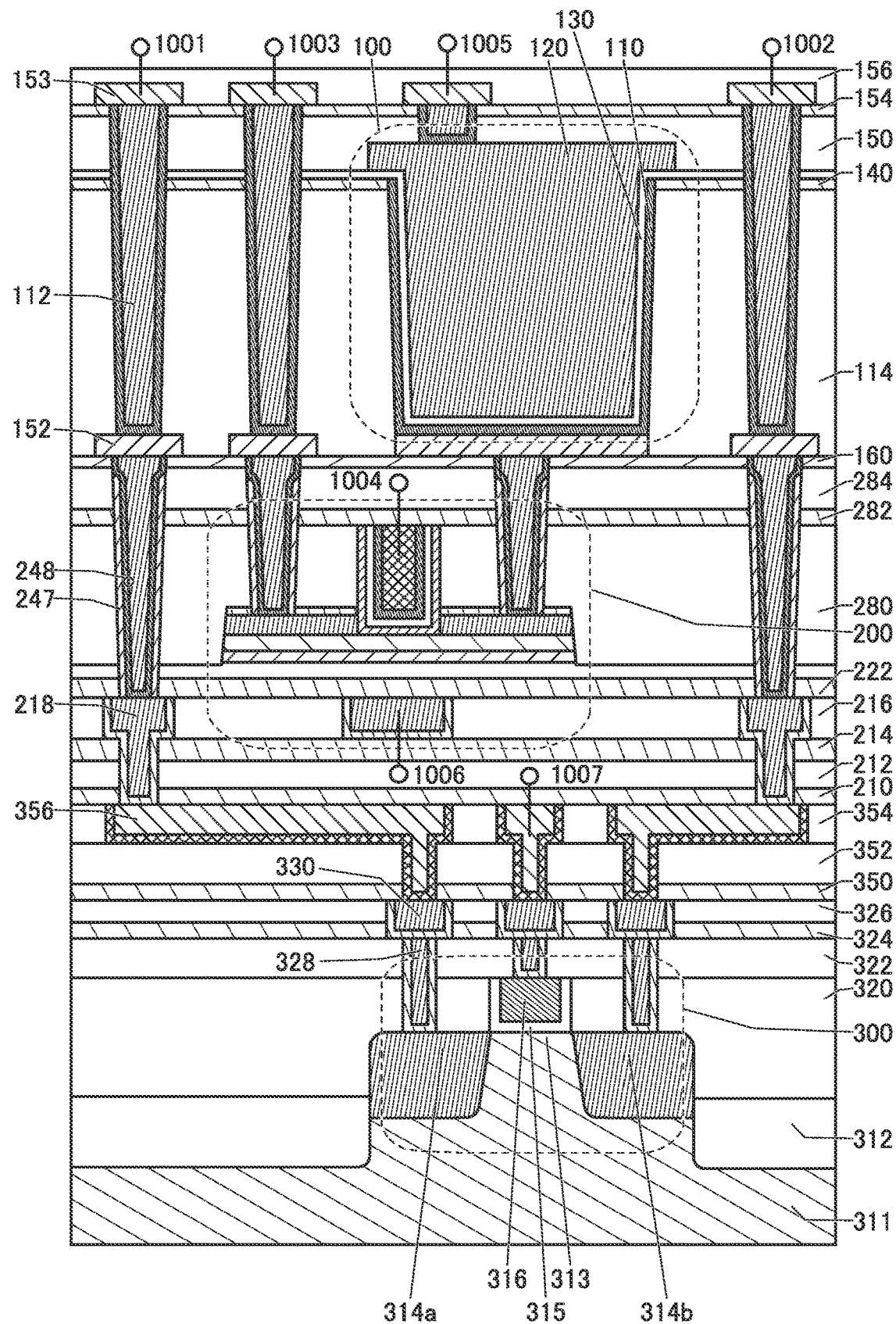
FIG. 19 is a cross-sectional view illustrating a structure of a memory device of one embodiment of the present invention.

FIG. 19 illustrates an example of a memory device using the semiconductor device of one embodiment of the present invention. In the memory device of this embodiment, the transistor 200 is provided above a transistor 300, and a capacitor 100 is provided above the transistor 200. Preferably, at least part of the capacitor 100 or the transistor 300 overlaps with the transistor 200. In such cases, the area occupied by the capacitor 100, the transistor 200, and the transistor 300 in the top view can be reduced, whereby the memory device in this embodiment can be miniaturized or highly integrated. The memory device in this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore, for the transistor 200 and layers including the transistor 200, the description in the above embodiment can be referred to.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of 10 digits or larger in the temperature range of 125° C. to 150° C. In other words, in comparison with a transistor including silicon in a semiconductor layer, the transistor 200 excels in characteristics such as an on-state current and frequency characteristics at higher temperatures.

In the semiconductor device illustrated in FIG. 19, a wiring 1001 is electrically connected to a source of the transistor 300, a wiring 1002 is electrically connected to a drain of the transistor 300, and a wiring 1007 is electrically connected to a gate of the transistor 300. In addition, a wiring 1003 is electrically connected to one of a source and a drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one electrode of the capacitor 100, and a wiring 1005 is electrically connected to the other electrode of the capacitor 100.

The semiconductor device illustrated in FIG. 19 has characteristics of being capable of retaining charge stored in the one electrode of the capacitor 100 by switching of the transistor 200; thus, writing, retention, and reading of data can be performed. The transistor 200 is an element in which a back gate is provided in addition to the source, the gate (top gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, in the semiconductor device illustrated in FIG. 19, data rewriting is performed by charging or discharging of electrons with the transistor and the capacitor; thus, the semiconductor device has characteristics such as high write endurance and a few structure changes.

The semiconductor devices illustrated in FIG. 19 can form a memory cell array when arranged in a matrix. In this case, the transistor 300 can be used for a read circuit, a driver circuit, or the like that is connected to the memory cell array. When the semiconductor device in FIG. 19 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314*a* and a low-resistance region 314*b* functioning as a source region and a drain region.

Here, the insulator 315 is placed over the semiconductor region 313, and the conductor 316 is placed over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 is either a p-channel transistor or an n-channel transistor.

In the substrate 311, a region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) using GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to obtain both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 19, the semiconductor region 313 (part of the substrate 311) in which a channel is formed has a convex shape. In addition, the conductor 316 is provided to cover a side surface and a top surface of the semiconductor region 313 with the insulator 315 therebetween. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 19 is just an example and the structure is not limited thereto; an appropriate transistor can be used in accordance with a circuit structure or a driving method.

As illustrated in FIG. 19, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 19, a silicon-based semiconductor material and an oxide semiconductor can be used in different layers. The semiconductor device illustrated in FIG. 19 can be manufactured in a process similar to that employing a manufacturing apparatus for a semiconductor device using a silicon-based semiconductor material, and can be highly integrated.

<Capacitor>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used for the insulator 114 and the insulator 150. The insulator 140 preferably functions as an etching stopper at the time of forming the opening in the insulator 114 and is formed using an insulator that can be used for the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is provided in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like; for example, a conductor that can be used for the conductor 205 is used.

The insulator 130 is positioned to cover the conductor 110 and the insulator 140. The insulator 130 is preferably deposited by an ALD method or a CVD method, for example. The insulator 130 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high dielectric constant (high-k) material is preferably used. Alternatively, a stacked-layer structure using a material with high dielectric strength and a high dielectric constant (high-k) material may be employed.

As an insulator of a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used for the conductor 205, for example.

Since the transistor 200 has a structure in which an oxide semiconductor is used, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring Layer>

Wiring layers provided with an interlayer film, a wiring, a plug, and the like may be provided between the components. In addition, a plurality of wiring layers can be provided in accordance with design. Note that a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 19, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors (the conductor 120 and the conductor 110) included in the capacitor 100, and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154, and the conductor 153 is covered with an insulator 156. Here, the conductor 153 is in contact with a top surface of the conductor 112 and functions as a terminal of the capacitor 100, the transistor 200, or the transistor 300.

Examples of an insulator that can be used for an interlayer film include an oxide, a nitride, an oxynitride, a nitride oxide, a metal oxide, a metal oxynitride, and a metal nitride oxide, each of which has an insulating property. For example, when a material with a low relative permittivity is used for the insulator functioning as an interlayer film, the parasitic capacitance generated between wirings can be reduced. Thus, a material is preferably selected depending on the function of an insulator.

For example, for the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low relative permittivity. Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. The resistivity of the insulator provided over or under the conductor 152 or the conductor 153 is preferably within the above range because the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. For such an insulator, silicon nitride or silicon nitride oxide can be used. For example, the resistivity of the insulator 160 or the insulator 154 can be set within the above range.

When a transistor using an oxide semiconductor is surrounded by an insulator having a function of inhibiting transmission of oxygen and impurities such as hydrogen, the electrical characteristics of the transistor can be stable. Thus, an insulator having a function of inhibiting passage of oxygen and impurities such as hydrogen is used for the insulator 324, the insulator 350, the insulator 210, and like.

For the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 247 is preferably provided between the insulator 280 containing excess oxygen and the conductor 248 in FIG. 19. Since the insulator 247 is provided in contact with the insulator 282, the conductor 248 and the transistor 200 can be sealed by the insulators having a barrier property.

That is, the excess oxygen contained in the insulator 280 can be inhibited from being absorbed by the conductor 248 when the insulator 247 is provided. In addition, by including the insulator 247, the diffusion of hydrogen, which is an impurity, into the transistor 200 through the conductor 248 can be inhibited.

Here, the conductor 248 functions as a plug or a wiring that is electrically connected to the transistor 200 or the transistor 300.

Specifically, the insulator 247 is provided in contact with a side wall of the opening in the insulator 284, the insulator 282, and the insulator 280, and the conductor 248 is formed in contact with its side surface. The conductor 240a or the conductor 240b is located on at least part of the bottom portion of the opening, and thus the conductor 248 is in contact with the conductor 240a or the conductor 240b.

The conductor 248 is preferably formed using a conductive material containing tungsten, copper, or aluminum as its main component. In addition, the conductor 248 may have a stacked-layer structure. Although the transistor 200 having a structure in which the conductor 248 have a stacked-layer structure of two layers is illustrated, the present invention is not limited thereto. For example, the conductor 248 may be provided as a single layer or to have a stacked-layer structure of three or more layers.

In the case where the conductor 248 has a stacked-layer structure, a conductive material having a function of inhibiting passage of impurities such as water and hydrogen is preferably used for a conductor that is in contact with the conductor 240a or the conductor 240b and in contact with the insulator 280, the insulator 282, and the insulator 284 with the insulator 247 therebetween. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 248. Moreover, impurities such as water and hydrogen contained in a layer above the insulator 284 can be inhibited from diffusing into the oxide 230 through the conductor 248.

As the insulator 247, for example, an insulator that can be used as the insulator 214, or the like may be used. The insulator 247 can inhibit diffusion of impurities such as water and hydrogen contained in the insulator 280 and the like into the oxide 230 through the conductor 248. In addition, oxygen contained in the insulator 280 can be prevented from being absorbed by the conductor 248.

The conductor 152 functioning as a wiring may be provided in contact with the top surface of the conductor 248. For the conductor functioning as a wiring, a conductive material containing tungsten, copper, or aluminum as its main component is preferably used. Furthermore, the conductor may have a stacked-layer structure and may be a stack of titanium or titanium nitride and any of the above conductive materials, for example. Note that the conductor may be formed to be embedded in an opening provided in an insulator.

The above is the description of the structure example. With the use of this structure, a semiconductor device using a transistor including an oxide semiconductor can be miniaturized or highly integrated. Furthermore, a change in electrical characteristics can be reduced and reliability can be improved in a semiconductor device using a transistor including an oxide semiconductor. A transistor including an oxide semiconductor with a high on-state current can be provided. A transistor including an oxide semiconductor with low off-state current can be provided. A semiconductor device with low power consumption can be provided.

[Memory Device 2]

Figure 20:
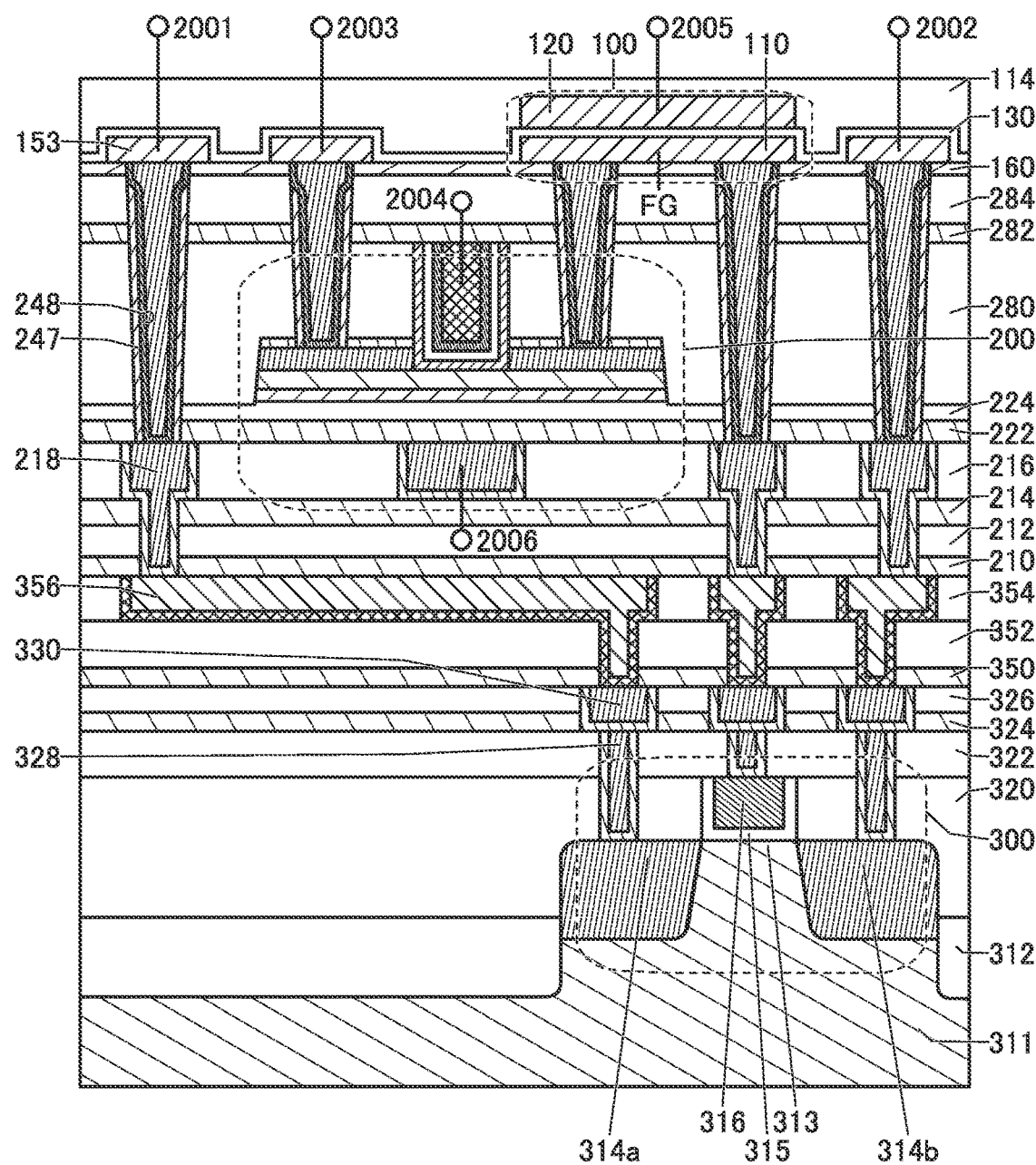
FIG. 20 is a cross-sectional view illustrating a structure of a memory device of one embodiment of the present invention.

FIG. 20 illustrates an example of a semiconductor device (memory device) using the semiconductor device of one embodiment of the present invention. Like the semiconductor device illustrated in FIG. 19, the semiconductor device illustrated in FIG. 20 includes the transistor 200, the transistor 300, and the capacitor 100. Note that the semiconductor device illustrated in FIG. 20 differs from the semiconductor device illustrated in FIG. 19 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated.

Note that the transistor 200 and the transistor 300 mentioned above can be used as the transistor 200 and the transistor 300, respectively. Therefore, the above description can be referred to for the transistor 200, the transistor 300, and the layers including them.

In the semiconductor device illustrated in FIG. 20, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to the first gate of the transistor 200, and a wiring 2006 is electrically connected to the second gate of the transistor 200. The gate of the transistor 300 and the other of the source and the drain of the transistor 200 are electrically connected to one electrode of the capacitor 100, and a wiring 2005 is electrically connected to the other electrode of the capacitor 100. Note that a node where the gate of the transistor 300, the other of the source and the drain of the transistor 200, and the one electrode of the capacitor 100 are connected to one another is hereinafter referred to as a node FG in some cases.

The semiconductor device illustrated in FIG. 20 is capable of retaining the potential of the gate of the transistor 300 (the node FG) by switching of the transistor 200; thus, data writing, retention, and reading can be performed.

Furthermore, by arranging the semiconductor devices illustrated in FIG. 20 in a matrix, a memory cell array can be formed.

The layer including the transistor 300 has the same structure as that in the semiconductor device illustrated in FIG. 19, and therefore, the above description can be referred to for the structure below the insulator 354.

The insulator 210, the insulator 212, the insulator 214, and the insulator 216 are positioned over the insulator 354. Here, an insulator having a function of inhibiting passage of oxygen and impurities such as hydrogen is used for the insulator 210, as for the insulator 350 and the like.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

Note that the conductor 248 functions as a plug or a wiring that is electrically connected to the transistor 200 or the transistor 300. For example, the conductor 248 electrically connects the conductor 240b functioning as the other of the source and the drain of the transistor 200 and the conductor 110 functioning as the one electrode of the capacitor 100.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

The conductor 153 and the conductor 110 are provided in contact with the top surface of the conductor 248. The conductor 153 is in contact with the top surface of the conductor 248 and functions as a terminal of the transistor 200 or the transistor 300.

The conductor 153 and the conductor 110 are covered with the insulator 130, and the conductor 120 is positioned to overlap with the conductor 110 with the insulator 130 therebetween. In addition, the insulator 114 is positioned over the conductor 120 and the insulator 130.

Although FIG. 20 illustrates an example in which a planar capacitor is used as the capacitor 100, the semiconductor device of this embodiment is not limited thereto. For example, the capacitor 100 may be a cylinder capacitor 100 like that illustrated in FIG. 19.

[Memory Device 3]

Figure 21:
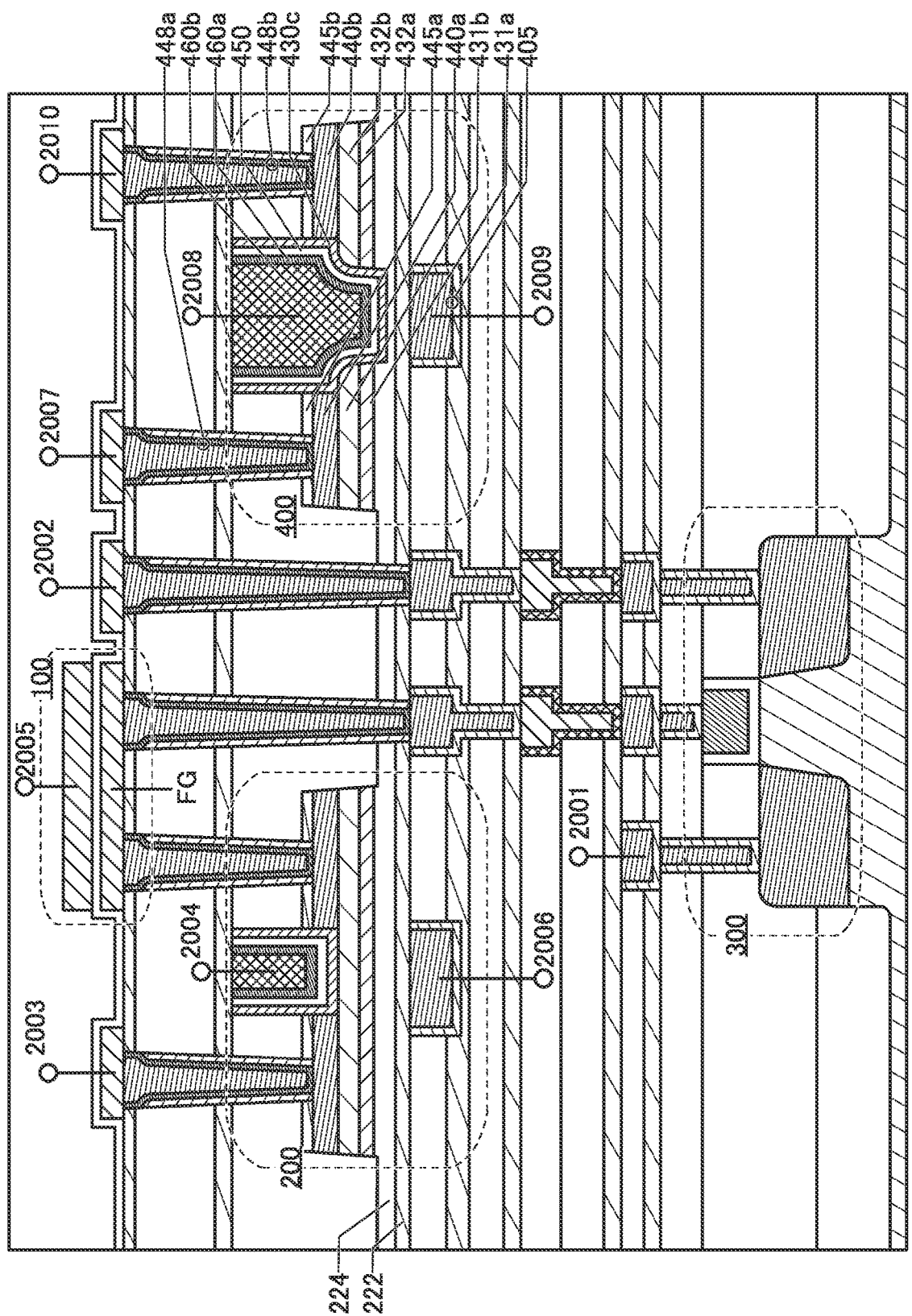
FIG. 21 is a cross-sectional view illustrating a structure of a memory device of one embodiment of the present invention.

FIG. 21 illustrates an example of a memory device using the semiconductor device of one embodiment of the present invention. The memory device shown in FIG. 21 includes a transistor 400 in addition to the semiconductor device including the transistor 200, the transistor 300, and the capacitor 100 shown in FIG. 20.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, a first gate-source voltage and a second gate-source voltage of the transistor 400 are 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 21, the wiring 2001 is electrically connected to the source of the transistor 300, and the wiring 2002 is electrically connected to the drain of the transistor 300. A wiring 2003 is electrically connected to one of the source and the drain of the transistor 200, a wiring 2004 is electrically connected to the gate of the transistor 200, and a wiring 2006 is electrically connected to the second gate of the transistor 200. The gate of the transistor 300 and the other of the source and the drain of the transistor 200 are electrically connected to one electrode of the capacitor 100, and a wiring 2005 is electrically connected to the other electrode of the capacitor 100. A wiring 2007 is electrically connected to the source of the transistor 400, a wiring 2008 is electrically connected to the first gate of the transistor 400, a wiring 2009 is electrically connected to the second gate of the transistor 400, and a wiring 2010 is electrically connected to a drain of the transistor 400. Here, the wiring 2006, the wiring 2007, the wiring 2008, and the wiring 2009 are electrically connected to each other.

When the memory devices shown in FIG. 21 are arranged in a matrix like the memory devices shown in FIG. 19 and FIG. 20, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode; a conductor 405 (a conductor 405a and a conductor 405b)

functioning as a second gate electrode; the insulator 222, the insulator 224, and an insulator 450 each functioning as a gate insulating layer; an oxide 430c including a region where a channel is formed; a conductor 440a, an oxide 431b, and an oxide 431a functioning as one of a source and a drain; a conductor 440b, an oxide 432b, and an oxide 432a functioning as the other of the source and the drain; and an insulator 445a and an insulator 445b each functioning as a barrier layer.

The conductor 405 is formed in the same layer as the conductor 205. The oxide 431a and the oxide 432a are formed in the same layer as the oxide 230a, and the oxide 431b and the oxide 432b are formed in the same layer as the oxide 230b. The conductor 440a and conductor 440b are formed in the same layer as the conductor 240a and the conductor 240b. The insulator 445a and the insulator 445b are formed in the same layer as the insulator 245a and the insulator 245b. The oxide 430c is formed in the same layer as the oxide 230c. The insulator 450 is formed in the same layer as the insulator 250. The conductor 460 is formed in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be further increased, the off-state current can be reduced, and the drain current at the time when the second gate voltage and the first gate voltage are 0 V can be extremely low.

This embodiment can be implemented in combination with any of the structures described in the other embodiments and the like, as appropriate.

Embodiment 3

In this embodiment, a memory device of one embodiment of the present invention including a transistor in which an oxide is used as a semiconductor (hereinafter referred to as an OS transistor in some cases) and a capacitor (hereinafter referred to as an OS memory device in some cases), is described with reference to FIG. 22A to FIG. 23H. The OS memory device includes at least a capacitor and the OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 22A:
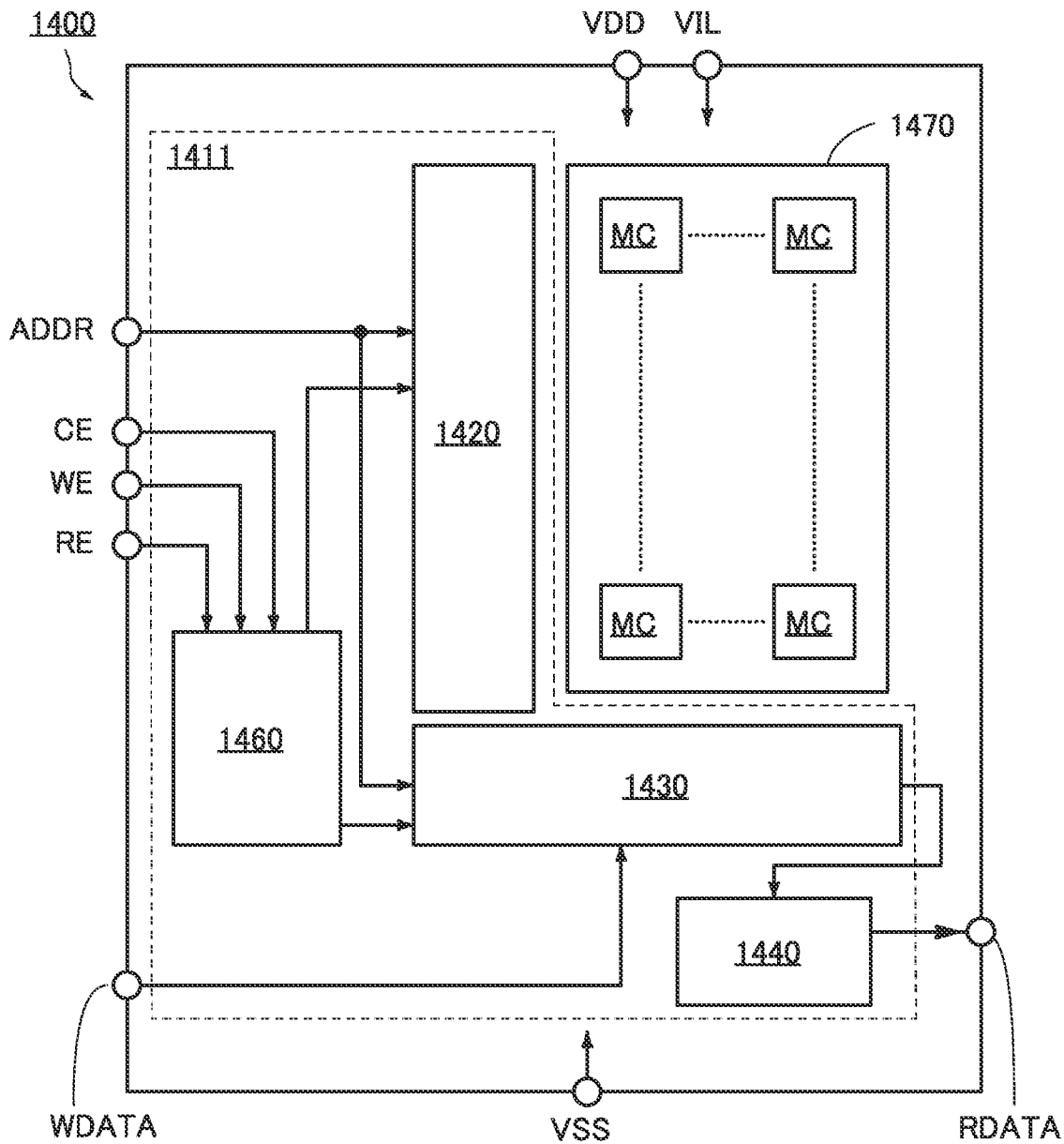
FIG. 22A and FIG. 22B are block diagrams illustrating a structure example of a memory device of one embodiment of the present invention.

FIG. 22A shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 22B:
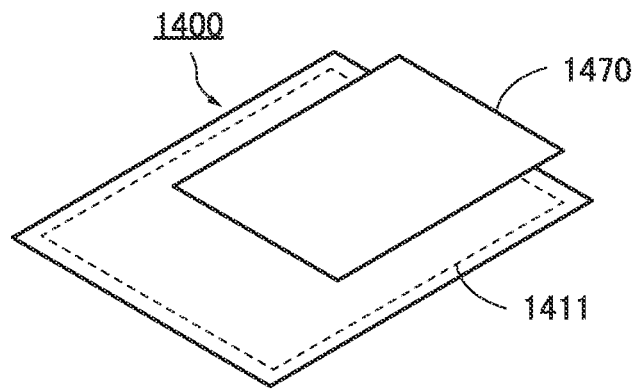

Note that FIG. 22A shows an example in which the peripheral circuit 1411 and the memory cell array 1470 are formed on the same plane; however, this embodiment is not limited thereto. For example, as shown in FIG. 22B, the memory cell array 1470 may be provided over the peripheral circuit 1411 to partly overlap with the peripheral circuit 1411. For example, the sense amplifier may be provided below the memory cell array 1470 so that they overlap with each other.

FIG. 23A to FIG. 23H show structure examples of a memory cell that can be applied to the memory cell MC.

[DOSRAM]

Figure 23A:
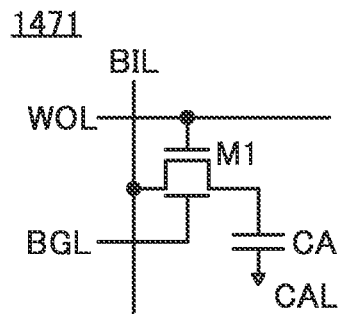
FIG. 23A to FIG. 23H are circuit diagrams illustrating structure examples of a memory device of one embodiment of the present invention.
Figure 23B:
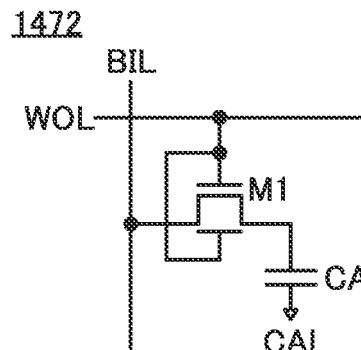
Figure 23C:
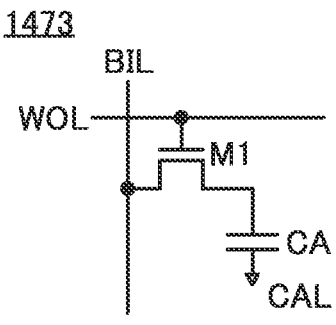

FIG. 23A to FIG. 23C show circuit structure examples of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 shown in FIG. 23A includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 shown in FIG. 23A corresponds to the memory device shown in FIG. 19. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 shown in FIG. 19 corresponds to a transistor provided in the peripheral circuit 1411 of the memory device 1400 shown in FIG. 22A and FIG. 22B.

The memory cell MC is not limited to the memory cell 1471, and the circuit structure can be changed. For example, as in a memory cell 1472 shown in FIG. 23B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 shown in FIG. 23C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the transistor M1; thus, the frequency of refresh of the memory cell can be reduced. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 23D to FIG. 23G each show a circuit structure example of a gain-cell memory cell including two transistors and one capacitor. A memory cell 1474 shown in FIG. 23D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 23D:
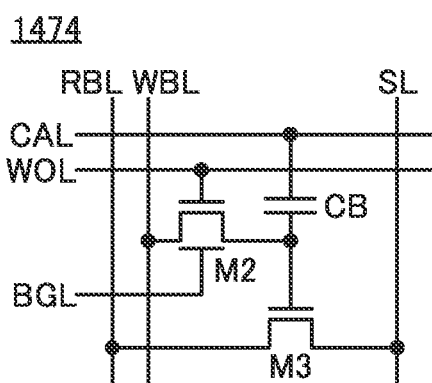
Figure 23E:
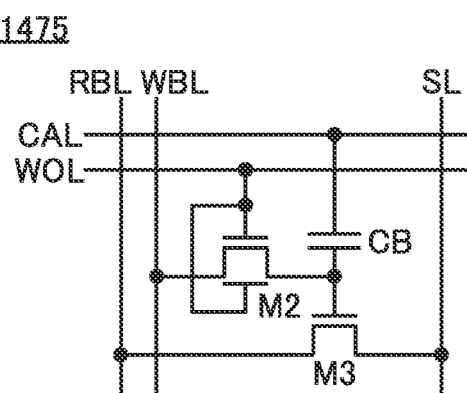
Figure 23F:
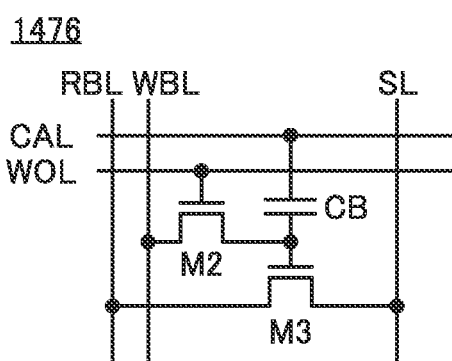
Figure 23G:
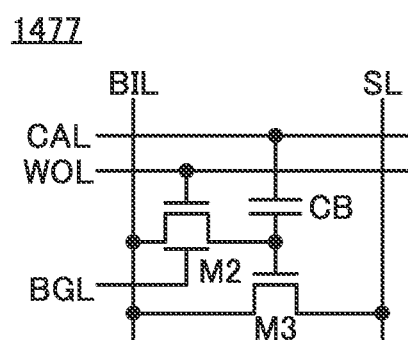

Here, the memory cell 1474 shown in FIG. 23D corresponds to the memory device shown in FIG. 20. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

In addition, the memory cell MC is not limited to the memory cell 1474, and the circuit structure can be changed as appropriate. For example, as in a memory cell 1475 shown in FIG. 23E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 shown in FIG. 23F. Alternatively, for example, in the memory cell MC, the wiring WBL and the wiring RBL may be combined into one wiring BIL, as in a memory cell 1477 shown in FIG. 23G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When an OS transistor is used as each of the transistor M2 and the transistor M3, the circuit of the memory cell array 1470 can be formed using only n-channel transistors.

Figure 23H:
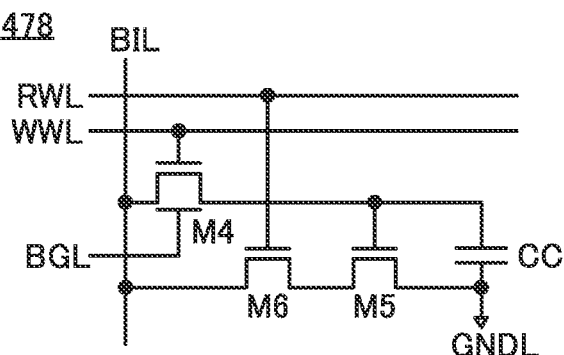

FIG. 23H shows an example of a gain-cell memory cell including three transistors and one capacitor. A memory cell 1478 shown in FIG. 23H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments, and the like.

Embodiment 4

In this embodiment, an example of a chip 1200 on which the semiconductor device of the present invention is mounted is described with reference to FIG. 24A and FIG. 24B. A plurality of circuits (systems) are mounted on the chip 1200. A technique for integrating a plurality of circuits (systems) into one chip is referred to as system on chip (SoC) in some cases.

Figure 24A:
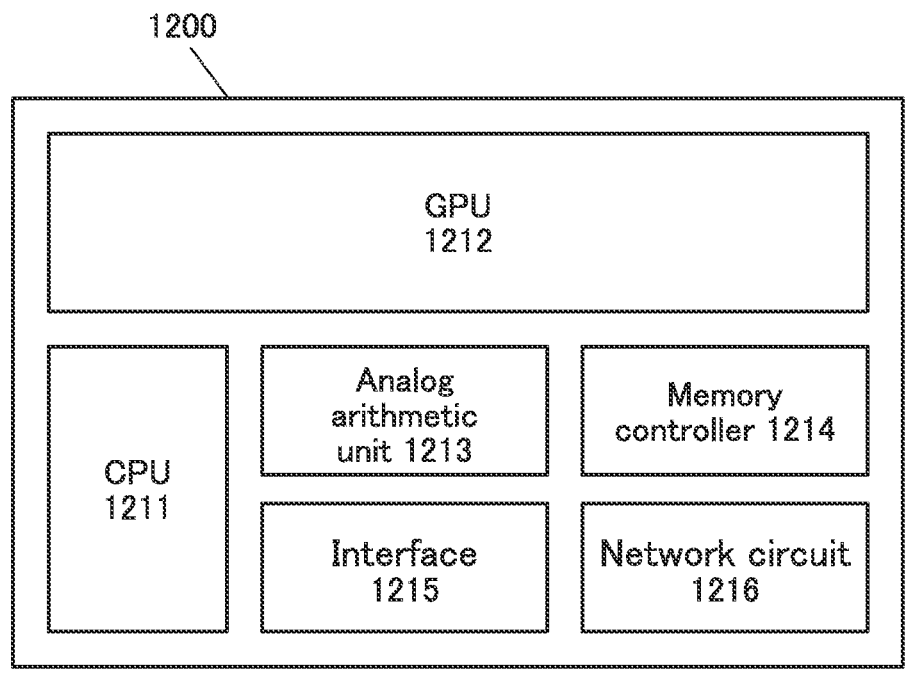
FIG. 24A and FIG. 24B are schematic views of a semiconductor device of one embodiment of the present invention.

As shown in FIG. 24A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 24B:
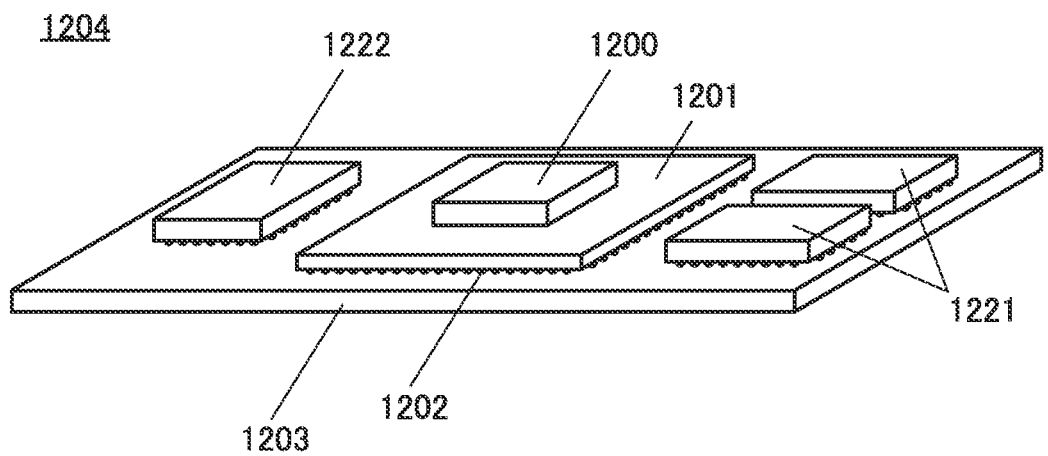

A bump (not shown) is provided on the chip 1200, and as shown in FIG. 24B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 25A to FIG. 25E schematically show some structure examples of removable memory devices. The semiconductor device described in the above embodiment is processed into a packaged memory chip and used in a variety of storage devices and removable memories, for example.

FIG. 25A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 25B is a schematic external view of an SD card, and FIG. 25C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

FIG. 25D is a schematic external view of an SSD, and FIG. 25E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, and the like.

Embodiment 6

The semiconductor device of one embodiment of the present invention can be used as a processor such as a CPU and a GPU or a chip. FIG. 26A to FIG. 26H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 26A to FIG. 26H show examples of electronic devices.

[Information Terminal]

Figure 26A:
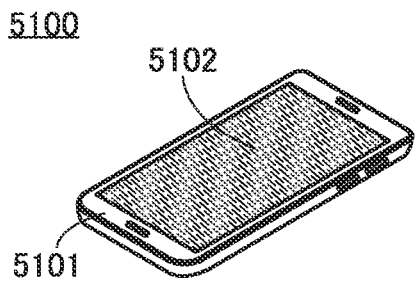
FIG. 26A to FIG. 26H are views illustrating electronic devices of one embodiment of the present invention.

FIG. 26A shows a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 26B:
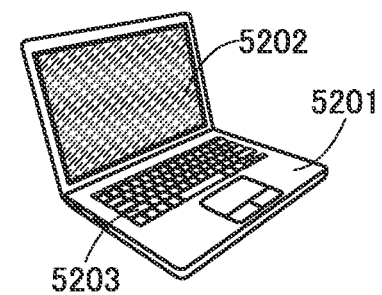

FIG. 26B shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 26A and FIG. 26B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 26C:
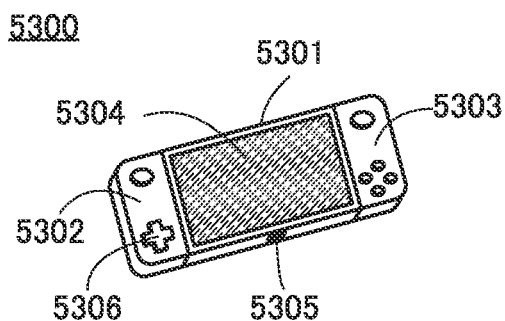

FIG. 26C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 26D:
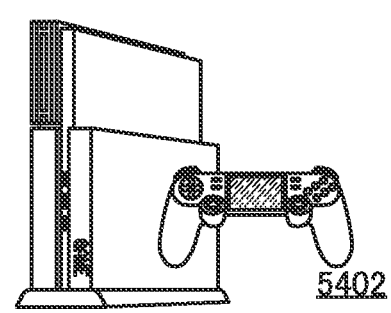

FIG. 26D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 26C and FIG. 26D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 26E:
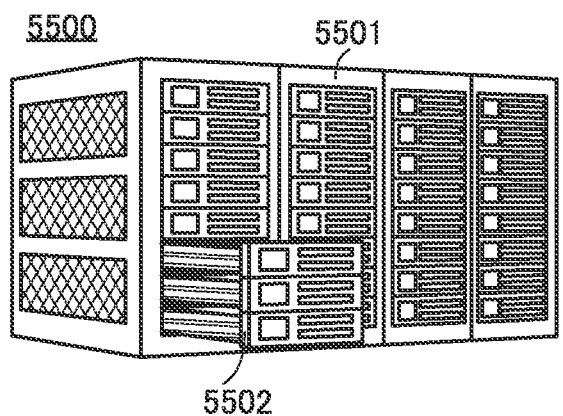
Figure 26F:
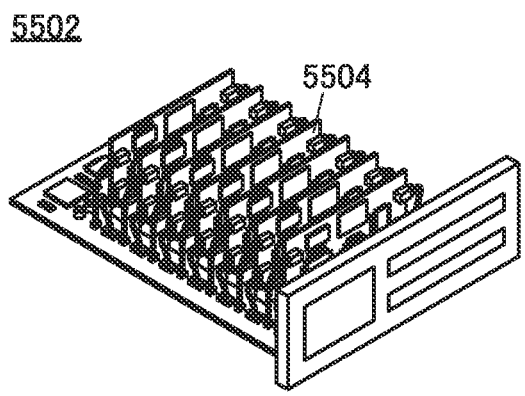

FIG. 26E shows a supercomputer 5500 as an example of a large computer. FIG. 26F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 26E and FIG. 26F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 26G:
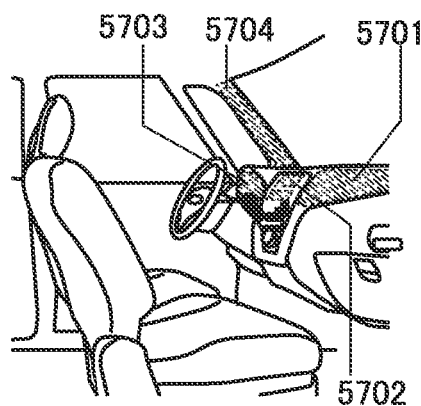

FIG. 26G shows an area around a windshield inside an automobile, which is an example of a moving vehicle. FIG. 26G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 26H:
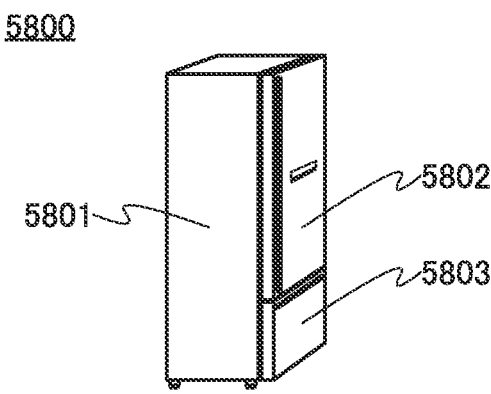

FIG. 26H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, and the like.

Embodiment 7

In this embodiment, a market image where an OS transistor can be used is described.

<Market Image

Figure 27:
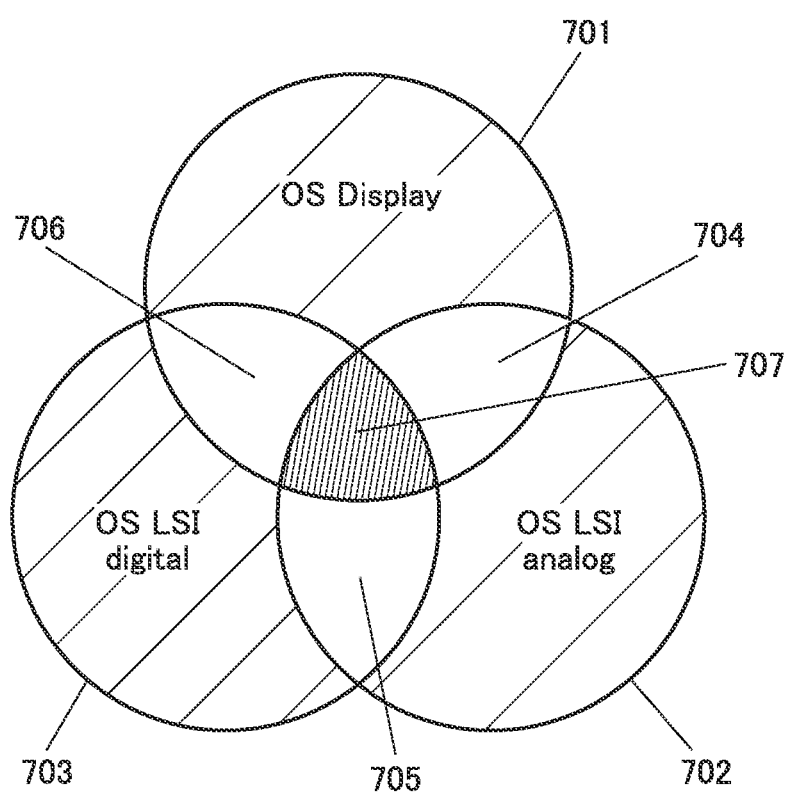
FIG. 27 is a diagram showing the concept of a market.

First, FIG. 27 illustrates a market image where an OS transistor can be used. In FIG. 27, a region 701 represents a region of a product (OS Display) applicable to a display using an OS transistor, a region 702 represents a product region (OS LSI analog) where an LSI (Large Scale Integration) using an OS transistor can be applied to analog processing, and a region 703 represents a product region (OS LSI digital) where an LSI using an OS transistor can be applied to digital processing. The OS transistor can be favorably used in three regions of the region 701, the region 702, and the region 703 illustrated in FIG. 27, in other words, three large markets.

In FIG. 27, a region 704 represents a region where the region 701 and the region 702 overlap with each other; a region 705 represents a region where the region 702 and the region 703 overlap with each other; a region 706 represents a region where the region 701 and the region 703 overlap with each other; and a region 707 represents a region where the region 701, the region 702, and the region 703 overlap with each other.

In OS Display, for example, a structure of an FET such as a Bottom-Gate OS FET (BG OSFET) or a Top-Gate OS FET (TG OS FET) can be preferably used. Note that the Bottom-Gate OS FET includes a channel-etch FET and a channel-protective FET. The Top-Gate OS FET includes a TGSA (Top Gate Self-Aligned) FET.

In OS LSI analog and OS LSI digital, for example, a Gate-Last OS FET (GL OS FET) can be preferably used.

Each of the above transistors includes a Single-Gate transistor including one gate electrode, a Dual-Gate transistor including two gate electrodes, and a transistor including three or more gate electrodes. Among Dual-Gate transistors, it is particularly preferable to use an S-channel transistor.

As products included in OS Display (the region 701), products including an LCD (liquid crystal display), EL (Electro-Luminescence), and an LED (Light Emitting Diode) in display devices can be given. The combination of the above display device and Q-Dot (Quantum Dot) is also preferable.

Note that in this embodiment, EL includes organic EL and inorganic EL. In this embodiment, LED includes a micro LED, a mini LED, and a macro LED. Note that in this specification and the like, a light-emitting diode whose chip area is less than or equal to 10000 $\mu m^2$ may be referred to as a micro LED, a light-emitting diode whose chip area is greater than 10000 $\mu m^2$ and less than or equal to 1 $mm^2$ may be referred to as a mini LED, and a light-emitting diode whose chip area is greater than 1 $mm^2$ may be referred to as a macro LED.

As products included in OS LSI analog (the region 702), a sound-source identification device that deals with a range of a variety of frequencies (e.g., audible sound with a frequency of greater than or equal to 20 Hz and less than or equal to 20 kHz, or ultrasonic wave with a frequency of 20 kHz or more), a device for controlling a battery (a battery control IC, a battery protection IC, or a battery management system), and the like can be given.

As products included in OS LSI digital (the region 703), a memory device, a CPU (Central Processing Unit) device, a GPU (Graphics Processing Unit) device, a FPGA (field-programmable gate array) device, a power device, a hybrid device in which an OS LSI and an Si LSI are stacked or mixed, a light-emitting device, and the like can be given.

As products included in the region 704, a display device including an infrared ray sensor or a near-infrared ray sensor in a display region, a signal processing device with a sensor including an OS FET, an embedded biosensor device, and the like can be given. As products included in the region 705, a processing circuit including an A/D (Analog/Digital) converter circuit and the like, an AI (Artificial Intelligence) device including the processing circuit, and the like can be given. As products included in the region 706, a display device to which a Pixel AI technique is applied, and the like can be given. Note that in this specification and the like, the Pixel AI technique refers to a technique of utilizing a memory formed using an OS FET included in a pixel circuit of a display, and the like is used.

As a product included in the region 707, a composite product in which all products included in the above region 701 to region 706 are combined can be given.

As described above, the semiconductor device of one embodiment of the present invention can be used in all the product regions as illustrated in FIG. 27. That is, the semiconductor device of one embodiment of the present invention can be applied to many markets.

This embodiment can be implemented in combination with the structures described in the other embodiments as appropriate.

REFERENCE NUMERALS

:100: capacitor, 110: conductor, 112: conductor, 114: insulator, 120: conductor, 130: insulator, 140: insulator, 150: insulator, 152: conductor, 153: conductor, 154: insulator, 156: insulator, 160: insulator, 200: transistor, 205: conductor, 210: insulator, 212: insulator, 214: insulator, 216: insulator, 218: conductor, 222: insulator, 224: insulator, 230: oxide, 230*a*: oxide, 230A: oxide film, 230*b*: oxide, 230B: oxide film, 230*c*: oxide, 230C: oxide film, 240*a*: conductor, 240A: conductive film, 240*b*: conductor, 240B: conductive layer, 245*a*: insulator, 245A: insulating film, 245*b*: insulator, 245B: insulating layer, 247: insulator, 248: conductor, 250: insulator, 250A: insulating film, 254: insulator, 254*a*: insulator, 254*b*: insulator, 260: conductor, 260*a*: conductor, 260A: conductive film, 260*b*: conductor, 260B: conductive film, 280: insulator, 282: insulator, 284: insulator, 290A: film, 290B: hard mask, 291: microwave, 292: resist mask, 300: transistor, 311: substrate, 312: insulator, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405*a*: conductor, 405*b*: conductor, 430*c*: oxide, 431*a*: oxide, 431*b*: oxide, 432*a*: oxide, 432*b*: oxide, 440*a*: conductor, 440*b*: conductor, 445*a*: insulator, 445*b*: insulator, 450: insulator, 460: conductor, 460*a*: conductor, 460*b*: conductor, 1001: wiring, 1002: wiring, 1003: wiring, 1004: wiring, 1005: wiring, 1006: wiring, 1007: wiring, 2001: wiring, 2002: wiring, 2003: wiring, 2004: wiring, 2005: wiring, 2006: wiring, 2007: wiring, 2008: wiring, 2009: wiring, 2010: wiring, 2700: manufacturing apparatus, 2701: atmosphere-side substrate supply chamber, 2702: atmosphere-side substrate transfer chamber, 2703*a*: load lock chamber, 2703*b*: unload lock chamber, 2704: transfer chamber, 2706*a*: chamber, 2706*b*: chamber, 2706*c*: chamber, 2706*d*: chamber, 2761: cassette port, 2762: alignment port, 2763*a*: transfer robot, 2763*b*: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2812: substrate holder, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate holder, 2826: heating mechanism, 2828: vacuum pump, 2829: valve, 2830: exhaust port

The invention claimed is:

1. A manufacturing method of a transistor, comprising:
forming a metal oxide containing indium over a substrate;
forming a first conductor over the metal oxide;
forming a first insulator over the first conductor;
forming an opening reaching the metal oxide in the first conductor and the first insulator;
forming a second insulator in the opening;
performing microwave treatment from above the second insulator;
performing heat treatment after the microwave treatment; and
forming a second conductor in the opening after the heat treatment,
wherein the second conductor overlaps with the metal oxide with the second insulator therebetween,
wherein the microwave treatment is performed using a gas containing oxygen,
wherein by the microwave treatment, a defect in which hydrogen has entered an oxygen vacancy in the metal oxide is divided into an oxygen vacancy and hydrogen, and
wherein the number of oxygen vacancies in the metal oxide after the heat treatment is smaller than the number of oxygen vacancies in the metal oxide before the heat treatment.

2. The manufacturing method of the transistor according to claim 1,
wherein a temperature of the heat treatment is higher than or equal to 300° C. and lower than or equal to 500° C.

3. The manufacturing method of the transistor according to claim 1,
wherein a pressure of the microwave treatment is higher than or equal to 133 Pa.

4. The manufacturing method of the transistor according to claim 1,
wherein the metal oxide is formed by a sputtering method using an oxide target containing indium.

5. A manufacturing method of a transistor, comprising:
forming a metal oxide containing indium over a substrate;
forming a first conductor over the metal oxide;
forming a first insulator over the first conductor;
forming an opening reaching the metal oxide in the first conductor and the first insulator;
forming a second insulator in the opening;
performing microwave treatment from above the second insulator;
performing heat treatment after the microwave treatment; and
forming a second conductor in the opening after the heat treatment,
wherein the second conductor overlaps with the metal oxide with the second insulator therebetween,
wherein the microwave treatment is performed using a gas containing oxygen and argon,
wherein an oxygen flow rate in the gas is higher than or equal to 10% and lower than or equal to 30%,
wherein by the microwave treatment, a defect in which hydrogen has entered an oxygen vacancy in the metal oxide is divided into an oxygen vacancy and hydrogen, and
wherein the number of oxygen vacancies in the metal oxide after the heat treatment is smaller than the number of oxygen vacancies in the metal oxide before the heat treatment, and hydrogen in the metal oxide is diffused to the first conductor.

6. The manufacturing method of the transistor according to claim 5,
wherein a temperature of the heat treatment is higher than or equal to 300° C. and lower than or equal to 500° C.

7. The manufacturing method of the transistor according to claim 5,
wherein a pressure of the microwave treatment is higher than or equal to 133 Pa.

8. The manufacturing method of the transistor according to claim 5,
wherein the metal oxide is formed by a sputtering method using an oxide target containing indium.

9. A manufacturing method of a transistor, comprising:
forming a metal oxide containing indium over a substrate;
forming a first conductor over the metal oxide;
forming a first insulator over the first conductor;
forming an opening reaching the metal oxide in the first conductor and the first insulator;
forming a second insulator in the opening;

performing microwave treatment from above the second insulator;

performing heat treatment after the microwave treatment; and forming a second conductor in the opening after the heat treatment, wherein the second conductor overlaps with the metal oxide with the second insulator therebetween, wherein the first conductor serves as a source electrode and a drain electrode and the second conductor serves as a gate electrode, wherein the microwave treatment is performed using a gas containing oxygen and argon, and wherein an oxygen flow rate in the gas is higher than or equal to 10% and lower than or equal to 30%.

10. The manufacturing method of the transistor according to claim 9, wherein a temperature of the heat treatment is higher than or equal to 300° C. and lower than or equal to 500° C.

11. The manufacturing method of the transistor according to claim 9, wherein a pressure of the microwave treatment is higher than or equal to 133 Pa.

12. The manufacturing method of the transistor according to claim 9, wherein the metal oxide is formed by a sputtering method using an oxide target containing indium.

13. The manufacturing method of the transistor according to claim 9, wherein by the microwave treatment, a defect in which hydrogen has entered an oxygen vacancy in the metal oxide is divided into an oxygen vacancy and hydrogen, and wherein the number of oxygen vacancies in the metal oxide after the heat treatment is smaller than the number of oxygen vacancies in the metal oxide before the heat treatment, and hydrogen in the metal oxide is diffused to the first conductor.

\* \* \* \* \*